US012497369B2

(12) United States Patent
Ryu et al.

(10) Patent No.: US 12,497,369 B2
(45) Date of Patent: Dec. 16, 2025

(54) ORGANIC COMPOUNDS AND ORGANIC LIGHT EMITTING DISPLAY DEVICE USING THE SAME

(71) Applicants: LG DISPLAY CO., LTD., Seoul (KR); Lapto Co., Ltd., Gyeonggi-do (KR)

(72) Inventors: DaeWon Ryu, Paju-si (KR); DoHan Kim, Goyang-si (KR); KyouSic Kim, Seongnam-si (KR); ChulSoo Lim, Gwangju-si (KR); MunSoo Kim, Seongnam-si (KR)

(73) Assignees: LG DISPLAY CO., LTD., Seoul (KR); LAPTO CO., LTD., Gyeonggi-Do (KR)

( * ) Notice: Subject to any disclaimer, the term of this patent is extended or adjusted under 35 U.S.C. 154(b) by 568 days.

(21) Appl. No.: 17/130,881

(22) Filed: Dec. 22, 2020

(65) Prior Publication Data

US 2021/0198212 A1    Jul. 1, 2021

(30) Foreign Application Priority Data

Dec. 31, 2019    (KR) .................. 10-2019-0179779

(51) Int. Cl.
*C07D 241/42*    (2006.01)
*C07D 237/28*    (2006.01)
(Continued)

(52) U.S. Cl.
CPC .......... *C07D 237/28* (2013.01); *C07D 241/42* (2013.01); *C07D 253/10* (2013.01);
(Continued)

(58) Field of Classification Search
CPC .. C07D 237/28; C07D 241/42; C07D 253/10; C07D 401/14; C07D 403/04;
(Continued)

(56) References Cited

U.S. PATENT DOCUMENTS 7,901,792 B2    3/2011    Egawa et al.
7,931,974 B2    4/2011    Egawa et al.
(Continued)

FOREIGN PATENT DOCUMENTS

CN    105794010 A    7/2016
CN    107021956 A  *  8/2017    ........... C07D 263/57
(Continued)

OTHER PUBLICATIONS

CN-107021956-A, machine translation (Year: 2017).*
(Continued)

*Primary Examiner* — Elizabeth M. Dahlburg
(74) *Attorney, Agent, or Firm* — Morgan, Lewis & Bockius LLP

(57) ABSTRACT

The present disclosure relates to an organic compound and an organic light emitting display device using the same wherein the organic compound is represented by Chemical Formula 1 and a display device using the organic compound. The organic compound represented by Chemical Formula 1 has excellent electron transport properties and durability and is used for an electron transport layer of an organic light emitting element, thereby lowering a driving voltage and improving the luminous efficiency and lifetime.

[Chemical Formula 1]

(Continued)

(In the above Chemical Formula 1, at least two of $X_1$, $X_2$ and $X_3$ are N, $Y_1$ and $Y_2$ are each independently a substituted or unsubstituted phenylene group or a single bond, at least one of $Ar_1$ and $Ar_2$ is selected from a substituted or unsubstituted triazine group, a functional group represented by Chemical Formula 2 and a functional group represented by Chemical Formula 3.)

6 Claims, 2 Drawing Sheets

(51) Int. Cl.
*C07D 253/10* (2006.01)
*H10K 50/16* (2023.01)
*H10K 85/60* (2023.01)
*H10K 59/12* (2023.01)
*H10K 59/80* (2023.01)

(52) U.S. Cl.
CPC ....... *H10K 85/656* (2023.02); *H10K 85/6572* (2023.02); *H10K 85/6574* (2023.02); *H10K 85/6576* (2023.02); *H10K 50/16* (2023.02); *H10K 59/12* (2023.02); *H10K 59/805* (2023.02)

(58) Field of Classification Search
CPC .. C07D 403/10; C07D 405/14; C07D 409/14; C07D 413/04; C07D 413/14; C07D 417/14; C09K 11/06; C09K 2211/1007; C09K 2211/1011; C09K 2211/1029; C09K 2211/1037; C09K 2211/1044; C09K 2211/1059; C09K 2211/1088; H01L 51/0069; H01L 51/0071; H01L 51/0072; H01L 51/0073; H01L 51/0074; H01L 51/5072; H10K 85/615; H10K 85/654; H10K 85/656; H10K 85/657; H10K 85/6572; H10K 85/6574; H10K 85/6576; H10K 50/11; H10K 50/16; H10K 50/805; H10K 59/12; H10K 59/35; H10K 2101/90

See application file for complete search history.

(56) References Cited

U.S. PATENT DOCUMENTS

| | | | |
|---|---|---|---|
| 2015/0034938 A1* | 2/2015 | Kang | ................... C07D 403/14 546/144 |
| 2018/0040829 A1 | 2/2018 | Lee et al. | |
| 2019/0067593 A1 | 2/2019 | Cho et al. | |

FOREIGN PATENT DOCUMENTS

| | | | | |
|---|---|---|---|---|
| CN | 107431143 | A | 12/2017 | |
| CN | 108699054 | A | 10/2018 | |
| CN | 110606839 | A | 12/2019 | |
| CN | 111233840 | A | 6/2020 | |
| KR | 10-2008-0029810 | A | 4/2008 | |
| KR | 10-2014-0094408 | A | 7/2014 | |
| KR | 10-2014-0119805 | A | 10/2014 | |
| KR | 10-2015-0121394 | A | 10/2015 | |
| WO | 2015/093878 | A1 | 6/2015 | |
| WO | 2016/197353 | A1 | 12/2016 | |
| WO | WO-2019208991 | A1 * | 10/2019 | ........... C07D 401/14 |

OTHER PUBLICATIONS

Tremblay, Jean-François. The rise of OLED displays. Chemical & Engineering News, vol. 94, Issue 28 (2016) (Year: 2016).*
WO-2019208991-A1, machine translation (Year: 2019).*
CN 111233840 A machine translation (Year: 2020).*
Office Action issued Feb. 21, 2024 for Chinese Patent Application No. 202011494711.0 (See English Translation) (Note: WO 2019/208991 A1 was cited in a prior PTO-892.).
Office Action dated Jun. 28, 2024, issued in corresponding Chinese Patent Application No. 202011494711.0.

* cited by examiner

ORGANIC COMPOUNDS AND ORGANIC LIGHT EMITTING DISPLAY DEVICE USING THE SAME

CROSS-REFERENCE TO RELATED APPLICATIONS

This application claims the priority of Korean Patent Application No. 10-2019-0179779 filed on Dec. 31, 2019, in the Korean Intellectual Property Office, the disclosure of which is incorporated herein by reference.

BACKGROUND

Technical Field

The present disclosure relates to organic compounds and an organic light emitting display device using the same, and more particularly, to novel organic compounds with excellent electron transport properties and durability and an organic light emitting display device which can have high efficiency and long lifetime by applying the organic compounds to an organic layer.

Discussion of the Related Art

An organic light emitting display device (OLED) uses an organic light emitting element that is a self-light emitting element. Thus, the organic light emitting display device has a simple structure and is easy to manufacture. Further, the organic light emitting display device is advantageous in terms of power consumption since it is driven with a low voltage. Also, the organic light emitting display device has excellent color expression ability, high luminance, wide viewing angle, high response speed, and high contrast ratio. Therefore, the organic light emitting display device is being actively developed as a next-generation display device.

When a voltage is applied to an organic light emitting element, holes injected from an anode and electrons injected from a cathode recombine in a light emitting layer to form excitons. The organic light emitting element emits light via an organic light emission phenomenon when the excitons transit from an unstable excited state to a stable ground state.

In general, the organic light emitting element includes various layers to improve luminous efficiency and stability in addition to an anode that supplies holes, a cathode that supplies electrons and an organic light emitting layer (EML). For example, the organic light emitting element has a structure in which an anode, a hole injection layer (HIL), a hole transport layer (HTL), a light emitting layer, an electron transport layer (ETL) and an electron injection layer (EIL) are laminated.

In recent years, displays using organic light emitting elements have been scaled up and thinned. In line with this trend, the displays have been required to be driven with low power while having lifetime and luminous efficiency equal to or greater than those of conventional displays. However, organic compounds used in conventional organic light emitting elements cannot sufficiently satisfy the currently demanded properties such as low-power driving, high luminous efficiency and long lifetime.

SUMMARY

To achieve high efficiency and long lifetime, a light emitting layer of an organic light emitting element needs to be designed so that holes and electrons can be smoothly transferred, and charges injected into the light emitting layer do not leak to an adjacent layer.

Accordingly, embodiments of the present disclosure are directed to organic compounds and an organic light emitting display device using the same that substantially obviate one or more of the problems due to limitations and disadvantages of the related art.

An aspect of the present disclosure is to provide specific electron transport materials which can be applied to an organic light emitting display device to improve luminous efficiency and lifetime and lower a driving voltage. Another aspect of present disclosure is to provide an organic light emitting display device which uses these materials and thus has high efficiency and long lifetime.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

According to an aspect of the present disclosure, an organic compound is represented by the following Chemical Formula 1:

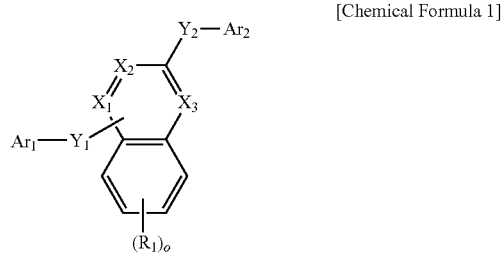

[Chemical Formula 1]

wherein in the above Chemical Formula 1, $R_1$ is selected from hydrogen, deuterium, substituted or unsubstituted $C_1$-$C_{10}$ alkyl groups, substituted or unsubstituted $C_6$-$C_{30}$ aryl groups and substituted or unsubstituted $C_3$-$C_{30}$ heteroaryl groups, o is an integer of 0 to 4, $X_1$, $X_2$ and $X_3$ are each independently N or C, and at least two of $X_1$, $X_2$ and $X_3$ are N, $Y_1$ and $Y_2$ are each independently a substituted or unsubstituted phenylene group or a single bond, $Ar_1$ and $Ar_2$ are each independently selected from substituted or unsubstituted $C_6$-$C_{30}$ aryl groups and substituted or unsubstituted $C_3$-$C_{30}$ heteroaryl groups, at least one of $Ar_1$ and $Ar_2$ is selected from a substituted or unsubstituted triazine group, a functional group represented by the following Chemical Formula 2 and a functional group represented by the following Chemical Formula 3,

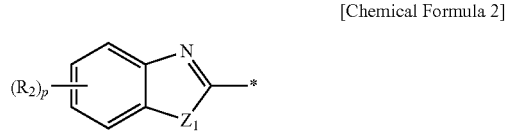

[Chemical Formula 2]

-continued

[Chemical Formula 3]

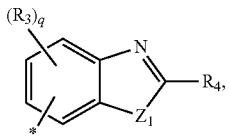

and in the above Chemical Formulas 2 and 3, $Z_1$ and $Z_2$ are each independently O or S, $R_2$, $R_3$ and $R_4$ are each independently selected from hydrogen, deuterium, substituted or unsubstituted $C_1$-$C_{10}$ alkyl groups, substituted or unsubstituted $C_6$-$C_{30}$ aryl groups and substituted or unsubstituted $C_3$-$C_{30}$ heteroaryl groups, p is an integer of 0 to 4, q is an integer of 0 to 3, and the asterisk represents bonding site.

According to another aspect of the present disclosure, an organic light emitting display device includes a plurality of sub-pixels. At least one of the plurality of sub-pixels includes an organic light emitting element. The organic light emitting element includes an anode, an organic layer disposed on the anode and containing an organic compound represented by Chemical Formula 1, and a cathode disposed on the organic layer.

In the organic light emitting display device according to the present disclosure, the organic layer contains an organic compound represented by Chemical Formula 1 and thus can smoothly transfer electrons injected from the cathode to an organic light emitting layer. Therefore, the luminous efficiency and lifetime of the organic light emitting display device can be improved.

Other detailed matters of the exemplary embodiments are included in the detailed description and the drawings.

According to the present disclosure, it is possible to provide an electron transport organic compound having a specific structure. The organic compound of the present disclosure has excellent electron transport properties and high durability. Also, the organic compound is used in an organic layer, specifically an electron transport layer, of an organic light emitting display device. Thus, electrons injected from a cathode can be smoothly transferred to an organic light emitting layer. Therefore, it is possible to provide a display device which can be driven at a low voltage and has greatly improved luminous efficiency and lifetime.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
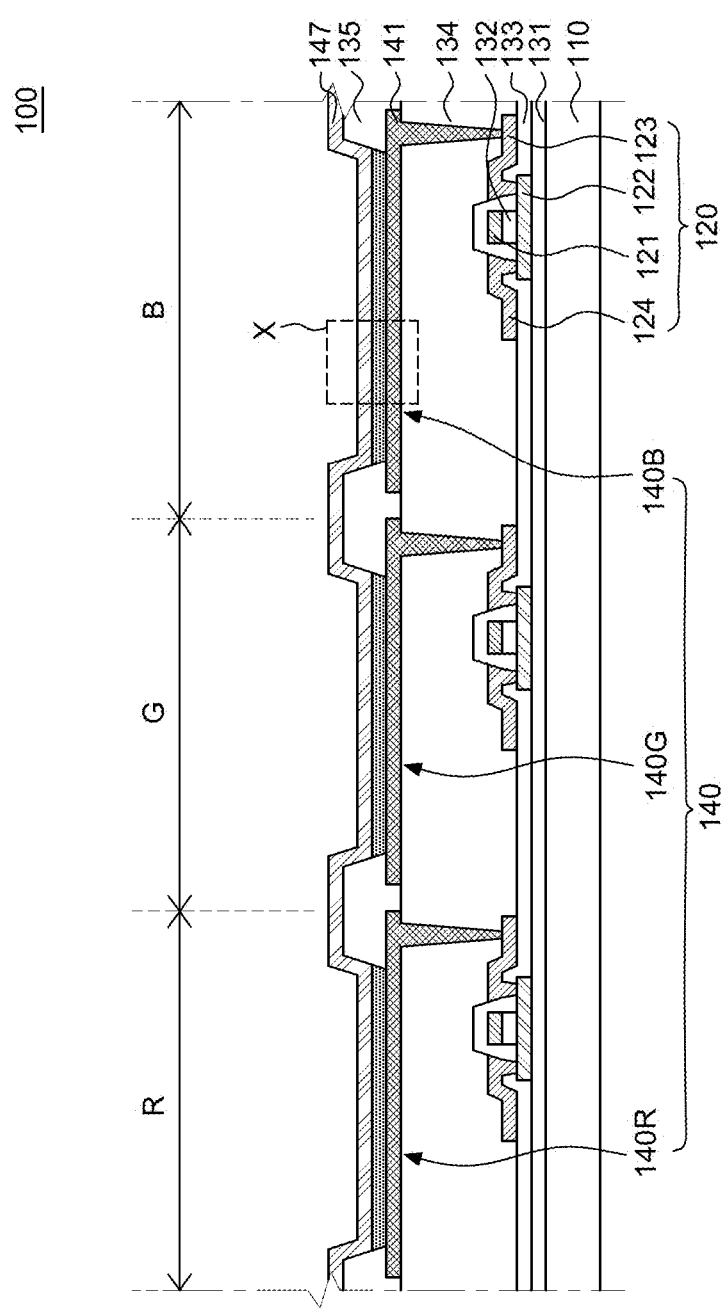
FIG. 1 is a schematic cross-sectional view of an organic light emitting display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

As used herein, the term "unsubstituted" means that a hydrogen atom is not substituted or the hydrogen atom is substituted by an isotope selected from protium, deuterium and tritium.

As used herein, the term "substituted" means that a hydrogen atom or atom group of a compound is substituted by a substituent. For example, the substituent may be selected from $C_1$-$C_{30}$ alkyl groups, $C_2$-$C_{30}$ alkenyl groups, $C_2$-$C_{24}$ alkynyl groups, $C_3$-$C_{12}$ cycloalkyl groups, $C_2$-$C_{30}$ heterocycloalkyl groups, $C_7$-$C_{30}$ aralkyl groups, $C_6$-$C_{30}$ aryl groups, $C_5$-$C_{30}$ heteroaralkyl groups, $C_1$-$C_{30}$ alkoxy groups, $C_1$-$C_{30}$ alkylamino groups, $C_6$-$C_{30}$ arylamino groups, $C_7$-$C_{30}$ aralkylamino groups, $C_2$-$C_{24}$ heteroarylamino groups, $C_1$-$C_{30}$ alkylsilyl groups, $C_6$-$C_{30}$ arylsilyl groups, $C_6$-$C_{30}$ aryloxy groups, $C_1$-$C_{30}$ alkyl halide groups, a cyano group, a halogen group, a carboxyl group, a hydroxyl group, a carbonyl group, an amine group, a nitro group, and combinations thereof, but may not be limited thereto.

As used herein, the term "hetero" means that at least one of carbon atoms constituting a cyclic saturated or unsaturated hydrocarbon is substituted by a heteroatom such as N, O, S and Se.

As used herein, the term "alkyl" refers to a monovalent substituent derived from linear or branched saturated hydrocarbons. For example, the alkyl may include methyl, ethyl, propyl, n-butyl, iso-butyl, n-pentyl, hexyl, and the like, but may not be limited thereto.

As used herein, the term "alkenyl" refers to a monovalent substituent derived from linear or branched unsaturated hydrocarbons having two or more carbon atoms with at least one C=C bond. For example, the alkenyl may include vinyl, allyl, iso-propenyl, 2-butenyl, and the like, but may not be limited thereto.

As used herein, the term "alkynyl" refers to a monovalent substituent derived from linear or branched unsaturated hydrocarbons having two or more carbon atoms with at least one carbon-carbon triple bond. For example, the alkynyl may include ethynyl, 2-propynyl, and the like, but may not be limited thereto.

As used herein, the term "aryl" refers to a monovalent substituent derived from aromatic hydrocarbons and may have a form in which two or more rings are simply connected to each other in a pendant form or are condensed with each other. For example, the aryl may include a phenyl group, a naphthyl group, a phenanthryl group, and the like, but may not be limited thereto.

As used herein, the term "heteroaryl" refers to a monovalent substituent derived from aromatic hydrocarbons of which at least one carbon in a ring is substituted by a heteroatom such as N, O, S or Se. Furthermore, the heteroaryl may have a form in which two or more rings are simply connected to each other in a pendant form or are condensed with each other or are condensed with an aryl group. For example, the heteroaryl may include a pyridine group, a pyrazine group, a pyrimidine group, a pyridazine group, a triazine group, a phenoxazine group, an indolizine group, a benzothiazole group, a benzoxazole group, a benzofuran group, purinyl, quinolyl, carbazolyl, N-imidazolyl, 2-pyridinyl, 2-pyrimidinyl, and the like, but may not be limited thereto.

As used herein, the term "aryloxy" refers to a monovalent substituent represented by General Formula ArO—, in which Ar represents aryl. For example, the aryloxy may include phenyloxy, naphthyloxy, diphenyloxy, and the like, but may not be limited thereto.

As used herein, the term "alkoxy" refers to a monovalent substituent represented by General Formula RO—, in which R represents linear alkyl, branched alkyl or cycloalkyl having at least one carbon atom. For example, the alkyloxy may include methoxy, ethoxy, n-propoxy, t-butoxy, n-butoxy, and the like, but may not be limited thereto.

As used herein, the term "cycloalkyl" refers to a monovalent substituent derived from cyclic saturated hydrocarbons having three or more carbon atoms and may include polycyclic form comprising two or more cyclic saturated hydrocarbons. Also, the cycloalkyl may comprise condensed form of cyclic groups. For example, the cycloalkyl may include cyclopropyl, cyclopentyl, cyclohexyl, norbornyl, adamantyl, and the like, but may not be limited thereto.

As used herein, the term "heterocycloalkyl" refers to a monovalent substituent derived from cyclic saturated hydrocarbons of which at least one carbon atom in a ring is substituted by a heteroatom such as N, O, S or Se and may include polycyclic form comprising two or more heterocyclic saturated hydrocarbons. For example, the heterocycloalkyl may include morpholinyl, piperazinyl, and the like, but may not be limited thereto.

As used herein, the terms "alkyl amine" and "aryl amine" refer to amine substituted by an alkyl group and an aryl group, respectively.

As used herein, the terms "alkyl silyl", "aryl silyl" "alkoxy silyl" and "cycloalkyl silyl" refer to silyl substituted by an alkyl group, an aryl group, an alkoxy group and a cycloalkyl group, respectively.

In Chemical Formulas described herein, "*" refers to a bonding site.

Hereinafter, the present disclosure will be described with reference to Chemical Formulas and the accompanying drawings.

According to an aspect of the present disclosure, an organic compound is represented by the following Chemical Formula 1:

[Chemical Formula 1]

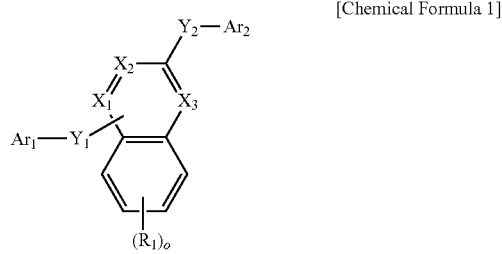

In Chemical Formula 1, $R_1$ is selected from hydrogen, deuterium, substituted or unsubstituted $C_1$-$C_{10}$ alkyl groups, substituted or unsubstituted $C_6$-$C_{30}$ aryl groups and substituted or unsubstituted $C_3$-$C_{30}$ heteroaryl groups. Preferably, $R_1$ may be selected from hydrogen, unsubstituted $C_1$-$C_{10}$ alkyl groups, unsubstituted $C_6$-$C_{20}$ aryl groups and unsubstituted $C_5$-$C_{20}$ heteroaryl groups.

In Chemical Formula 1, o is an integer of 0 to 4. For example, o may be 0 or 1.

In Chemical Formula 1, $X_1$, $X_2$ and $X_3$ are each independently N or C, and at least two of $X_1$, $X_2$ and $X_3$ are N.

In Chemical Formula 1, $Y_1$ and $Y_2$ are each independently a substituted or unsubstituted phenylene group or a single bond.

In Chemical Formula 1, $Ar_1$ and $Ar_2$ are each independently selected from substituted or unsubstituted $C_6$-$C_{30}$ aryl groups and substituted or unsubstituted $C_3$-$C_{30}$ heteroaryl groups. Also, at least one of $Ar_1$ and $Ar_2$ is selected from a substituted or unsubstituted triazine group, a functional group represented by the following Chemical Formula 2 and a functional group represented by the following Chemical Formula 3. These functional groups contain nitrogen having an sp²-hybridized orbital and thus may increase the electron moving speed.

[Chemical Formula 2]

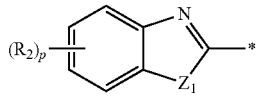

In Chemical Formula 2, $Z_1$ is O or S.

In Chemical Formula 2, $R_2$ is selected from hydrogen, deuterium, substituted or unsubstituted $C_1$-$C_{10}$ alkyl groups, substituted or unsubstituted $C_6$-$C_{30}$ aryl groups and substituted or unsubstituted $C_3$-$C_{30}$ heteroaryl groups.

In Chemical Formula 2, p is an integer of 0 to 4. Preferably, p may be 0 or 1.

[Chemical Formula 3]

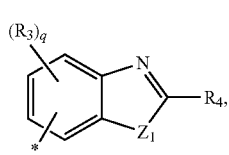

In Chemical Formula 3, $Z_2$ is O or S.

In Chemical Formula 3, $R_3$ and $R_4$ are each independently selected from hydrogen, deuterium, substituted or unsubstituted $C_1$-$C_{10}$ alkyl groups, substituted or unsubstituted $C_6$-$C_{30}$ aryl groups and substituted or unsubstituted $C_3$-$C_{30}$ heteroaryl groups. Preferably, $R_3$ may be hydrogen and $R_4$ may be selected from hydrogen, unsubstituted $C_1$-$C_{10}$ alkyl groups and unsubstituted $C_6$-$C_{15}$ aryl groups.

In Chemical Formula 3, q is an integer of 0 to 3. Preferably, q may be 0 or 1.

For example, in Chemical Formula 1, $X_1$ and $X_3$ may be N and $X_2$ may be C. For another example, in Chemical Formula 1, $X_1$ may be C and $X_2$ and $X_3$ may be N.

For example, in Chemical Formula 1, $Ar_1$ and $Ar_2$ are each independently selected from a functional group represented by the following Chemical Formula A but may not be limited thereto.

[Chemical Formula A]

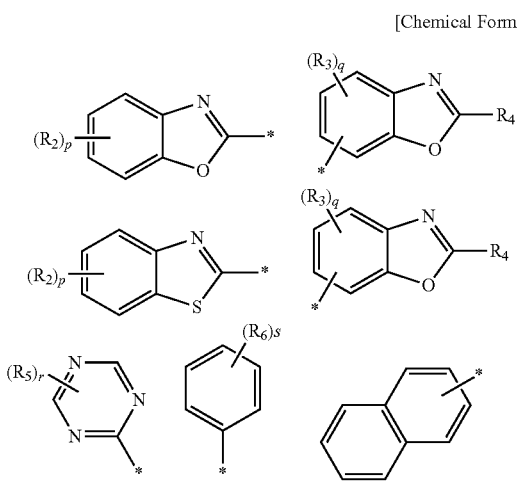

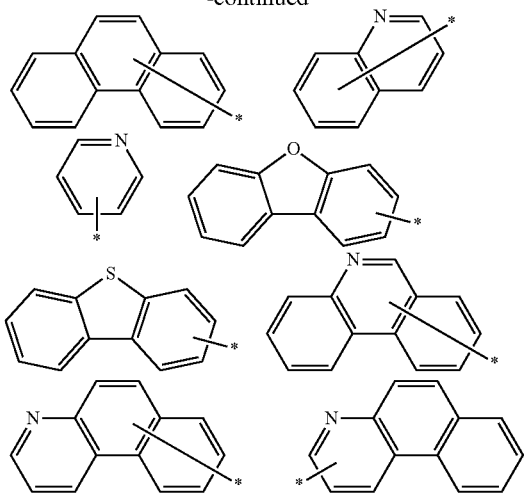

In Chemical Formula A, each $R_5$ is independently selected from hydrogen, deuterium, substituted or unsubstituted $C_1$-$C_{10}$ alkyl groups, substituted or unsubstituted $C_6$-$C_{30}$ aryl groups and substituted or unsubstituted $C_3$-$C_{30}$ heteroaryl groups and r is an integer of 0 to 2.

Also, each $R_6$ is independently selected from hydrogen, deuterium, substituted or unsubstituted $C_1$-$C_{10}$ alkyl groups, substituted or unsubstituted $C_6$-$C_{30}$ aryl groups and substituted or unsubstituted $C_3$-$C_{30}$ heteroaryl groups and s is an integer of 0 to 5.

In the above Chemical Formula A, $R_2$, $R_3$, $R_4$, p and q are identical to those defined in Chemical Formulas 2 and 3.

In Chemical Formula 1, $Ar_1$ and $Ar_2$ may be identical to or different from each other. If $Ar_1$ and $Ar_2$ are different from each other, the organic compound exhibits excellent electron transport properties and stability.

For example, in Chemical Formula 1, at least one of $Ar_1$ and $Ar_2$ may be selected from a functional group represented by the following Chemical Formula B. In this case, the organic compound exhibits excellent electron transport properties and durability.

[Chemical Formula B]

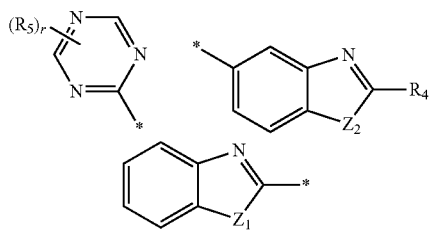

In Chemical Formula B, $Z_1$, $Z_2$ and $R_4$ are identical to those defined in Chemical Formulas 2 and 3, and $R_5$ and r are identical to those defined in Chemical Formula A.

For another example, in Chemical Formula 1, at least one of $Ar_1$ and $Ar_2$ may be selected from a functional group represented by the following Chemical Formula C. In this case, the organic compound exhibits excellent electron transport properties and durability.

[Chemical Formula C]

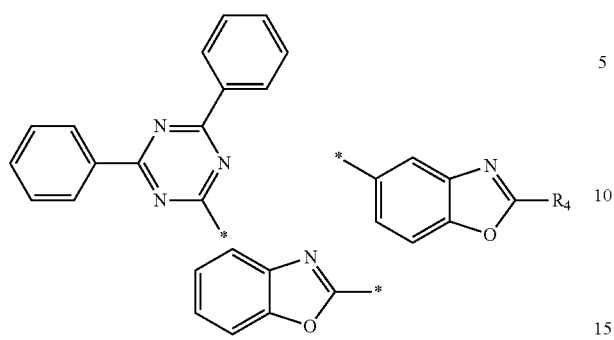

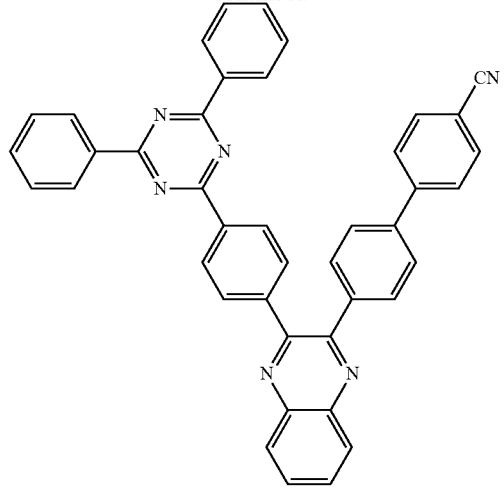

In Chemical Formula C, $R_4$ is identical to that defined in Chemical Formula 3.

In Chemical Formula 1, if one of $Ar_1$ and $Ar_2$ is selected from the functional group represented by Chemical Formula B or C, the other one may be selected from the functional group represented by Chemical Formula A but may not be limited thereto.

For example, in Chemical Formula 1, $X_1$ and $X_3$ may be N, $X_2$ may be C, and o may be O. In this case, the organic compound may be quinoxaline represented by the following Chemical Formula 1-1.

[Chemical Formula 1-1]

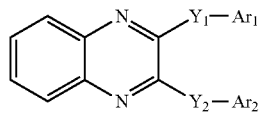

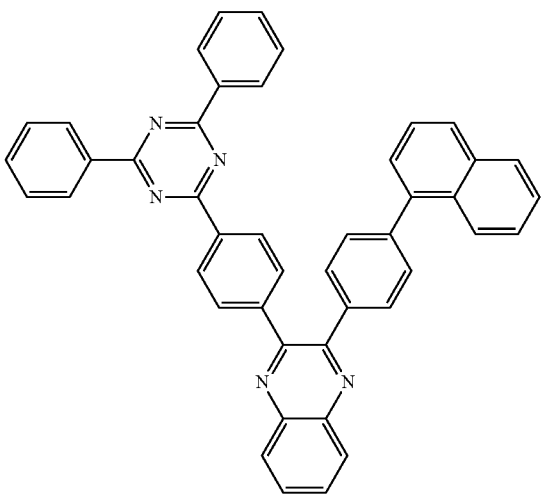

In Chemical Formula 1-1, $Y_1$, $Y_2$, $Ar_1$ and $Ar_2$ are identical to those defined in Chemical Formula 1.

Preferably, in Chemical Formula 1-1, one of $Ar_1$ and $Ar_2$ may be selected from the functional group represented by Chemical Formula B and the other one may be selected from the functional group represented by Chemical Formula A. In this case, the organic compound may be selected from the group represented by the following Chemical Formula D.

[Chemical Formula D]

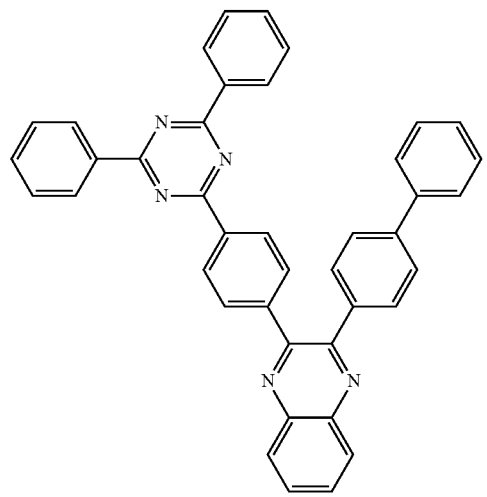

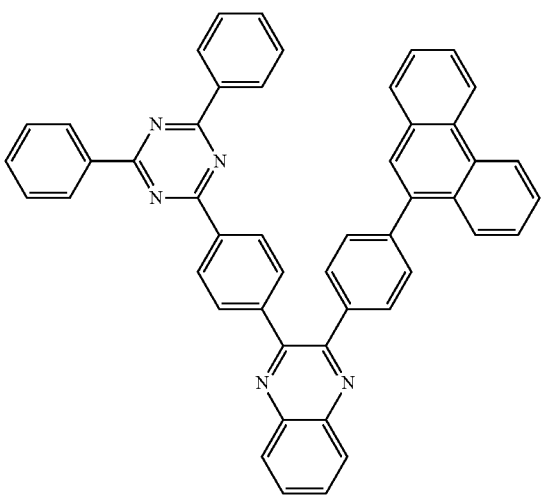 [SMILES: c1ccc(-c2nc(-c3ccccc3)nc(-c3ccc(-c4nc5ccccc5nc4-c4ccc(-c5cc6ccccc6c6ccccc56)cc4)cc3)n2)cc1]

-continued
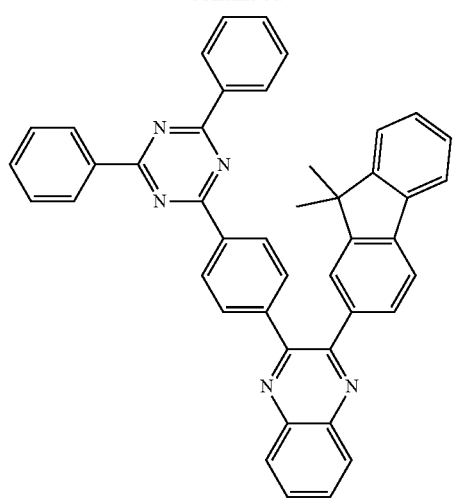
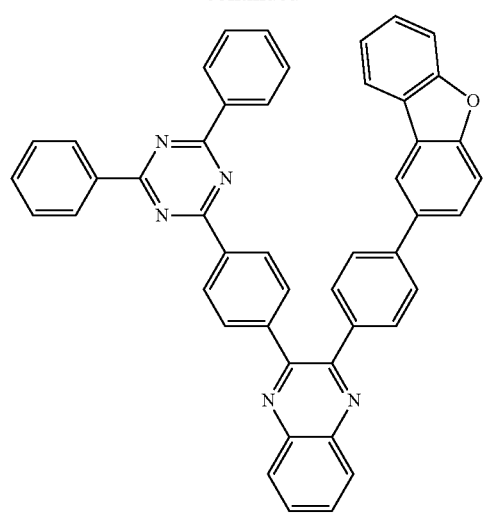 [SMILES: c1ccc(-c2nc(-c3ccccc3)nc(-c3ccc(-c4nc5ccccc5nc4-c4ccc(-c5ccc6oc7ccccc7c6c5)cc4)cc3)n2)cc1]
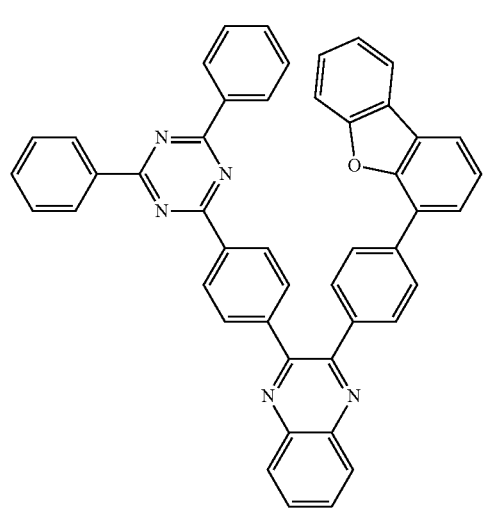
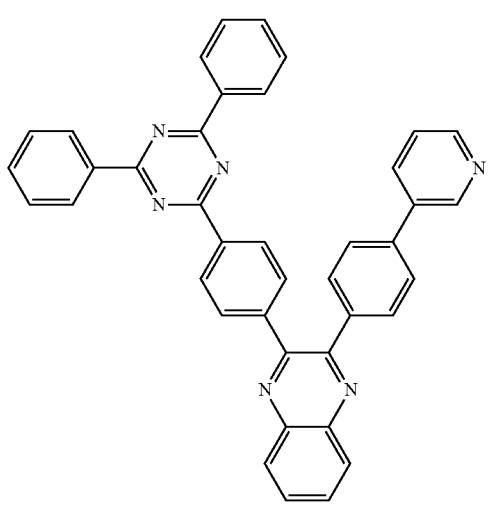
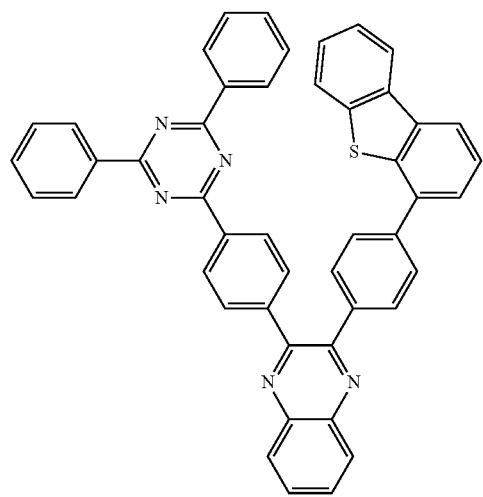
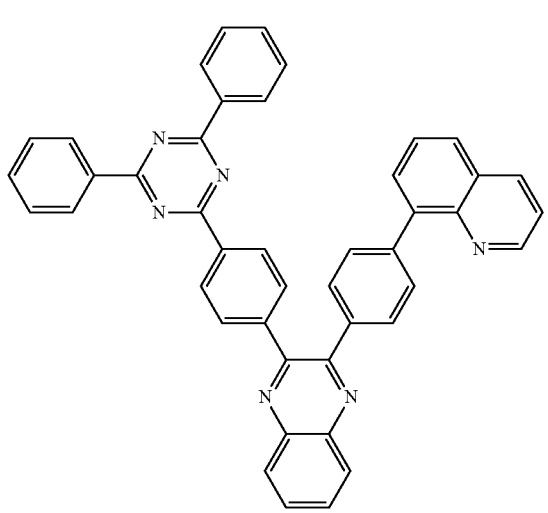

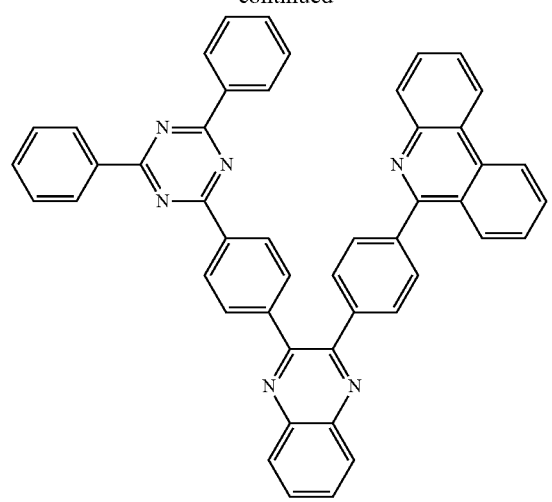
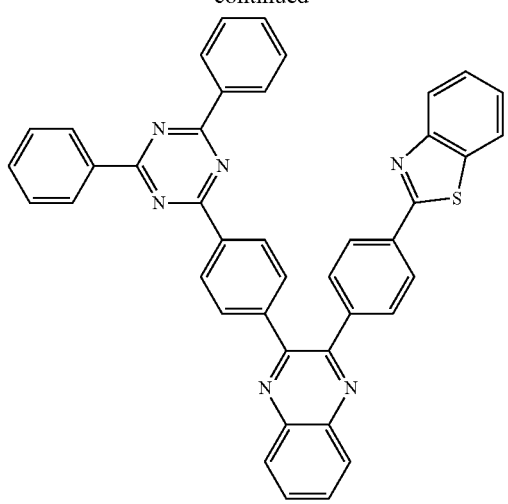
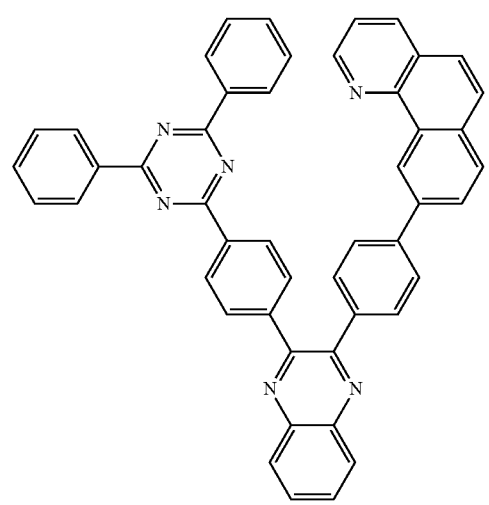 [SMILES: c1ccc(-c2nc(-c3ccccc3)nc(-c3ccc(-c4nc5ccccc5nc4-c4ccc(-c5ccc6ccc7cccnc7c6c5)cc4)cc3)n2)cc1]
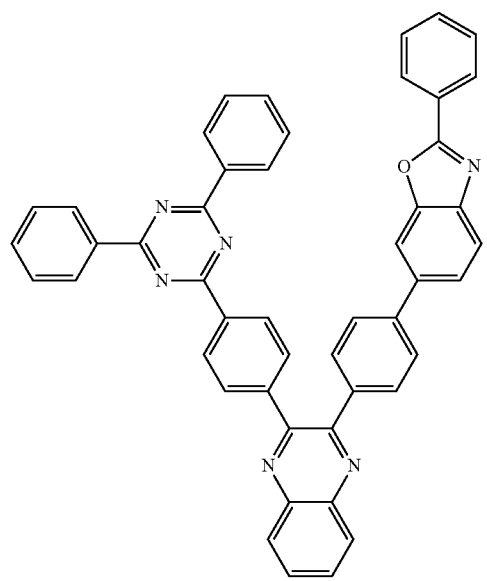
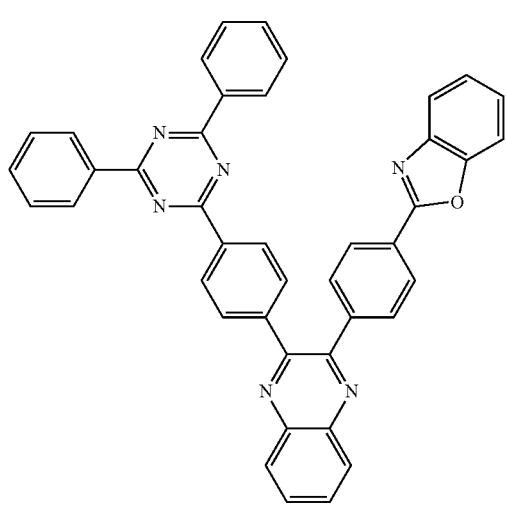
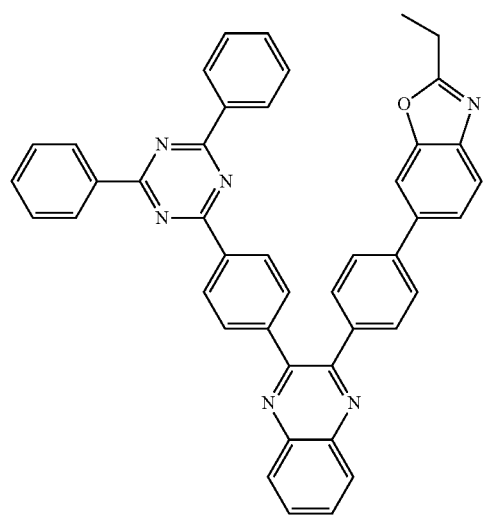 [SMILES: CCc1nc2ccc(-c3ccc(-c4nc5ccccc5nc4-c4ccc(-c5nc(-c6ccccc6)nc(-c6ccccc6)n5)cc4)cc3)cc2o1]

-continued
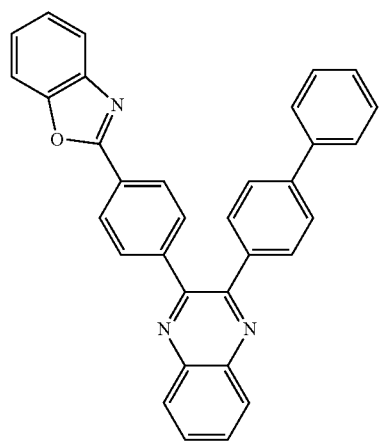
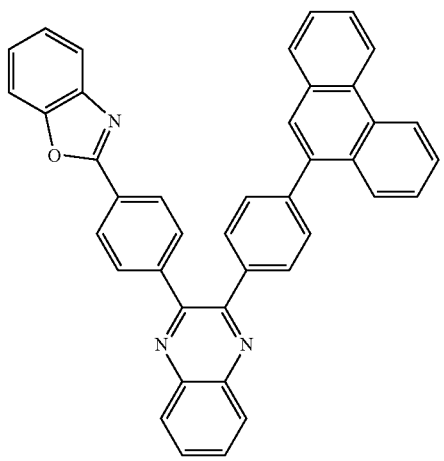
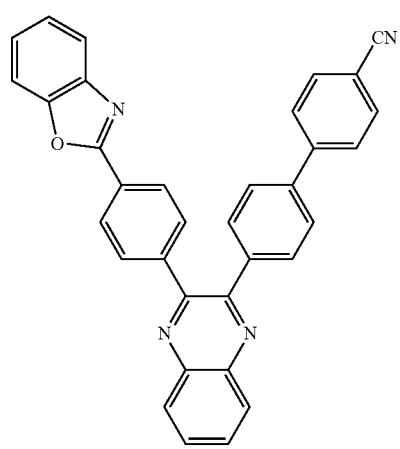
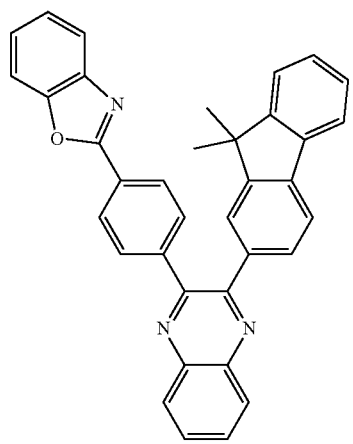
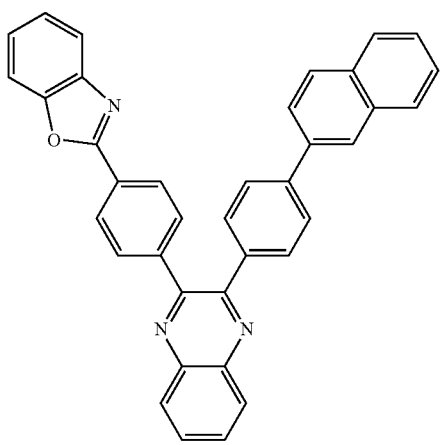
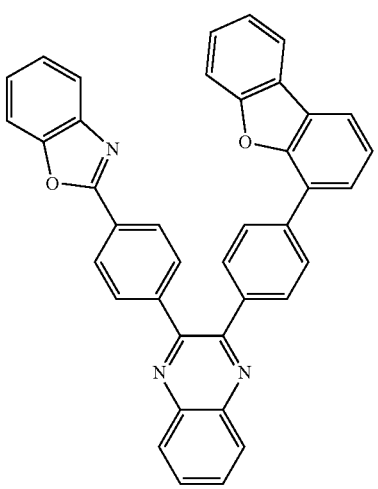

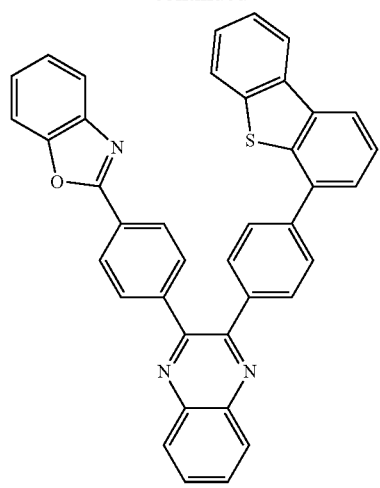
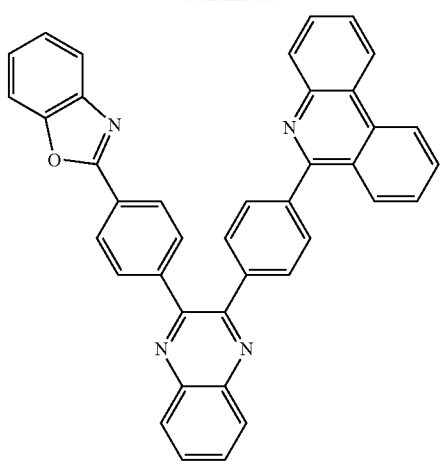
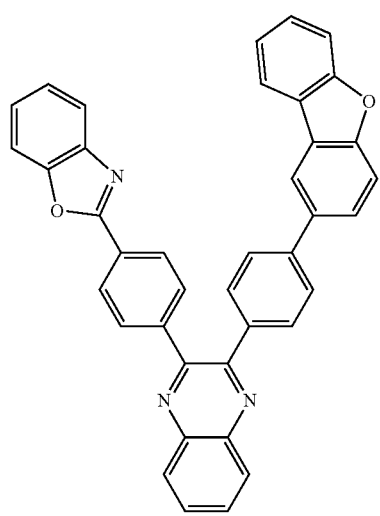 [SMILES: c1ccc2nc(-c3ccc(-c4nc5ccccc5o4)cc3)c(-c3ccc(-c4ccc5oc6ccccc6c5c4)cc3)nc2c1]
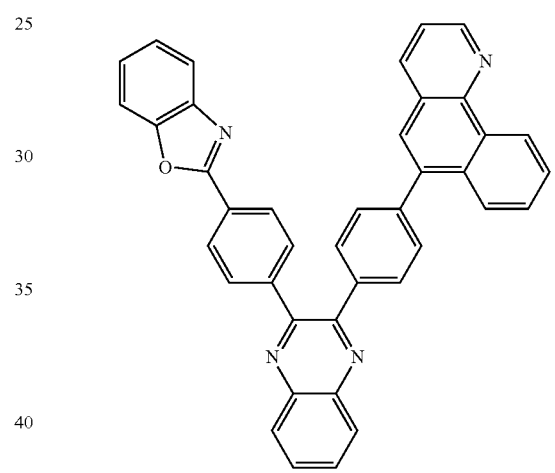
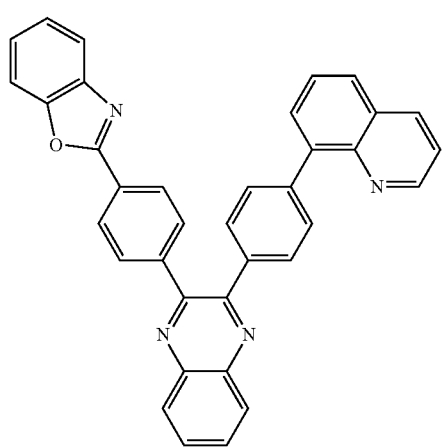
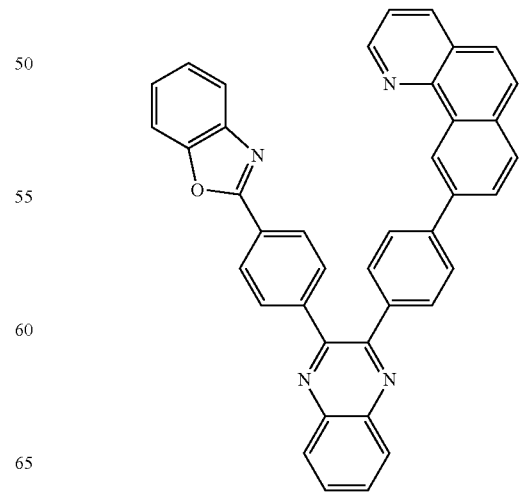

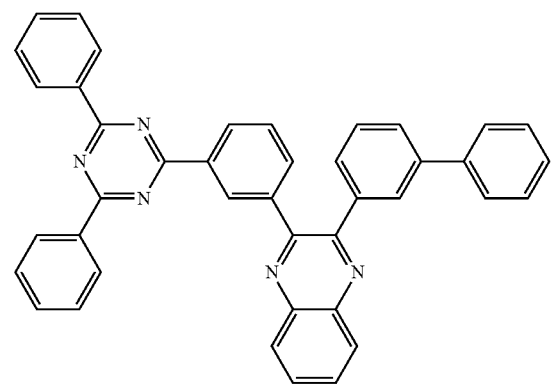
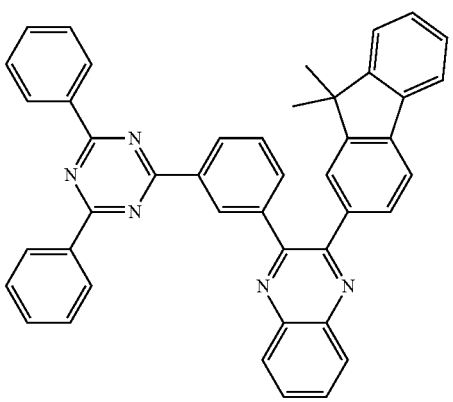
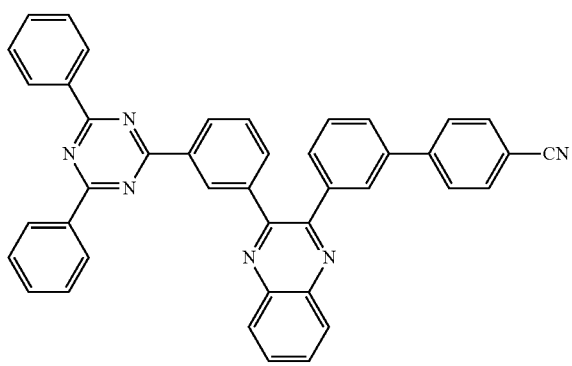
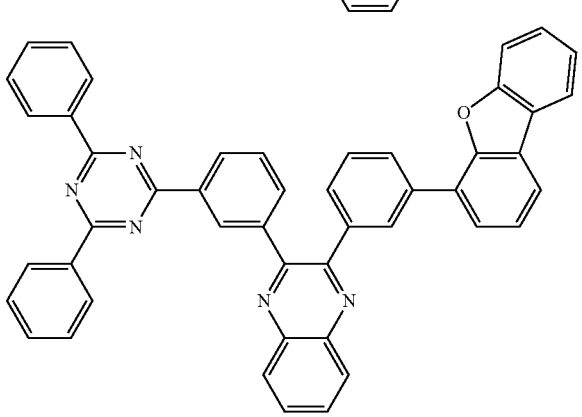
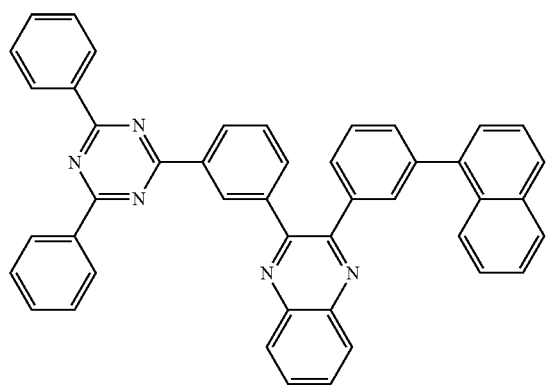
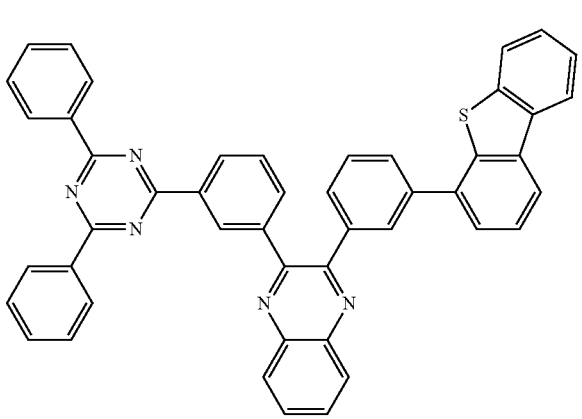
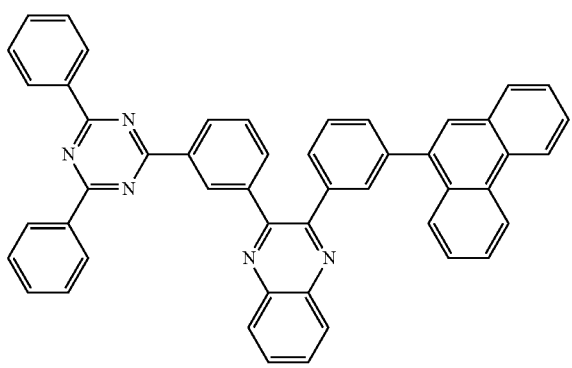
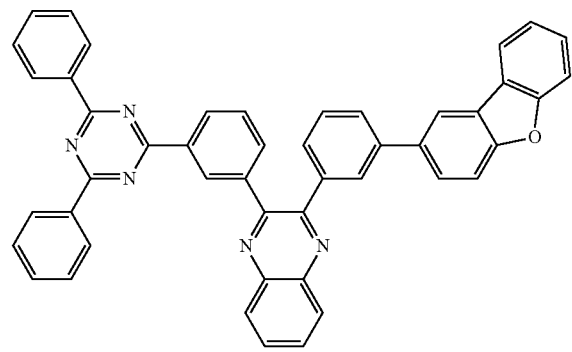

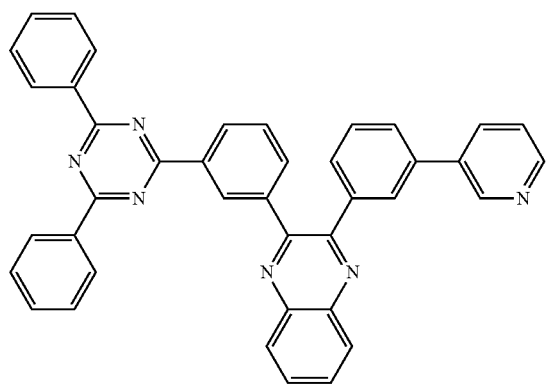
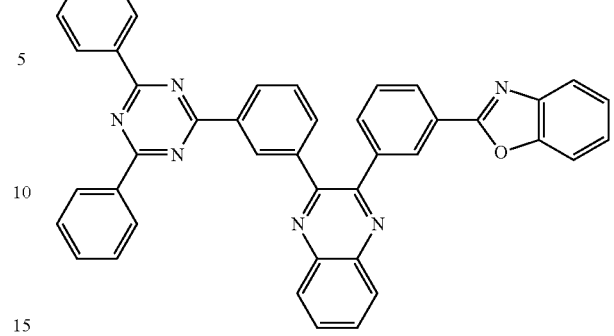
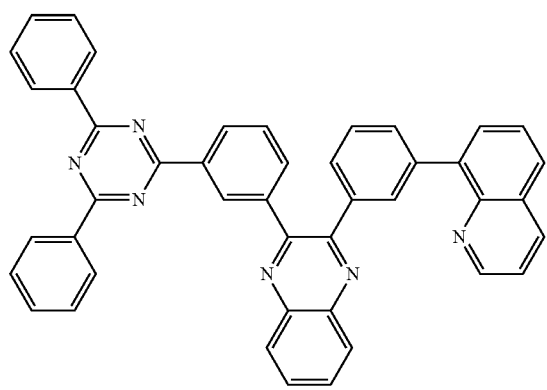
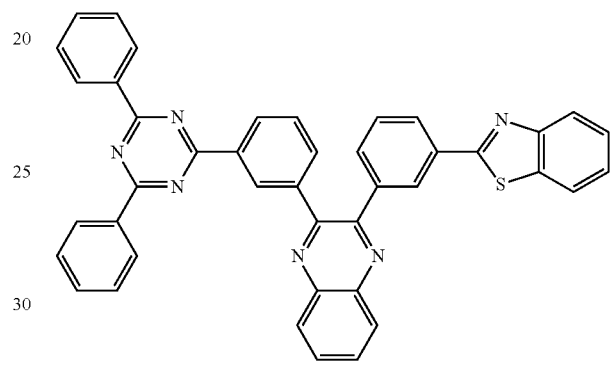
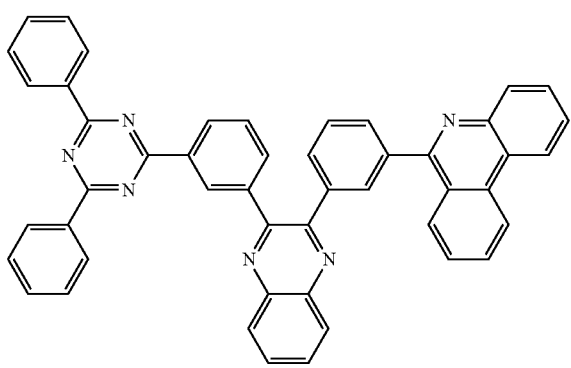
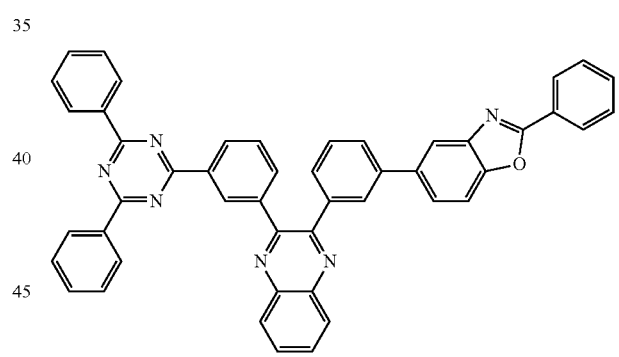
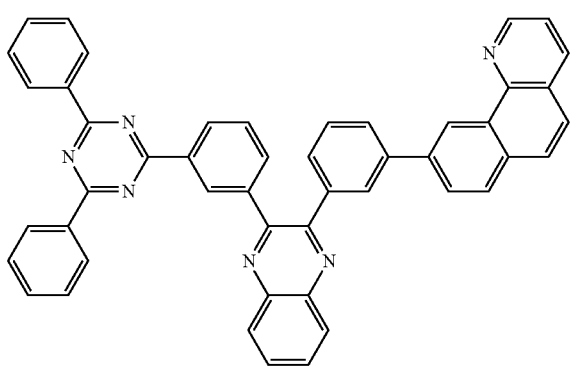
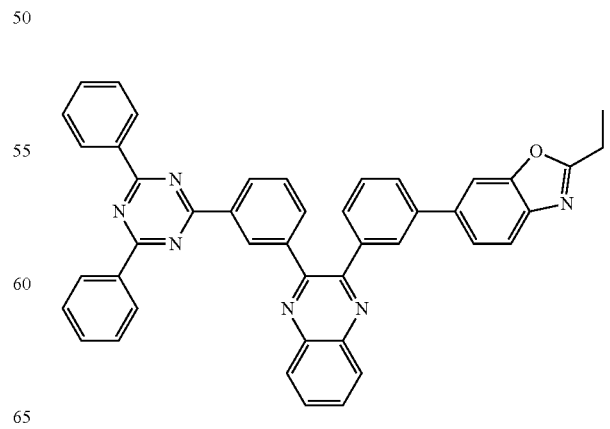

-continued
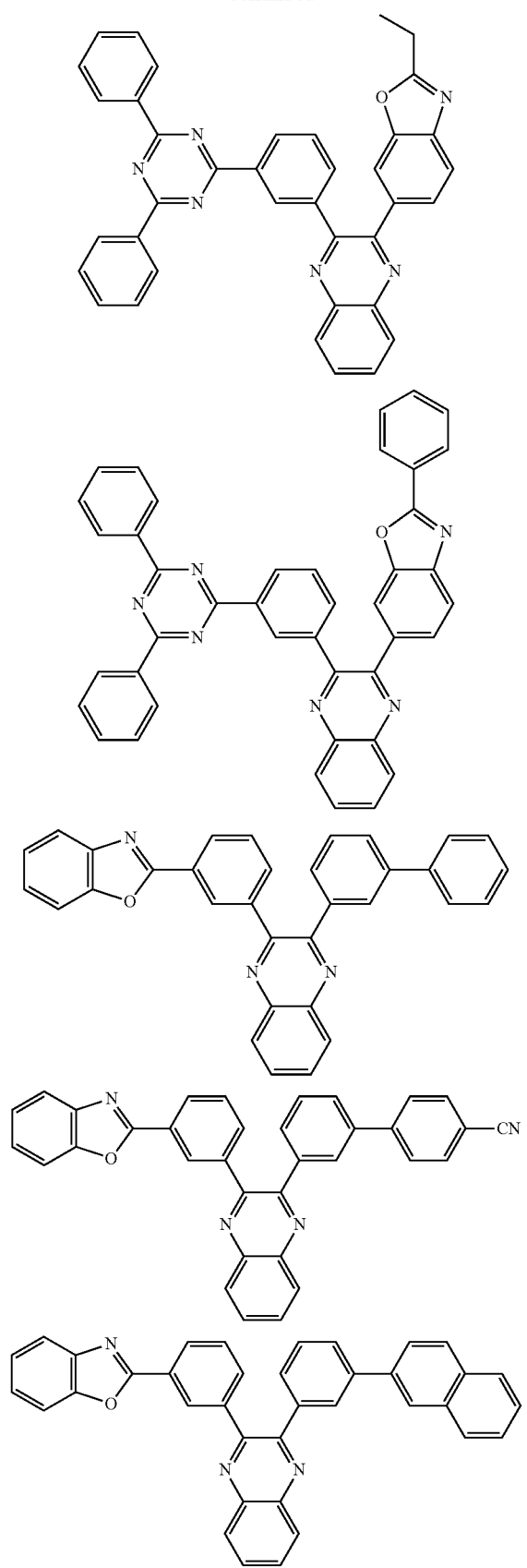
-continued
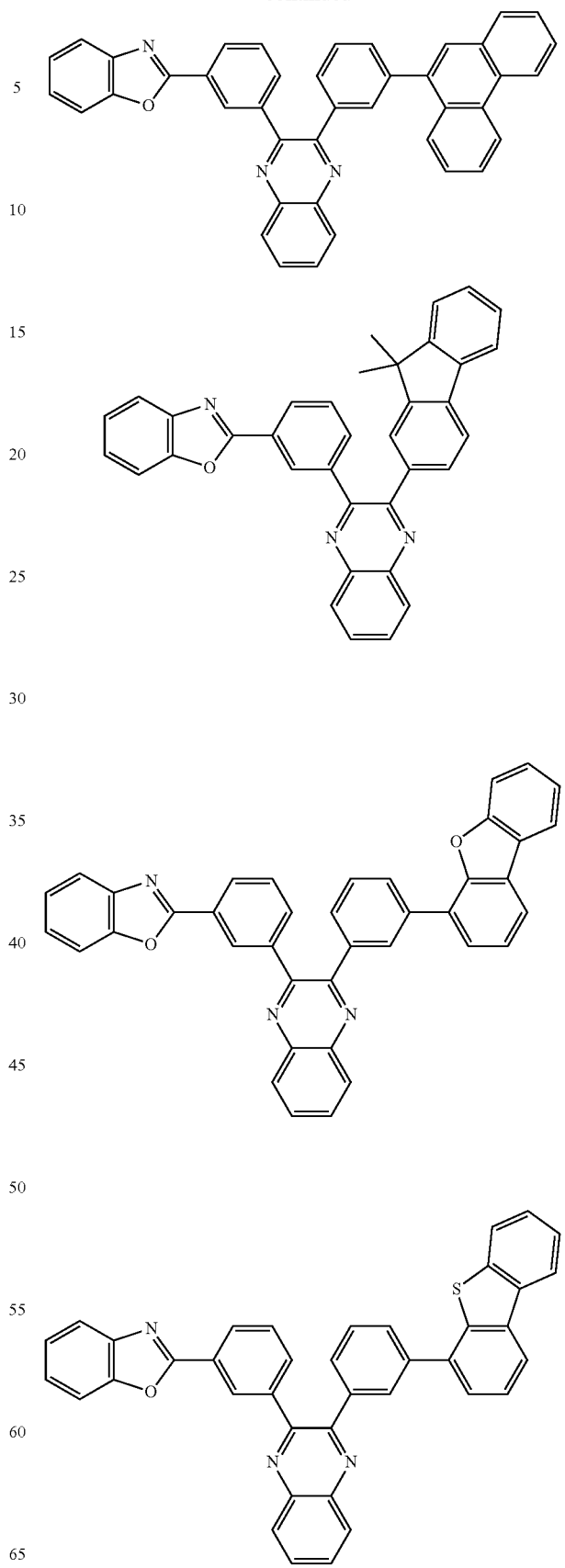

-continued

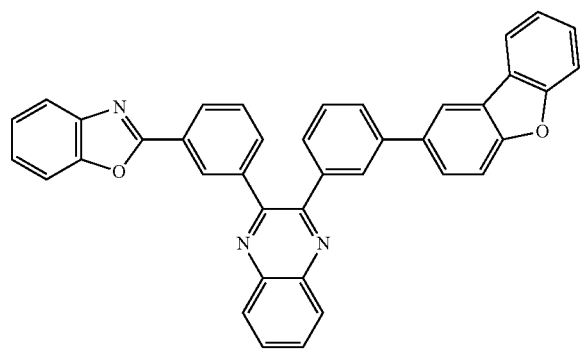

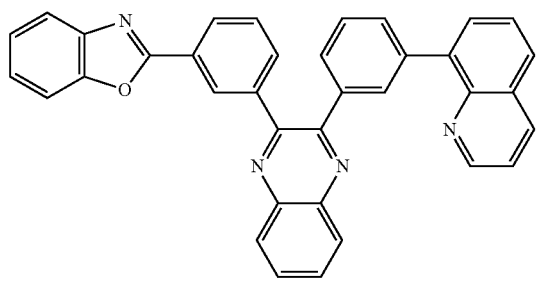

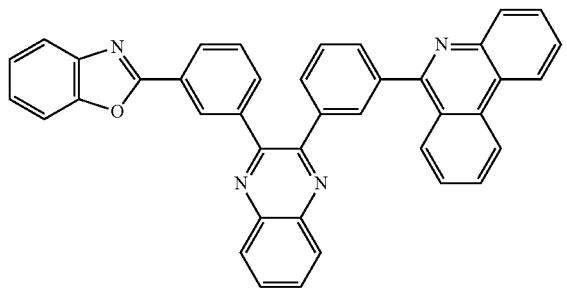

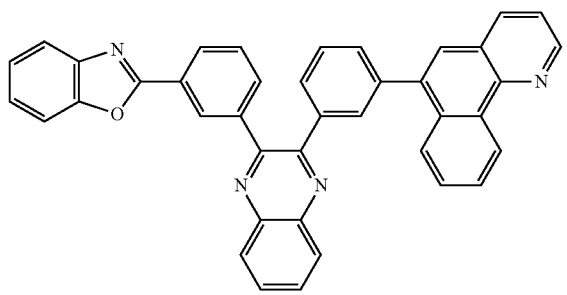

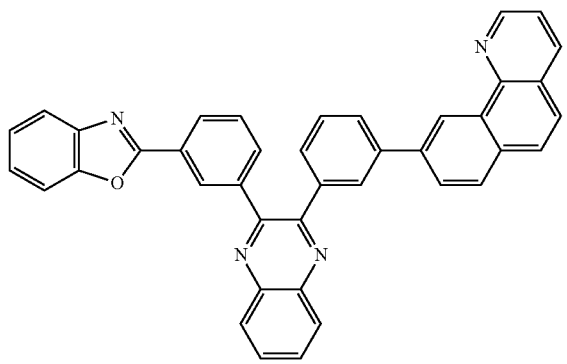

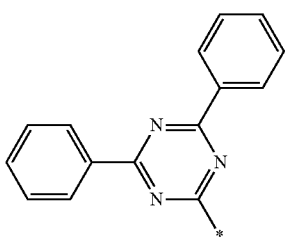
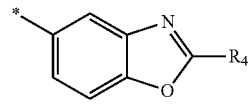

In the above Chemical Formula, $R_4$ may be a phenyl group and the organic compound may be selected from a group represented by the following Chemical Formula E but may not be limited thereto.

[Chemical Formula E]

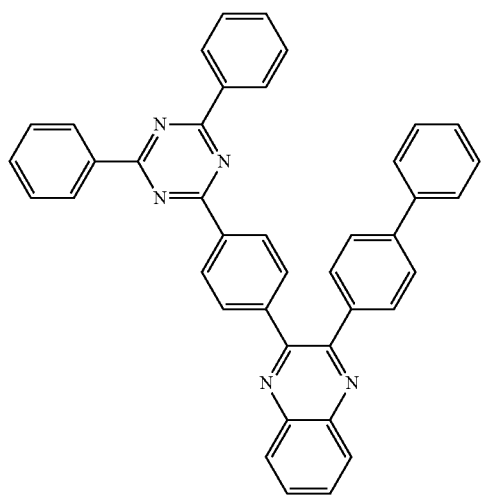

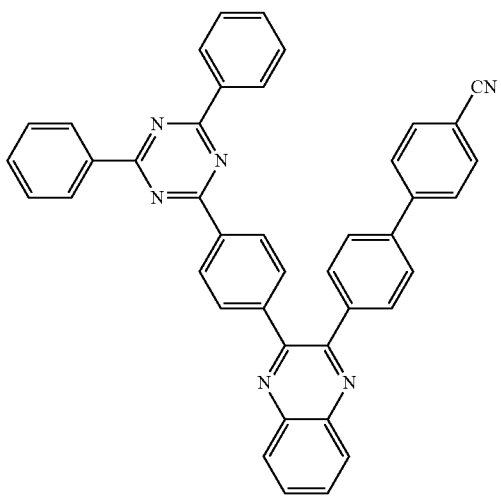

For example, in Chemical Formula 1-1, $Y_1$ and $Y_2$ are phenylene groups, and at least one of $Ar_1$ and $Ar_2$ may be selected from a functional group represented by the following Chemical Formula.

-continued

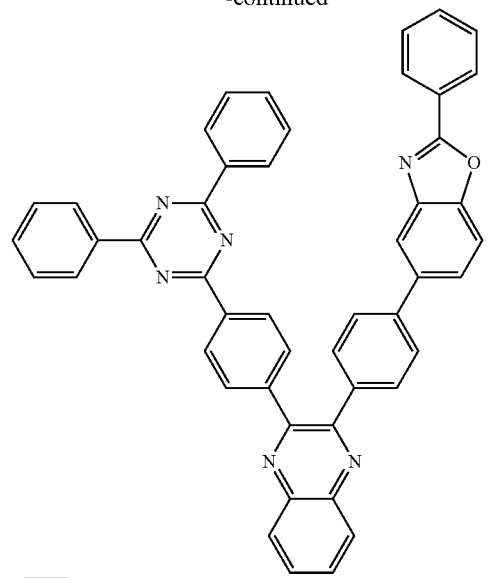

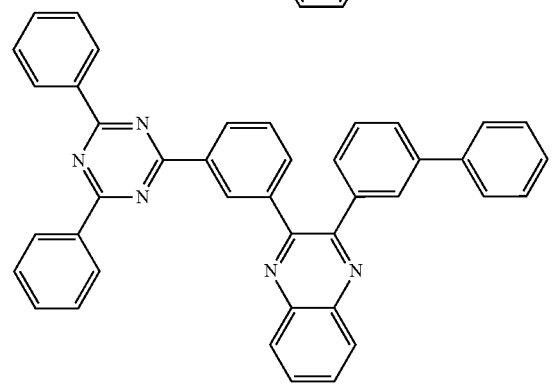

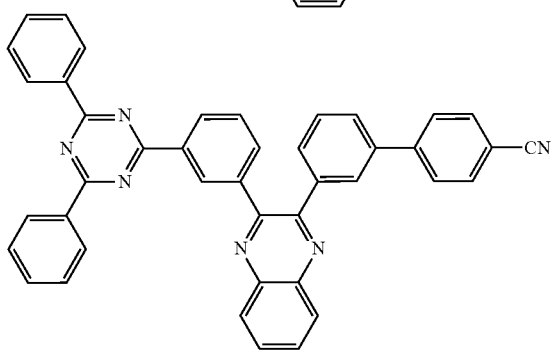

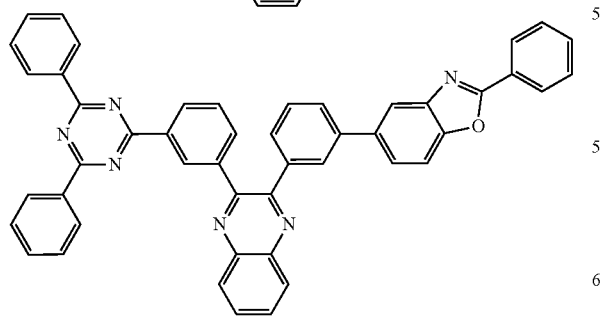

For another example, in Chemical Formula 1, $X_1$ may be C, $X_2$ and $X_3$ may be N, and o may be 0. In this case, the organic compound may be quinazoline represented by the following Chemical Formula 1-2.

[Chemical Formula 1-2]

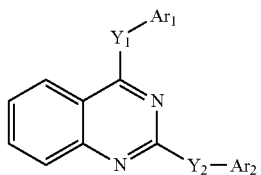

In Chemical Formula 1-2, $Y_1$, $Y_2$, $Ar_1$ and $Ar_2$ are identical to those defined in Chemical Formula 1.

Preferably, in Chemical Formula 1-2, one of $Ar_1$ and $Ar_2$ may be selected from the functional group represented by Chemical Formula B and the other one may be selected from the functional group represented by Chemical Formula A. In this case, the organic compound may be selected from the group represented by the following Chemical Formula F.

[Chemical Formula F]

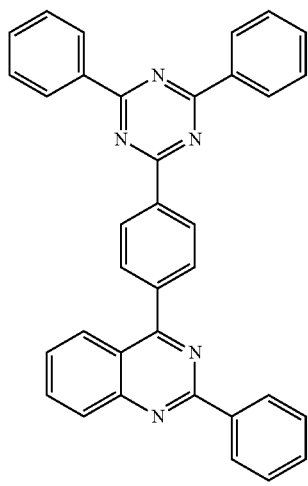

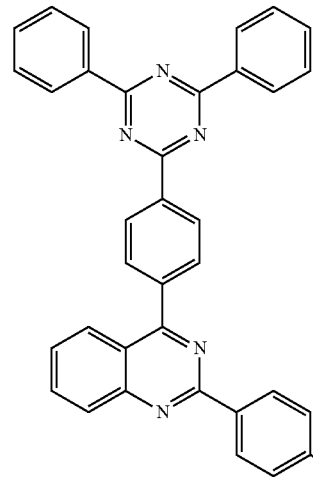

-continued
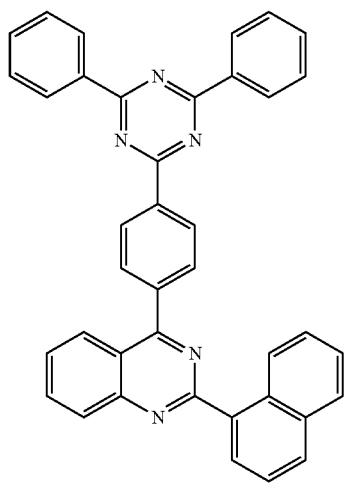
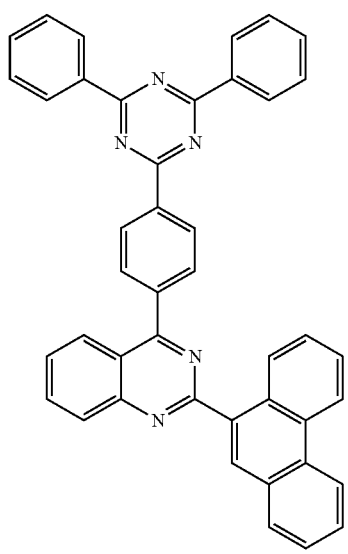
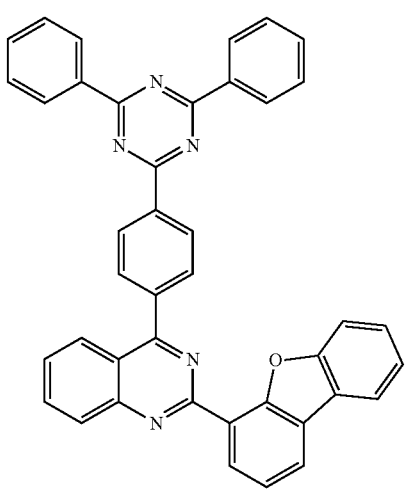
-continued
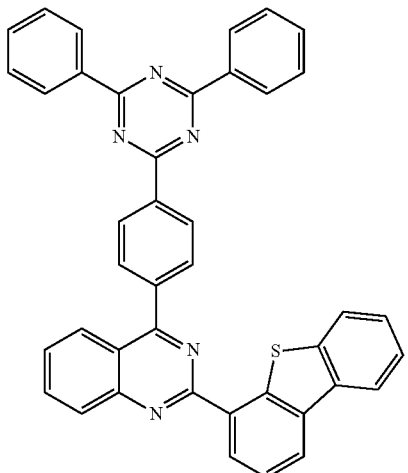
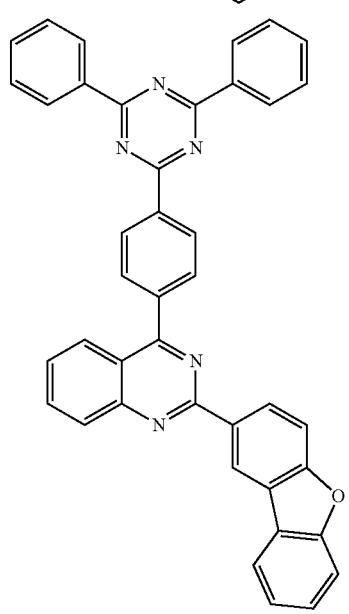
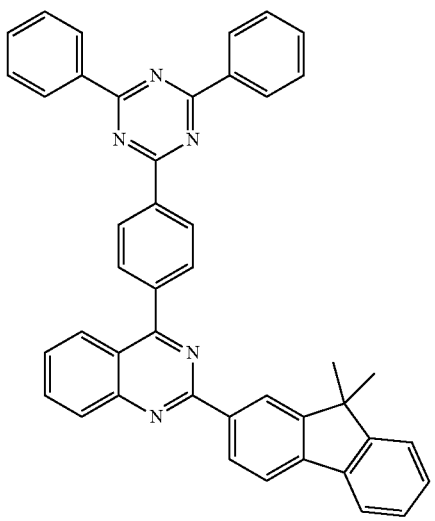

31
-continued
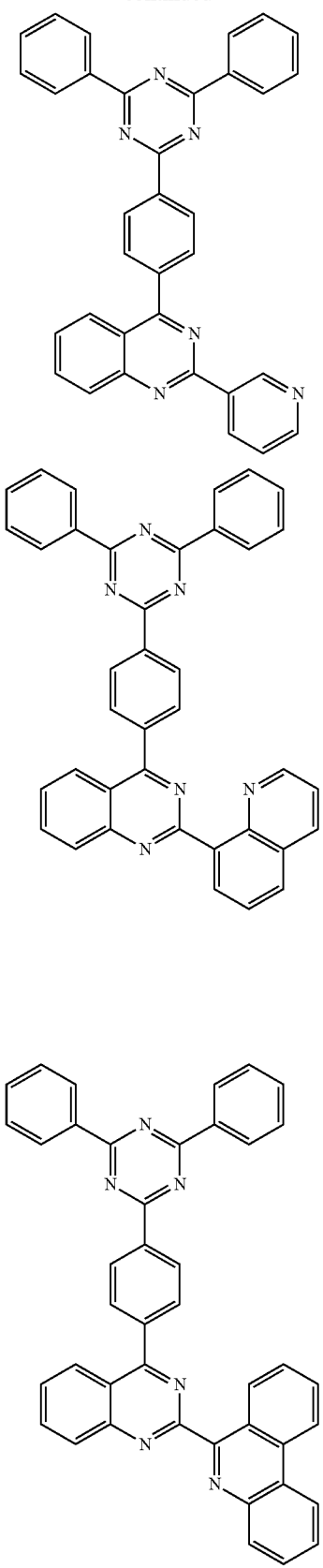
32
-continued
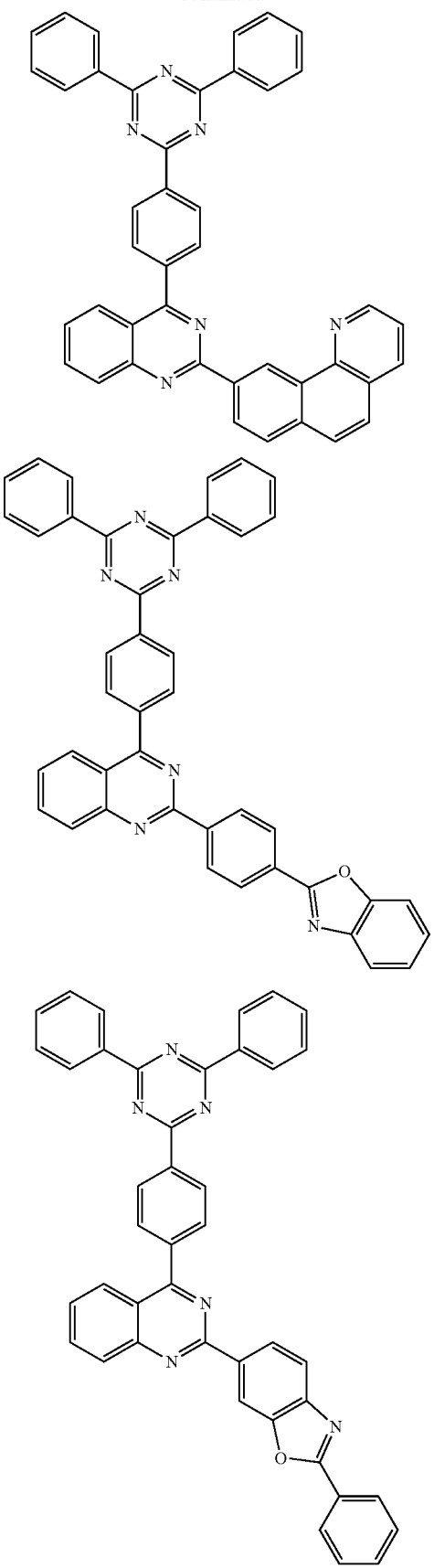

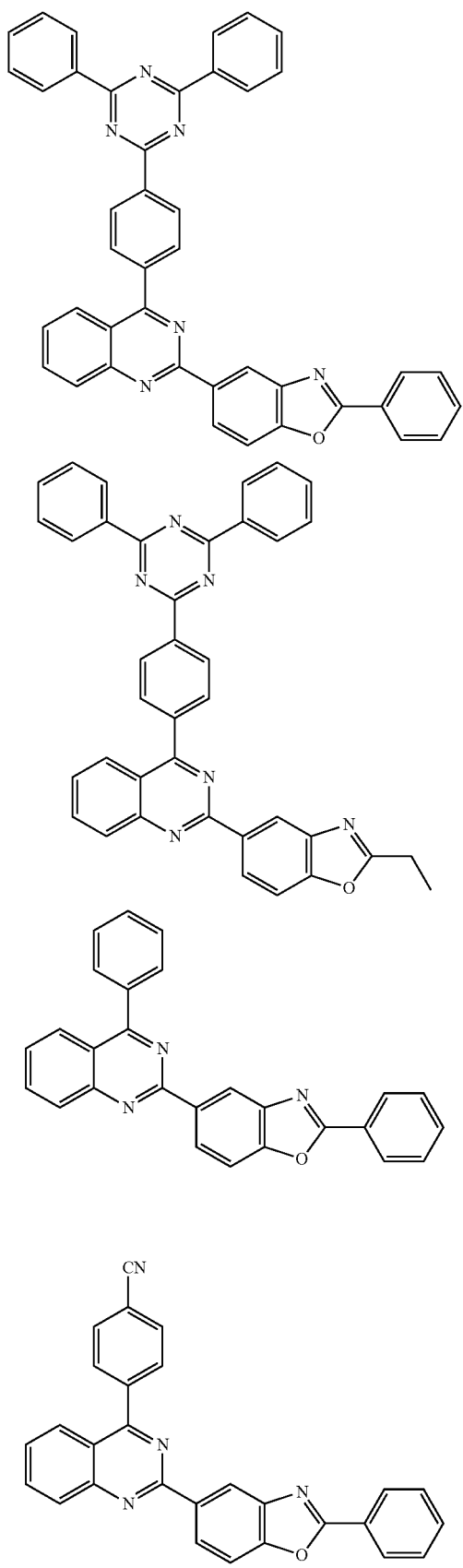
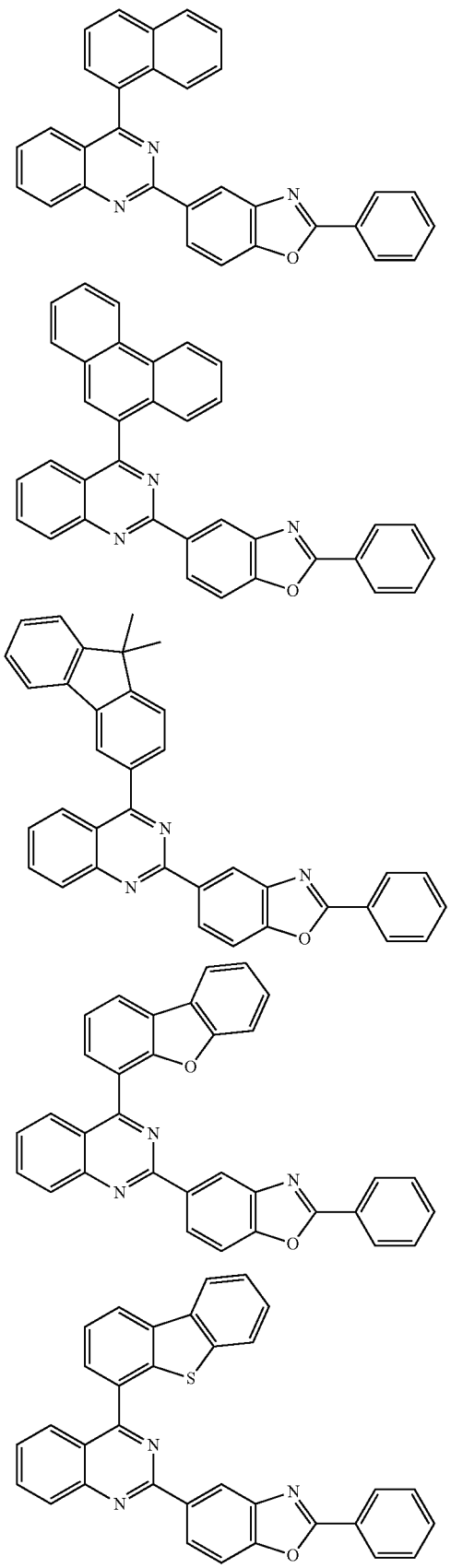

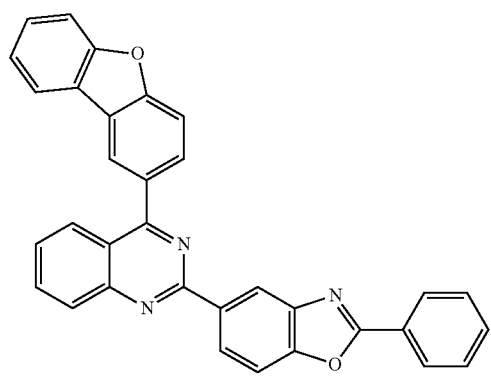
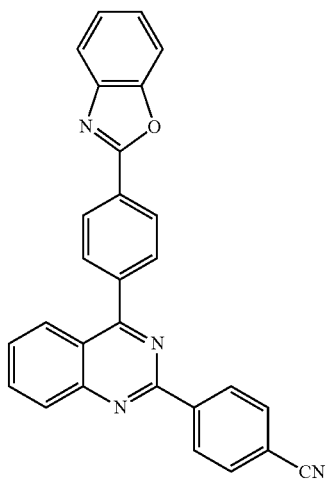
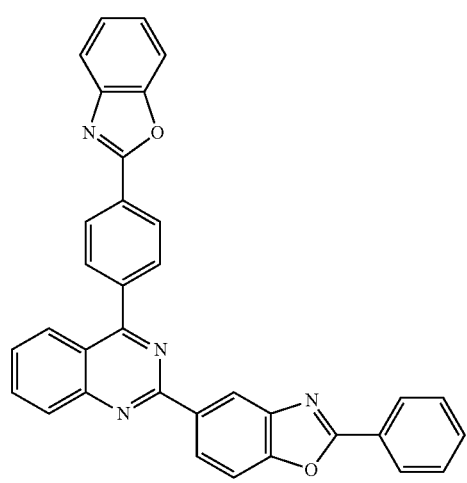
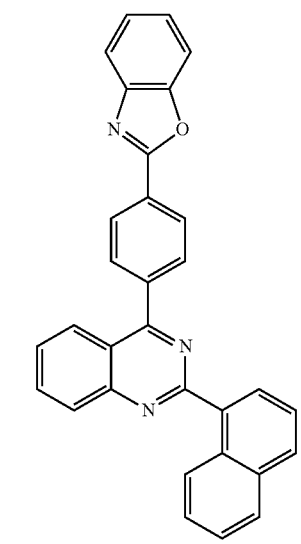
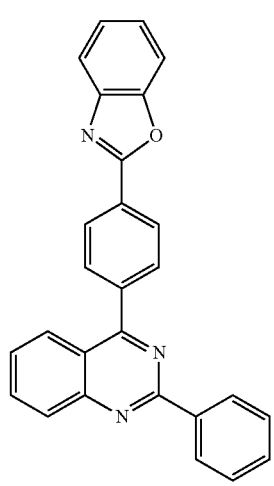
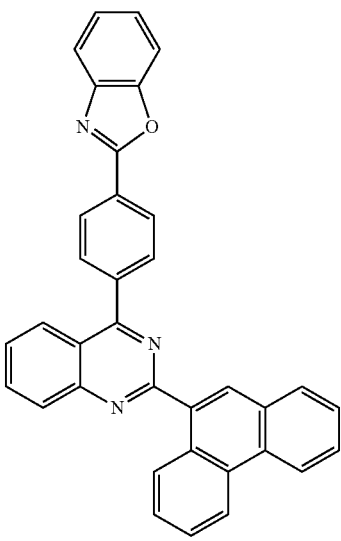

-continued
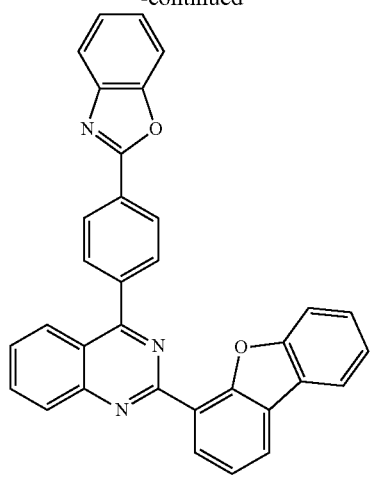
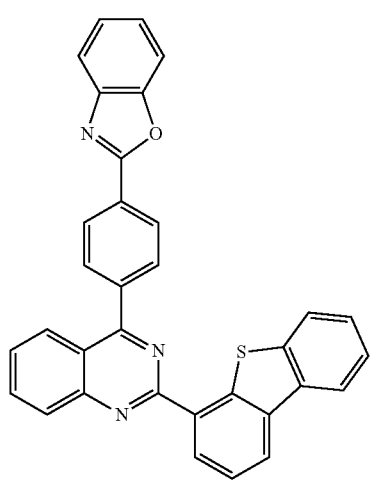
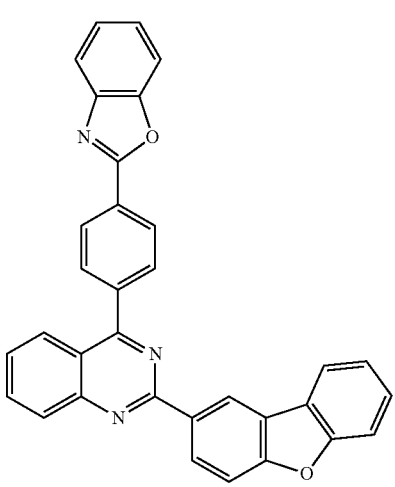
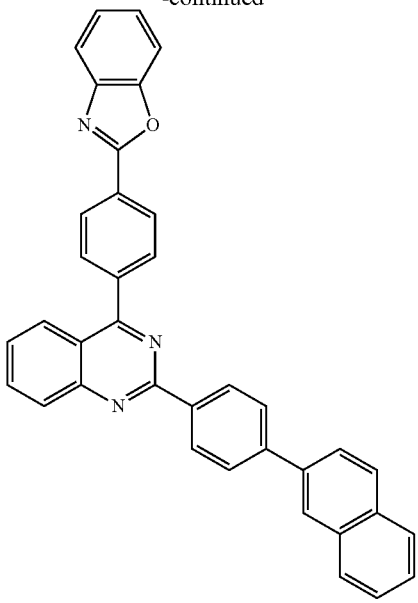
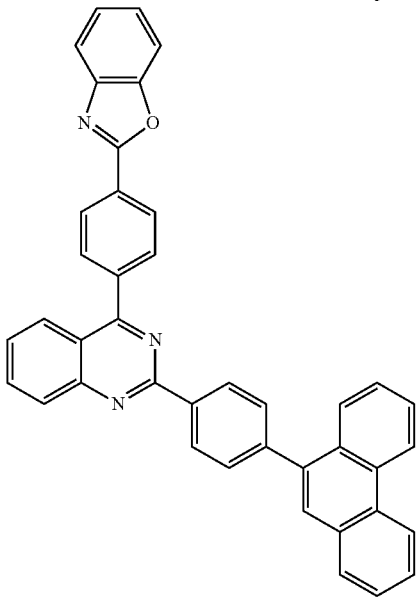
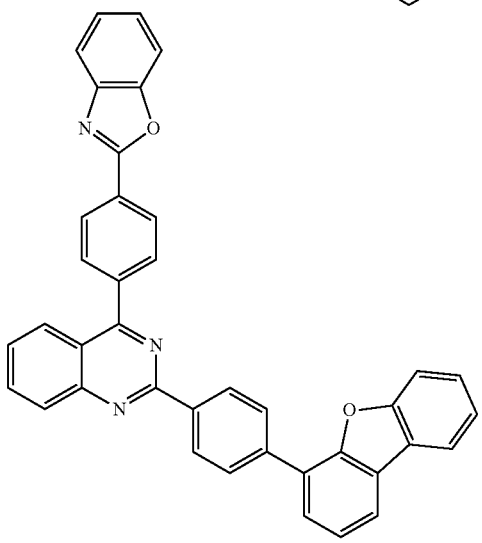

-continued
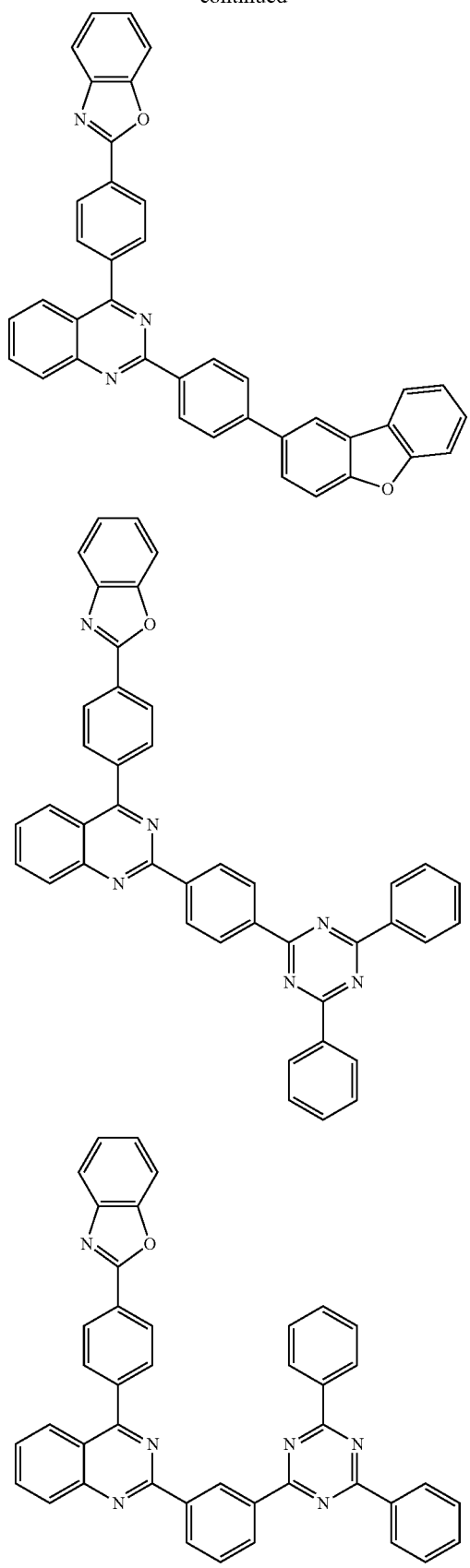
-continued
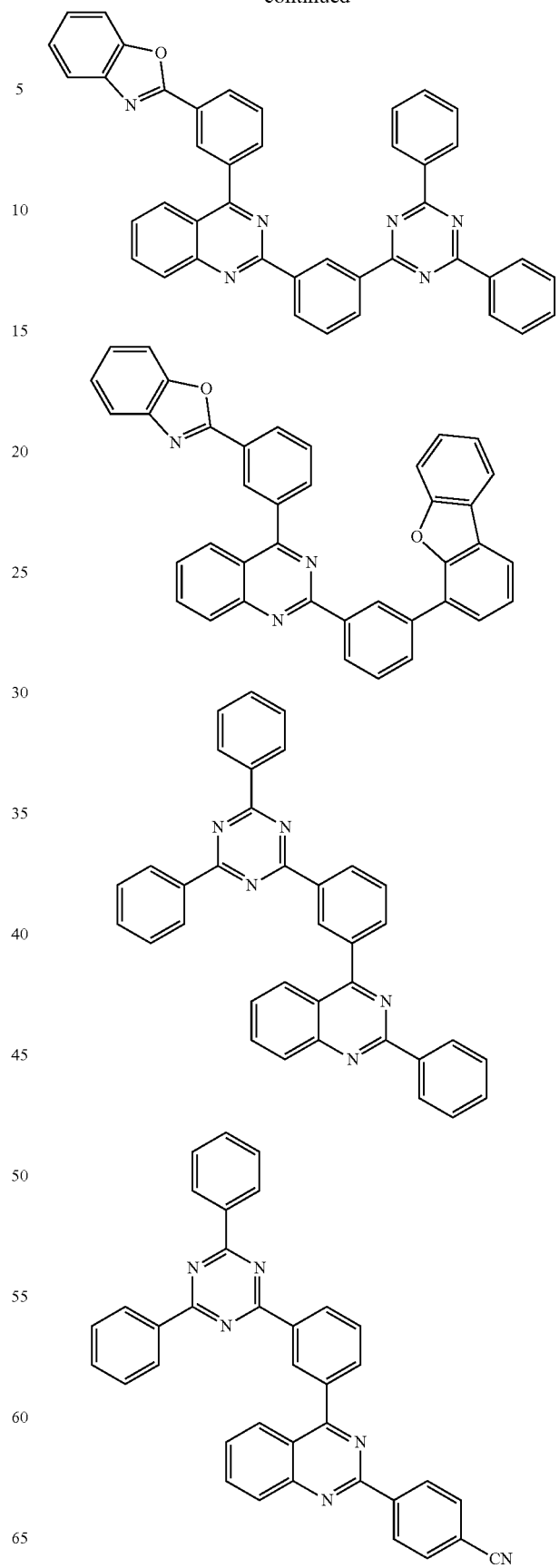

41
-continued
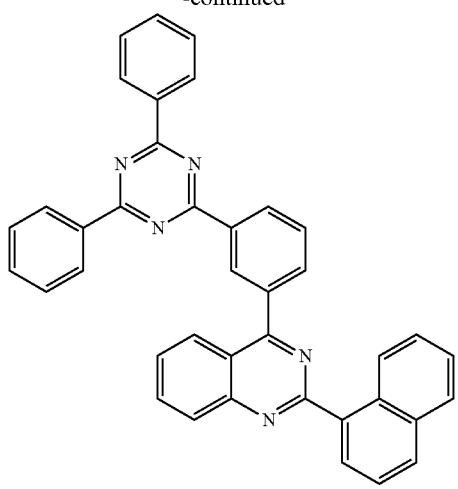
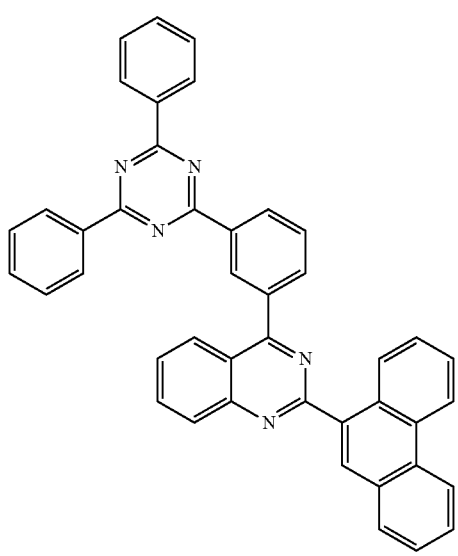
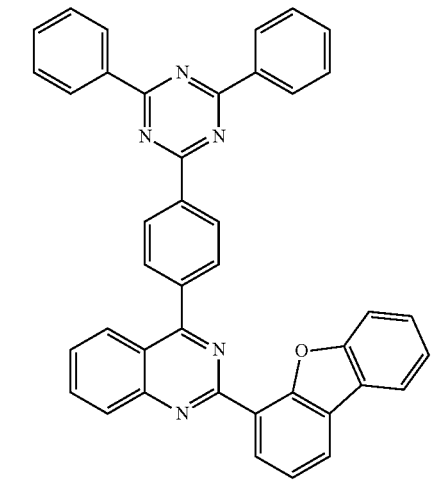
42
-continued
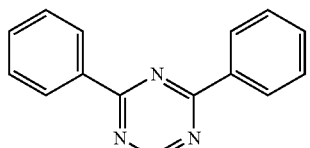
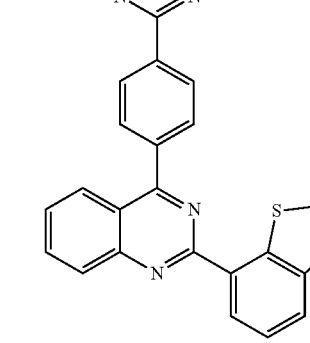
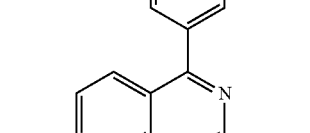

43
-continued
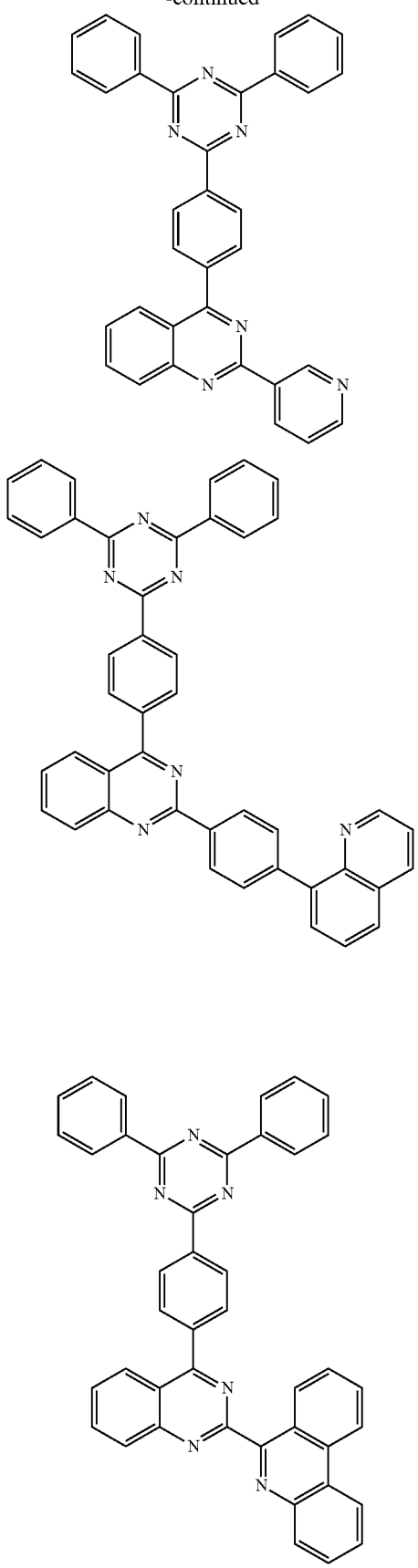
44
-continued
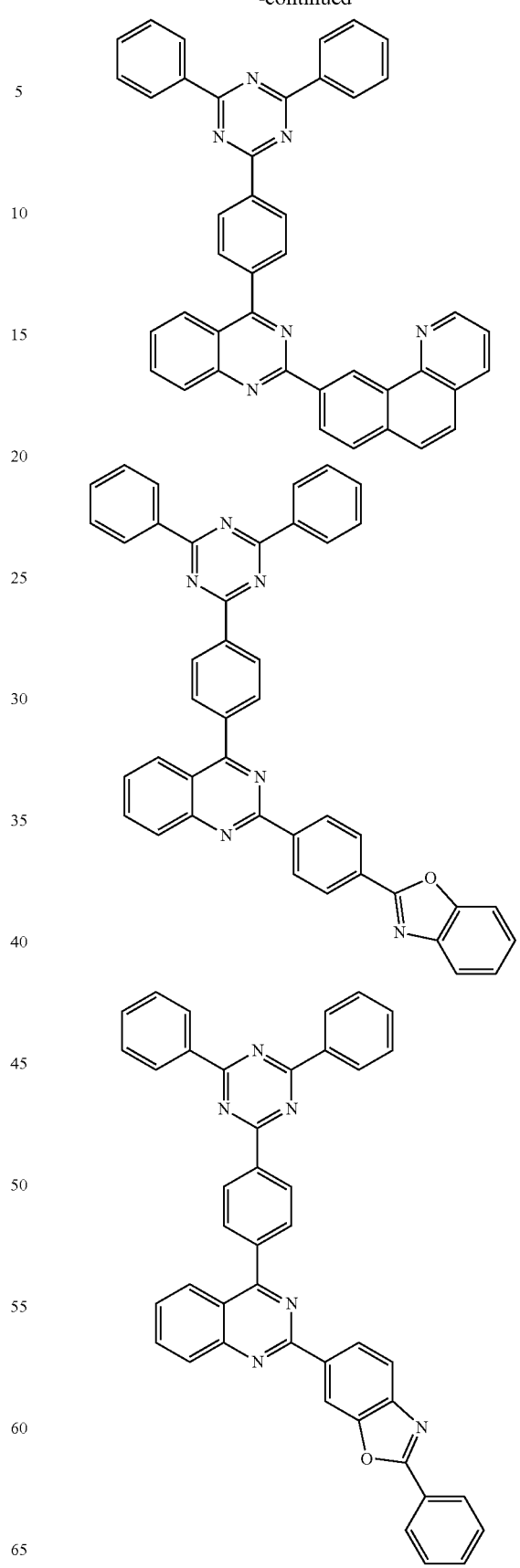

-continued
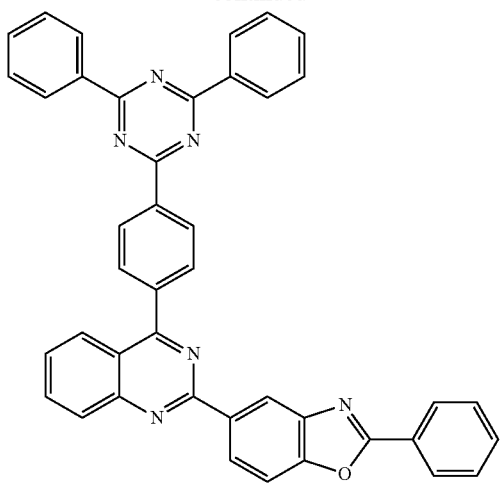
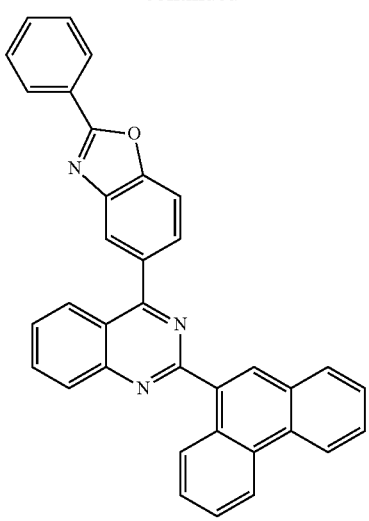
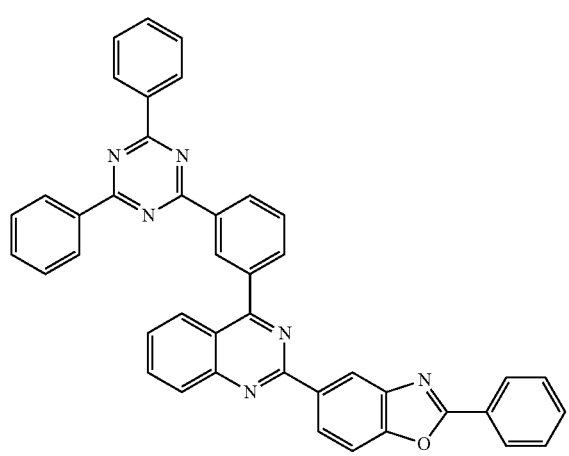
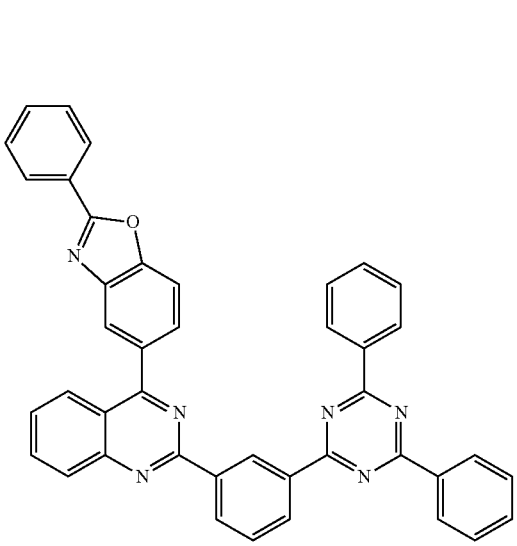

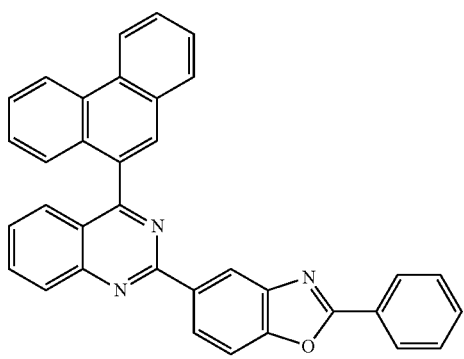
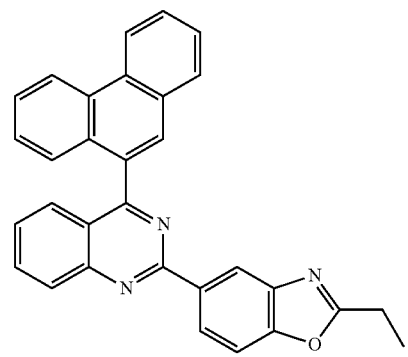
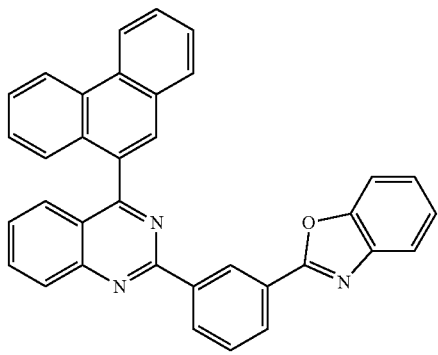
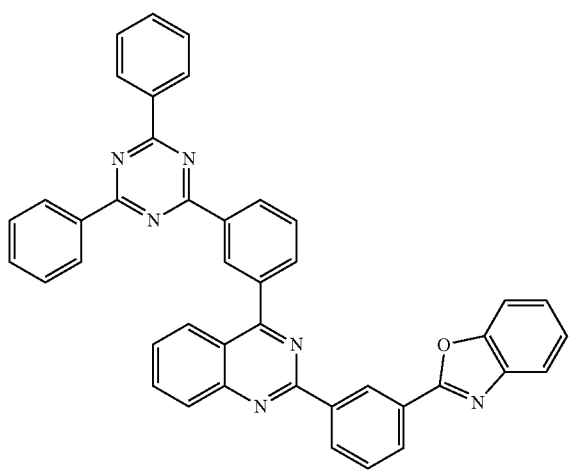
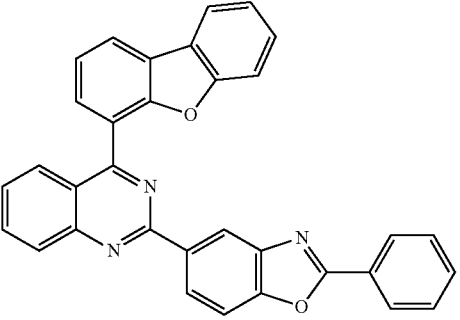
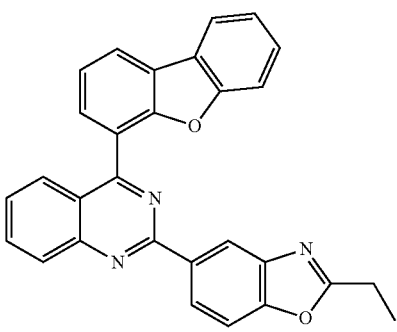
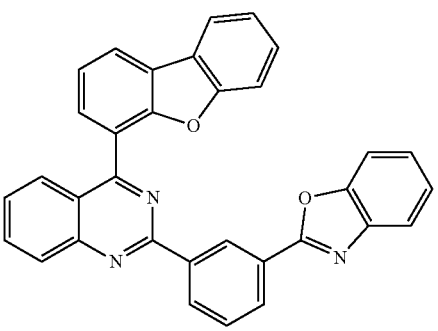 [SMILES: c1cc(-c2nc(-c3cccc4c3oc3ccccc34)c3ccccc3n2)cc(-c2nc3ccccc3o2)c1]
In Chemical Formula 1-2, $Y_1$ and $Y_2$ are phenylene groups, and at least one of $Ar_1$ and $Ar_2$ may be selected from the functional group represented by the following Chemical Formulas.
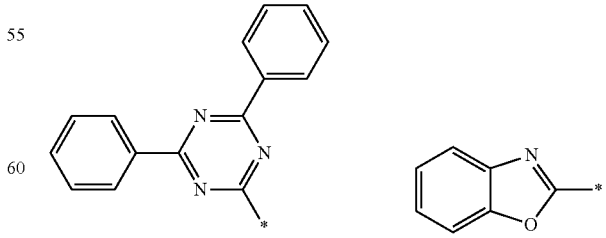
In this case, the organic compound may be selected from the group represented by the following Chemical Formula G but may not be limited thereto.

[Chemical Formula G]

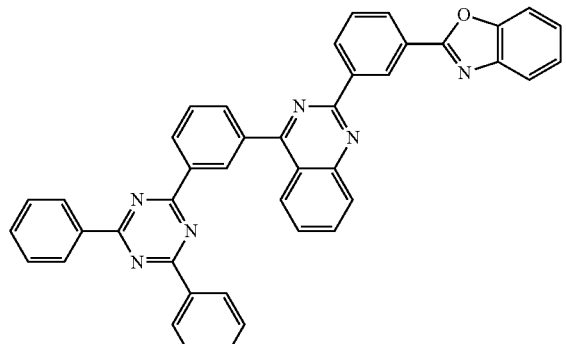

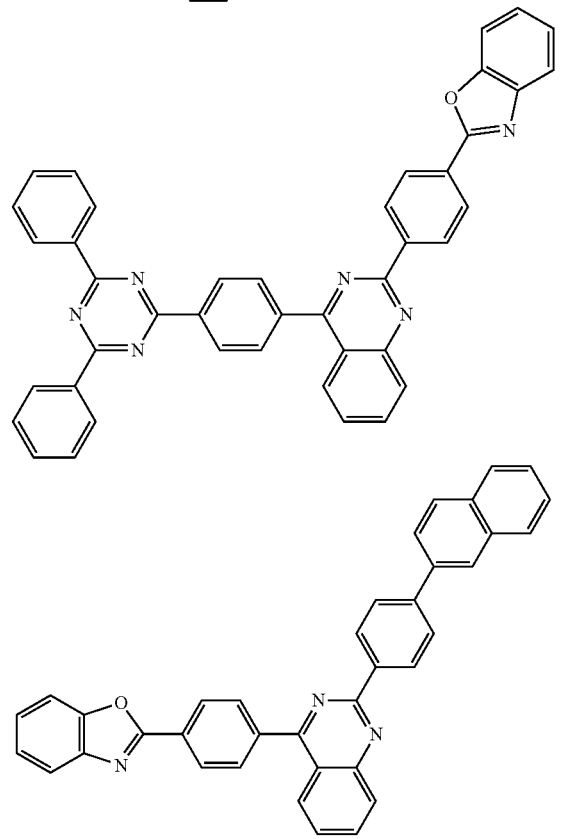

[Chemical Formula H]

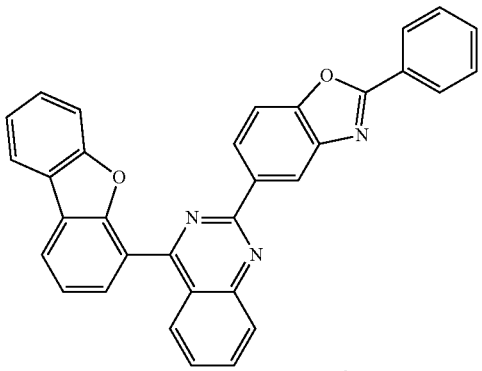

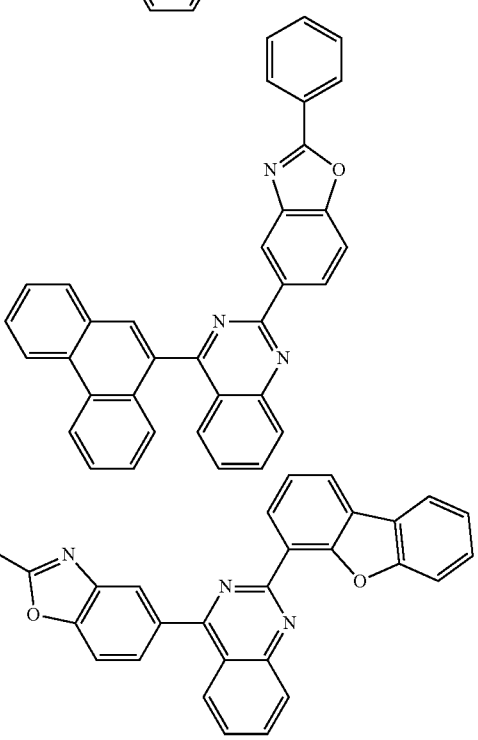

For another example, in Chemical Formula 1-2, $Y_1$ and $Y_2$ are single bonds, and at least one of $Ar_1$ and $Ar_2$ may be a functional group represented by the following Chemical Formula.

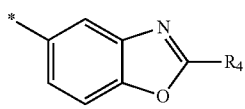

In the above Chemical Formula, $R_4$ may be a phenyl group and the organic compound may be selected from the group represented by the following Chemical Formula H but may not be limited thereto.

The organic compound represented by Chemical Formula 1 contains numerous nitrogen atoms having sp²-hybridized orbitals and thus may accelerate the movement of electrons. Therefore, the organic compound represented by Chemical Formula 1 may be used in an organic layer required to have electron transport properties in various organic electronic devices. For example, the organic compound represented by Chemical Formula 1 may be used in an organic layer disposed between an anode and a cathode of an organic light emitting display device. For example, the organic compound represented by Chemical Formula 1 may be used in an electron transport layer among organic layers. In this case, the electron moving speed may be improved, and, thus, electrons injected from the cathode may be smoothly transferred to an organic light emitting layer. Therefore, the recombination efficiency of holes and electrons in the organic light emitting layer may be improved and the driving power may be lowered.

The organic compound represented by Chemical Formula 1 may have a band gap of 3.6 eV to 4.1 eV. In this case, if the organic compound is applied to an organic light emitting element, it may improve electron transport properties without affecting light emitted from an organic light emitting layer.

The organic compound represented by Chemical Formula 1 may have an HOMO level of −6.4 eV to −5.7 eV and an LUMO level of −2.4 eV to −1.8 eV. Therefore, an electron injection barrier is lowered and electrons and holes may be injected in balance into the organic light emitting layer. As a result, the luminous efficiency of the organic light emitting display device may be improved and the driving voltage may be lowered.

Further, the organic compound represented by Chemical Formula 1 has excellent heat resistance. Therefore, it may be used in various organic electronic devices to improve the lifetime and durability of the devices.

Hereinafter, an organic light emitting display device according to an exemplary embodiment of the present disclosure will be described with reference to the accompanying drawings.

Figure 2:
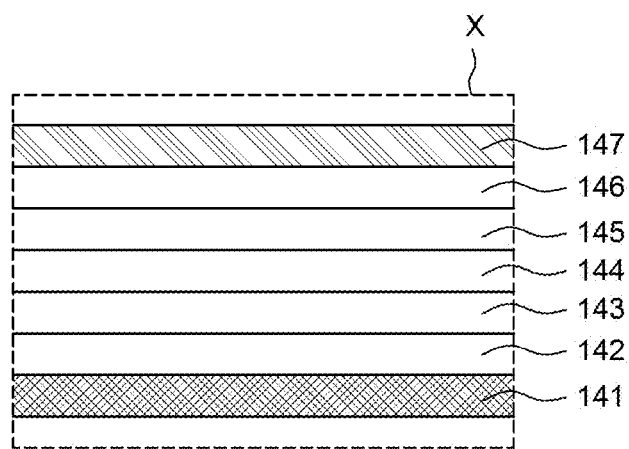
FIG. 2 is an enlarged view of a portion "X" in FIG. 1.

FIG. 1 is a schematic cross-sectional view of an organic light emitting display device according to an exemplary embodiment of the present disclosure, and FIG. 2 is an enlarged view of a portion "X" in FIG. 1.

Referring to FIG. 1 and FIG. 2, an organic light emitting display device 100 includes a substrate 110, a thin film transistor 120 and an organic light emitting element 140. The organic light emitting element 140 includes a red organic light emitting element 140R formed in a red sub-pixel R, a green organic light emitting element 140G formed in a green sub-pixel G and a blue organic light emitting element 140B formed in a blue sub-pixel B. Each of the organic light emitting elements 140R, 140G and 140B includes an anode 141, an organic layer and a cathode 147.

The organic light emitting display device 100 may be divided into an active area and a non-active area. In the active area, a plurality of pixels is disposed to display images. In the active area, pixels each including an emission area for displaying images and driving circuits for driving the pixels may be disposed. The non-active area surrounds the active area. The non-active area refers to an area where images are not substantially displayed and various lines and a printed circuit board 110 for driving the pixels and driving circuits disposed in the active area are disposed.

The plurality of pixels may be disposed in a matrix form, and each of the plurality of pixels includes a plurality of sub-pixels. Each sub-pixel is an element for displaying a single color and includes an emission area from which light is emitted and a non-emission area from which light is not emitted. Each of the plurality of sub-pixels may be any one of a red sub-pixel R, a green sub-pixel G, a blue sub-pixel B and a white sub-pixel.

FIG. 1 illustrates only a red sub-pixel R, a green sub-pixel G and a blue sub-pixel B among the plurality of sub-pixels for convenience in explanation, but the present disclosure is not limited thereto. Also, FIG. 1 illustrates that the organic light emitting display device 100 according to an exemplary embodiment of the present disclosure is driven in a top emission type. However, the present disclosure is not limited to the top emission type.

Hereinafter, the elements of the organic light emitting display device 100 according to an exemplary embodiment of the present disclosure will be described in detail with reference to FIG. 1 and FIG. 2.

The substrate 110 is configured to support various elements of the organic light emitting display device 100 and may be formed of an insulating material. For example, the substrate 110 may be a glass substrate or a plastic substrate. For example, the plastic substrate 110 may be made of one selected from polyimide, polyether sulfone, polyethylene terephthalate and polycarbonate, but may not be limited thereto.

A buffer layer 131 for protecting various elements of the organic light emitting display device 100 against the permeation of oxygen or moisture from the outside is disposed on the substrate 110. Although FIG. 1 illustrates the buffer layer 131 as a single layer, the buffer layer 131 may be selectively formed as a multilayer when necessary.

The thin film transistor 120 including a gate electrode 121, an active layer 122, a source electrode 123 and a drain electrode 124 is disposed on the buffer layer 131. Specifically, the active layer 122 is disposed on the substrate 110 and a gate insulating layer 132 for insulating the active layer 122 and the gate electrode 121 is disposed on the active layer 122. Also, an interlayer insulating layer 133 for insulating the gate electrode 121 from the source electrode 123 and the drain electrode 124 is disposed on the buffer layer 131. The source electrode 123 and the drain electrode 124 each in contact with the active layer 122 are formed on the interlayer insulating layer 133.

The thin film transistor 120 is formed in each of the red sub-pixel R, the green sub-pixel G and the blue sub-pixel B regions. FIG. 1 illustrates only a driving thin film transistor 120 among various thin film transistors 120 which may be included in the organic light emitting display device 100 for convenience in explanation. Also, FIG. 1 illustrates that the thin film transistor 120 has a coplanar structure but may not be limited thereto. The thin film transistor 120 may have an inverted-staggered structure.

An overcoating layer 134 may be disposed on the thin film transistor 120. The overcoating layer 134 planarizes an upper part of the substrate 110. The overcoating layer 134 may include a contact hole for electrically connecting the thin film transistor 120 with the anode 141 of the organic light emitting element.

The organic light emitting element 140 is disposed on the overcoating layer 134. The organic light emitting element 140 includes the red organic light emitting element 140R disposed in the red sub-pixel R, the green organic light emitting element 140G disposed in the green sub-pixel G and the blue organic light emitting element 140B disposed in the blue sub-pixel B. Each of the organic light emitting elements 140R, 140G and 140B includes the anode 141, the organic layer and the cathode 147. The organic layer is formed of the organic compound represented by Chemical Formula 1. The organic layer includes a hole injection layer 142, a hole transport layer 143, an organic light emitting layer 144, an electron transport layer 145 and an electron injection layer 146 but may not be limited thereto. For example, the organic compound represented by Chemical Formula 1 may be contained in the electron transport layer 145 among the organic layers but may not be limited thereto.

The anode 141 is disposed on the overcoating layer 134. The anode 141 is formed of a conductive material having a high work function for supplying holes to the organic light emitting layer 144. The anode 141 may be a transparent conductive layer formed of transparent conductive oxide (TCO). For example, the anode 141 may be formed of one or more transparent conductive oxides selected from indium-tin-oxide (ITO), indium-zinc-oxide (IZO), indium-tin-zinc oxide (ITZO), tin oxide ($SnO_2$), zinc oxide (ZnO), indium-copper-oxide (ICO) and aluminum:zinc oxide (Al:ZnO (AZO)), but may not be limited thereto.

The anode 141 may be separately formed for each of the red sub-pixel R, the green sub-pixel G and the blue sub-pixel B regions. A bank 135 is disposed on the anode 141 and the overcoating layer 134 to divide the adjacent sub-pixel regions. Also, the bank 135 may divide pixel regions each including a plurality of sub-pixel regions. The bank 135 may be formed of an insulating material for insulating the anodes 141 disposed in the adjacent sub-pixels, respectively. Further, the bank 135 may be formed as a black bank 135 having high light absorbance to suppress color mixing between the adjacent sub-pixels.

In the organic light emitting display device 100 driven in the top emission type, if the anode 141 is formed as a transparent conductive layer, a reflective layer may be formed under the anode 141. The reflective layer may be formed as a conductive layer having excellent reflectivity. Thus, the reflective layer may reflect light emitted from the organic light emitting layer 144 of the organic light emitting element 140 to an upper part of the organic light emitting display device 100. For example, the reflective layer may be formed of aluminum-palladium-copper alloy. The reflective layer may be electrically connected with the source electrode 123 of the thin film transistor 120 through the contact hole in the overcoating layer 134.

The hole injection layer 142 for injecting holes supplied from the anode 141 to the organic light emitting layer 144 is disposed on the anode 141. The hole injection layer 142 is formed of a material for improving the interface characteristics between the anode 141 and the hole transport layer 143 and enabling holes to be smoothly injected to the organic light emitting layer 144.

For example, the hole injection layer 142 may be formed of one or more compounds selected from the group consisting of HAT-CN(dipyrazino[2,3-f:2',3'-h]quinoxaline-2,3,6,7,10.11-hexacarbonitrile), CuPc(Copper phthalocyanine), PEDOT:PSS, NPD(N,N'-bis(naphthalene-1-yl)-N,N'-bis(phenyl)-2,2'-dimethylbenzidine), and the like, but may not be limited thereto. For another example, the hole injection layer 142 may be formed of radialene compounds each having at least one cyano group (CN) and fluoro group (F). For example, the radialene compounds may include one or more members selected from (2E,2'E,2"E)-2,2',2"-(cyclopropane-1,2,3-triylidene)tris(2-(perfluorophenyl)-acetonitrile), (2E,2'E,2"E)-2,2',2"-(cyclopropane-1,2,3-triylidene)tris(2-(perfluoropyridine-4-yl)-acetonitrile), (2E,2'E,2"E)-2,2',2"-(cyclopropane-1,2,3-triylidene)tris(2-(4-cyanoperfluorophenyl)-acetonitrile), (2E,2'E,2"E)-2,2',2"-(cyclopropane-1,2,3-triylidene)tris(2-(2,3,5,6-tetrafluoro-4-(trifluoromethyl)phenyl)-acetonitrile), and (2E,2'E,2"E)-2,2',2"-(cyclopropane-1,2,3-triylidene)tris(2-(2,6-dichloro-3,5-difluoro-4-(trifluoromethyl)phenyl)-acetonitrile), but may not be limited thereto.

The hole transport layer 143 for smoothly transferring holes from the hole injection layer 142 to the organic light emitting layer 144 is disposed on the hole injection layer 142.

For example, the hole transport layer 143 may be selected from the group consisting of N,N'-diphenyl-N,N'-bis(3-methylphenyl)-1,1'-biphenyl-4,4'-diamine (TPD), NPD, MTDATA, 1,3-bis(N-carbazolyl)benzene (mCP), CuPC, TCTA, tris(trifluorovinyl ether)-tris(4-carbazolyl-9-yl-phenyl)amine (TFV-TCTA), tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, tri-p-tolylamine, N-[1,1'-biphenyl]-4-yl-9,9-dimethyl-N-[4-(9-phenyl-9H-carbazol-3-yl)phenyl]-amine, 4,4'-bis(N-carbazolyl)-1,1'-biphenyl (CBP) and 1,1-bis(4-(N,N'-di(p-tolyl)amino)phenyl)cyclohexane (TAPC), but may not be limited thereto.

The organic light emitting layer 144 is disposed on the hole transport layer 143. The organic light emitting layer 144 emits light by recombining electrons and holes therein. For example, the organic light emitting layer 144 of the blue organic light emitting element 140B emits blue light by recombining electrons and holes therein. The organic light emitting layer 144 is formed of a host and a dopant. The host of the organic light emitting layer 144 serves to transmit energy to the dopant in order to improve the luminous efficiency and color purity. The dopant is a dye organic material which is added in a small amount to the host. The wavelength of light to be emitted may be controlled by changing the kind of dopant.

For example, a host material may be selected from the group consisting of anthracene compounds, indolocarbazole compounds, dibenzothiophene compounds, and the like, but may not be limited thereto. Two or more kinds of host materials may be mixed and used for further improving the luminous efficiency.

For example, a dopant of the organic light emitting layer 144 for emitting blue light may be selected from (4,6-F$_2$ppy)$_2$Irpic, 1,6-bis(diphenylamine) pyrene, TBPe (tetrakis(t-butyl)perylene), m-FIrpic, N-FIrpic, FIrpic, spiro-DPVBi, spiro-6P, distyrylbenzene (DSB), distyrylarylene (DSA), PFO polymers and PPV polymers, but may not be limited thereto. For example, a dopant of the organic light emitting layer 144 for emitting red light may be selected from PIQIr(acac) (bis(1-phenylisoquinoline)acetylacetonate iridium), PQIr(acac) (bis(1-phenylquinoline)acetylacetonate iridium), PQIr(tris(1-phenylquinoline)iridium) and PtOEP (octaethylporphyrin platinum), but may not be limited thereto. For example, a dopant of the organic light emitting layer 144 for emitting green light may be Ir(ppy)$_3$(tris(2-phenylpyridine)iridium(III) (FIrppy), but may not be limited thereto.

The electron transport layer 145 containing the organic compound represented by Chemical Formula 1 is disposed on the organic light emitting layer 144. The electron transport layer 145 accelerates the transport of electrons to the organic light emitting layer 144. The electron transport layer 145 enables electrons supplied from the cathode 147 to be readily transferred to the organic light emitting layer 144. The electron transport layer 145 contains the organic compound represented by Chemical Formula 1 and thus exhibits excellent electron transport properties and high durability. Therefore, the organic light emitting display device 100 may have improved luminous efficiency and lifetime and may be driven at a low voltage.

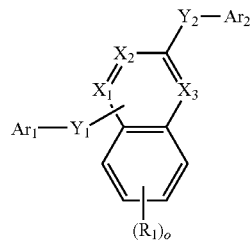

In Chemical Formula 1, $X_1$, $X_2$, $X_3$, $Y_1$, $Y_2$, $Ar_1$, $Ar_2$, $R_1$ and o are identical to those defined above. The other features of the organic compound represented by Chemical Formula 1 are the same as described above, and, thus, redundant explanation thereof will be omitted.

The organic compound represented by Chemical Formula 1 accelerates the movement of electrons. Therefore, the recombination efficiency of electrons and holes in the organic light emitting layer 144 increases, and, thus, the luminous efficiency of the organic light emitting display device 100 may be improved. The organic compound represented by Chemical Formula 1 has excellent stability. Therefore, the lifetime of the organic light emitting display device 100 may be improved.

If necessary, the electron transport layer 145 may further selectively contain a compound selected from Liq(8-hydroxyquinolinolato-lithium), PBD(2-(4-biphenyl)-5-(4-tert-butylphenyl)-1,3,4-oxadiazole), TAZ(3-(4-biphenyl)4-phenyl-5-tert-butylphenyl-1,2,4-triazole), spiro-PBD, BCP(2,9-Dimethyl-4,7-diphenyl-1,10-phenanthroline) and BAlq(bis (2-methyl-8-quinolinolate)-4-(phenylphenolato) aluminium), but may not be limited thereto.

A hole blocking layer may be disposed between the organic light emitting layer 144 and the electron transport layer 145. The hole blocking layer blocks the leakage of holes from the organic light emitting layer 144 to the electron transport layer 145, resulting in excellent recombination efficiency of holes and electrons in the organic light emitting layer 144. As such, an electron blocking layer may be disposed on one surface of the organic light emitting layer 144 and a hole blocking layer may be disposed on the other surface. In this case, holes injected from the anode 141 and electrons injected from the cathode 147 are trapped in the organic light emitting layer 144. Therefore, the recombination efficiency of electrons and holes may be further improved.

The electron injection layer 146 is disposed on the electron transport layer 145. The electron injection layer 146 enables electrons supplied from the cathode 147 to be smoothly injected into the electron transport layer 145. For example, the electron injection layer 146 may be formed to contain one or more of $BaF_2$, LiF, CsF, NaF, $Li_2O$, BaO, Liq (lithium quinolate) and lithium benzoate, but may not be limited thereto.

The cathode 147 is disposed on the electron injection layer 146. The cathode 147 may be formed of a metal material having a low work function for supplying electrons to the organic light emitting layer 144. For example, the cathode 147 may be formed of a metal material selected from Ca, Ba, Al, Ag and alloys containing one or more thereof, but may not be limited thereto.

Referring to FIG. 1, the cathode 147 is not patterned and formed as a single layer on the anode 141. That is, the cathode 147 is formed as a single layer in the red sub-pixel R, the green sub-pixel G and the blue sub-pixel B regions. If the organic light emitting display device 100 is driven in the top emission type, the cathode 147 may be formed to a very small thickness and thus may be substantially transparent.

An encapsulation layer is formed on the cathode 147 to suppress the permeation of moisture or oxygen from the outside into the organic light emitting element. Also, the encapsulation layer planarizes an upper surface of the organic light emitting element. For example, the encapsulation layer may be formed into a thin film by laminating an inorganic layer of an inorganic insulating material and an organic layer of an organic material. For another example, the encapsulation layer may be formed by covering the organic light emitting element with the glass substrate 110 to which a getter sheet is attached and sealing them with a curable resin.

An organic light emitting display device according to an exemplary embodiment of the present disclosure includes the organic compound represented by Chemical Formula 1 as an electron transport layer. Thus, electrons supplied from a cathode may be effectively transferred to an organic light emitting layer. Also, the organic compound represented by Chemical Formula 1 has excellent stability. Thus, it is possible to improve all the luminous efficiency, luminance and lifetime of the organic light emitting display device and lower a driving voltage. Therefore, according to an exemplary embodiment of the present disclosure, it is possible to provide an organic light emitting display device which may be driven with low power and has high luminous efficiency and long lifetime.

Hereinafter, the above-described effects of the present disclosure will be described in more detail with reference to Exemplary Embodiments and Comparative Embodiments. However, the following Exemplary embodiments are provided for the purpose of illustration, but do not limit the scope of the present disclosure.

Intermediate Preparation Embodiment 1

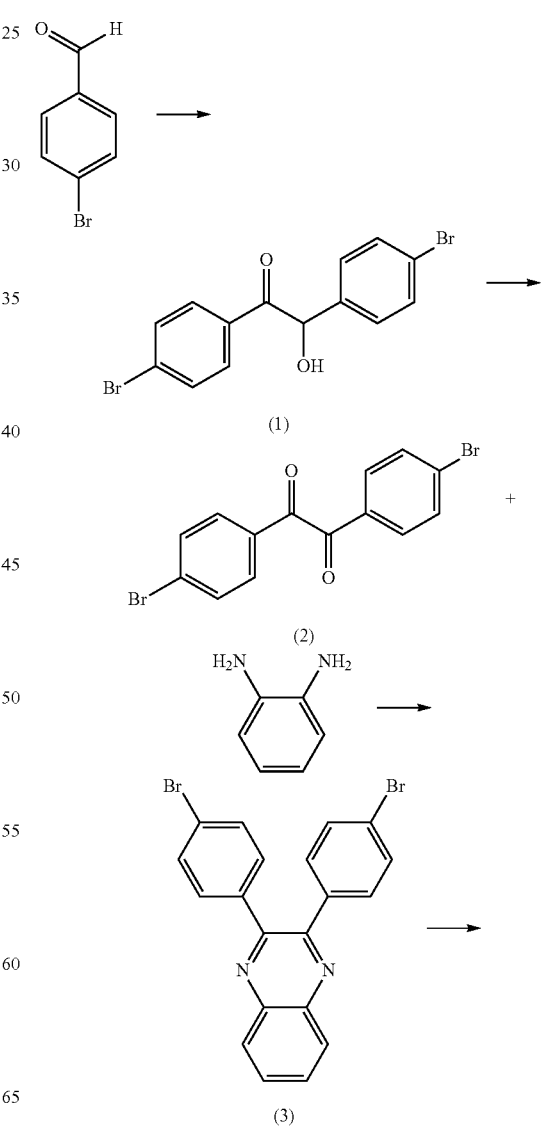

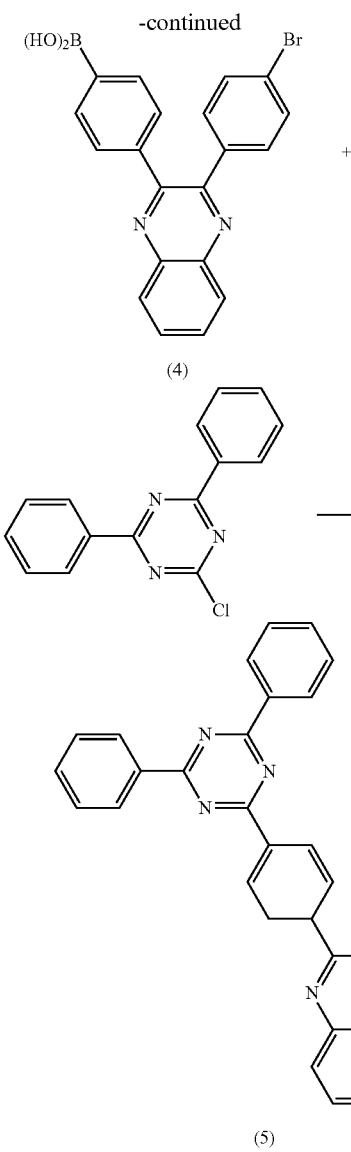

1) Synthesis of Intermediate 1

100.0 g of 4-bromobenzaldehyde (540.5 mmol), 9.1 g of thiamine hydrochloride (27.0 mmol), 22.6 ml of triethylamine (162.1 mmol), 165 ml of ethanol were put into a 1-neck round flask and reacted at room temperature for 1 day with stirring. After completion of the reaction, the solvent was volatilized and an organic layer was worked up with water and ethyl acetate. The worked-up organic layer was dried with magnesium sulfate anhydrous ($MgSO_4$) and then purified by column chromatography to obtain 68.2 g of pale yellow solid compound (intermediate 1) (yield: 68.2%).

2) Synthesis of Intermediate 2

68.1 g of the intermediate 1 (184.0 mmol), 18.4 g of $NH_4NO_3$ (230.0 mmol), 0.4 g of $Cu(CH_3COO)_2H_2O$ (1.8 mmol), 195 ml of acetic acid/water (volume ratio of 4:1) were put into a 1-neck round flask and heated and reacted under reflux for 1 day with stirring. After completion of the reaction, the reaction product was cooled to room temperature and filtered and then a solid product was washed with water. Then, 100 ml of methanol was added thereto and stirred for 30 minutes and filtered and purified to obtain 62.1 g of pale green solid compound (intermediate 2) (yield: 91.7%).

3) Synthesis of Intermediate 3

62.2 g of the intermediate 2 (169 mmol), 18.2 g of 2-aminoaniline (169 mmol), 3.2 g of p-toluene sulfonic acid (16.9 mmol), 3000 ml of methanol were put into a 1-neck round flask and reacted under reflux for 16 hours. After completion of the reaction, the reaction product was cooled to room temperature and the solvent was volatilized. Then, 300 ml of methanol was added thereto and stirred for 30 minutes and filtered to obtain 73.8 g of white solid compound (intermediate 3) (yield: 99.2%).

4) Synthesis of Intermediate 4

30 g of the intermediate 3 (68.1 mmol) and 55 ml of tetrahydrofuran were put into a 2-neck round flask and maintained at −78° C. Then, 2.58 ml of n-Butyllithium (64.6 mmol) was added slowly dropwise thereto and maintained at −78° C. for 1 hour. 87 mL of trimethyl borate (81.7 mmol) was slowly added thereto and maintained at −78° C. for 1 hour. Then, the solution was slowly increased in temperature to room temperature and then reacted for 16 hours with stirring. After 2 M HCl(aq) was added to complete the reaction, water was added and 300 ml of dichloromethane was used to work up an organic layer twice. The worked-up organic layer was dried with magnesium sulfate anhydrous ($MgSO_4$). Then, the solvent was removed through filtration and the resultant product was purified by silica gel column chromatography to obtain 21.1 g of white solid compound (intermediate 4) (yield: 76.4%).

5) Synthesis of Intermediate 5

21.1 g of the intermediate 4 (52.1 mmol), 15.3 g of 2-chloro-4,6-diphenyl-1,3,5-triazine (23.2 mmol), 1.21 g of tetrakis(triphenylphosphine)palladium [$Pd(PPh_3)_4$] (1.05 mmol), 7.29 g of potassium carbonate ($K_2CO_3$) (52.7 mmol), 100 ml of tetrahydrofuran and 50 ml of water were put into a 1-neck round flask and reacted at 80° C. for 2 hours. After completion of the reaction, the reaction product was cooled to room temperature, water was added thereto and 300 ml of chloroform ($CHCl_3$) was used to work up an organic layer twice. The worked-up organic layer was dried with magnesium sulfate anhydrous ($MgSO_4$). Then, the solvent was removed through filtration and the resultant compound was purified by silica gel column chromatography. The purified compound was recrystallized with dichloromethane/hexane to obtain 18.7 g of beige solid compound (intermediate 5) (yield: 60.9%).

Intermediate Preparation Embodiment 2

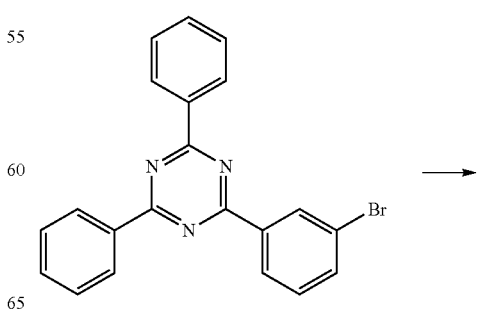

Intermediate Preparation Embodiment 3

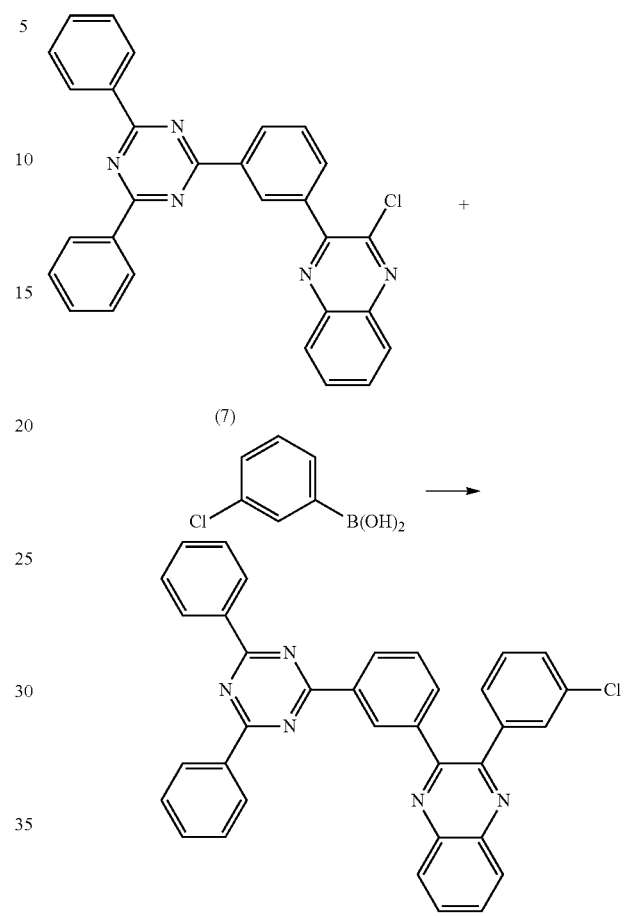

(7)

(8)

1) Synthesis of Intermediate 8

11.0 g of the intermediate 7 (23.3 mmol), 5.5 g of (3-chlorophenyl) boronic acid (34.9 mmol), 1.3 g of Pd(PPh$_3$)$_4$ (1.2 mmol), 155 ml of toluene/ethanol (volume ratio of 2:1) and 23 ml of 2 M potassium carbonate (K$_2$CO$_3$) were put into a 1-neck round flask and reacted under reflux for 12 hours. After completion of the reaction, the reaction product was cooled to room temperature and stirred for 12 hours. The produced solid was filtered and sequentially washed with toluene, distilled water and methanol. Then, the resultant product was dried to obtain 9.6 g of white solid compound (intermediate 8) (yield: 75.2%).

Intermediate Preparation Embodiment 4

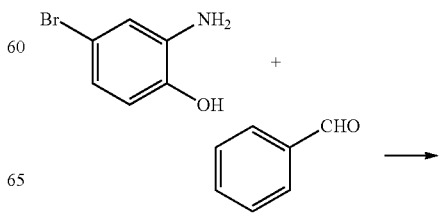

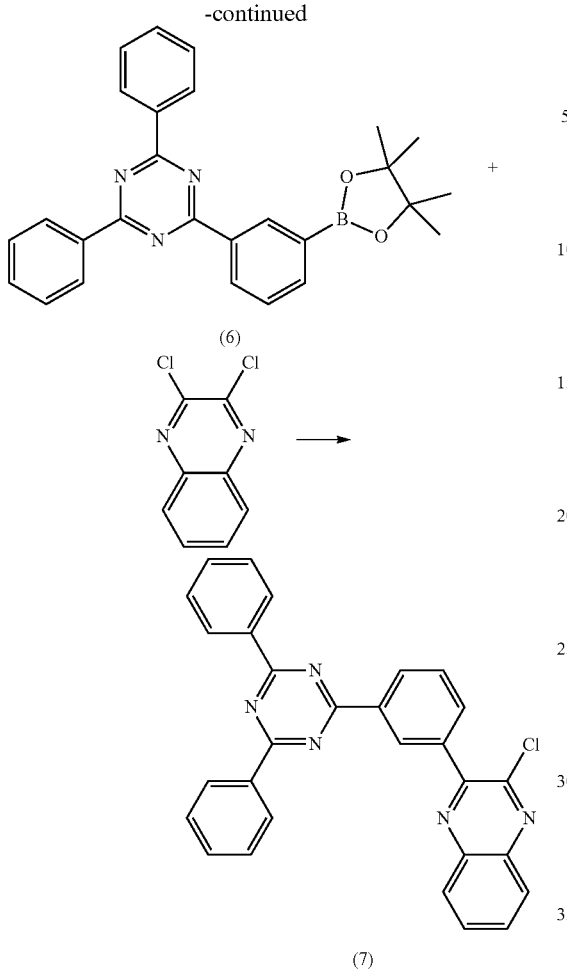

(6)

(7)

1) Synthesis of Intermediate 6

15.0 g of 2-(3-Bromophenyl)-4,6-diphenyl-1,3,5-triazine (32.4 mmol), 12.3 g of bis(pinacolato)diboron (48.6 mmol), 529 mg of Pd(dppf)Cl$_2$·CH$_2$Cl$_2$ (0.647 mmol), 9.53 g of potassium acetate (97.1 mmol) and 323 ml of dioxane were put into a 1-neck round flask and reacted under reflux at 90° C. for 12 hours. After completion of the reaction, the solvent was removed under reduced pressure. The produced solid was dissolved in dichloromethane and then filtered through a Celite filter and washed with dichloromethane. The solvent was removed under reduced pressure and the resultant compound was crystallized with methanol to obtain 16.0 g of solid compound (intermediate 6) (yield: 96.8%).

2) Synthesis of Intermediate 7

7.5 g of 2,3-dichloroquinoxaline (37.8 mmol), 12.2 g of the intermediate 6 (28.0 mmol), 1.6 g of Pd(PPh$_3$)$_4$ (1.4 mmol), 280 ml of toluene/ethanol (volume ratio of 2:1) and 28 ml of 2 M potassium carbonate (K$_2$CO$_3$) (56 mmol) were put into a 1-neck round flask and reacted under reflux. After completion of the reaction, the reaction product was cooled to room temperature and stirred for 1 hour. The produced solid was filtered and sequentially washed with toluene, distilled water and methanol. Then, the resultant product was dried to obtain 10.1 g of grey solid compound (intermediate 7) (yield: 76.5%).

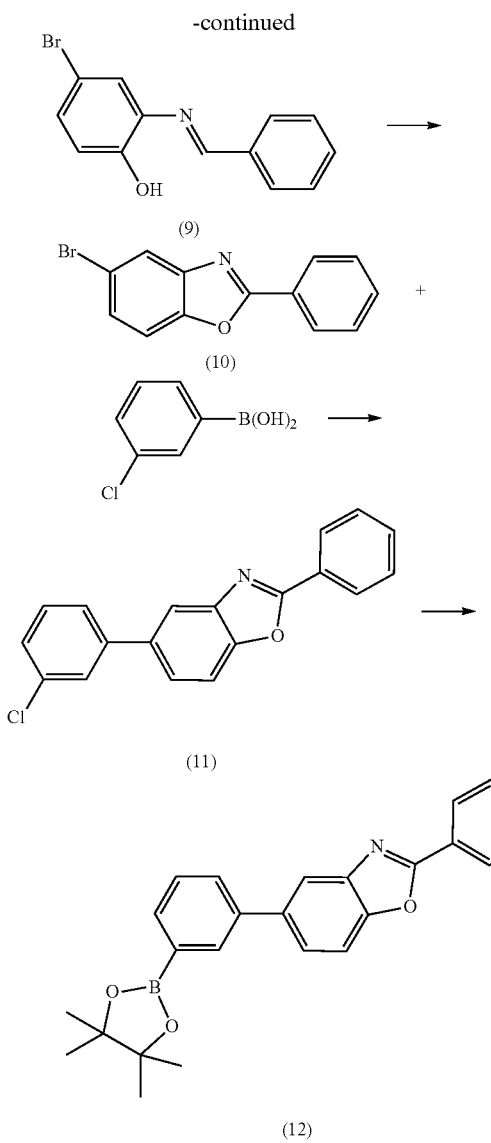

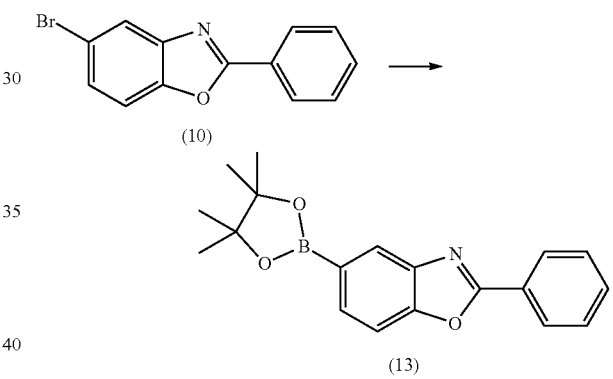

1) Synthesis of Intermediate 9

30.0 g of 2-Amino-4-bromophenol (0.16 mol), 16.2 ml of benzaldehyde (0.16 mol) and 200 ml of ethanol were put into a 1-neck round flask and reacted at room temperature for 12 hours with stirring. After completion of the reaction, the solvent was removed from the reaction product under reduced pressure to obtain an intermediate 9.

2) Synthesis of Intermediate 10

After the intermediate 9 was dissolved in 800 ml of dichloromethane, 30.6 g of 2,3-dichloro-5,6-dicyano-1,4-benzoquinone (DDQ) (0.176 mol) was slowly added thereto at room temperature and reacted at room temperature for 2 hours with stirring. After completion of the reaction, the reaction product was purified by silica gel column chromatography (dichloromethane) and solidified with methanol to obtain 41.0 g of solid compound (intermediate 10) (yield: 93.2%).

3) Synthesis of Intermediate 11

20.0 g of the intermediate 10 (73.0 mmol), 14.8 g of 3-chlorophenyl)boronic acid (94.9 mmol), 4.2 g of Pd(PPh$_3$)$_4$ (3.6 mmol), 365 ml of toluene/ethanol (volume ratio of 2:1) and 110 ml of 2 M potassium carbonate (K$_2$CO$_3$) (219 mmol) were put into a 1-neck round flask and reacted under reflux. After completion of the reaction, the reaction product was cooled to room temperature and an organic layer was worked up with distilled water and dichloromethane. The worked-up organic layer was dried with magnesium sulfate anhydrous (MgSO$_4$) and then, the solvent was removed under reduced pressure. Then, the resultant product was purified by silica gel column chromatography to obtain 21.6 g of pale pink solid compound (intermediate 11) (yield: 96.8%).

4) Synthesis of Intermediate 12

21.6 G of the intermediate 11 (70.6 mmol), 26.9 g of bis(pinacolato)diboron (106 mmol), 8.1 g of Pd(dppf)Cl$_2$·CH$_2$Cl$_2$ (14.1 mmol), 34.6 g of potassium acetate (353 mmol) and 353 ml of dioxane were put into a 1-neck round flask and reacted under reflux. After completion of the reaction, the solvent was removed under reduced pressure. The produced solid was dissolved in dichloromethane and then filtered through a Celite filter and washed with dichloromethane. Then, the solvent was removed under reduced pressure and the resultant product was crystallized with diethyl ether to obtain 21.4 g of yellow solid compound (intermediate 12) (yield: 76.4%).

Intermediate Preparation Embodiment 5

Synthesis of Intermediate 13

20.0 g of the intermediate 10 (72.96 mmol), 20.4 g of bis(pinacolato)diboron (80.26 mmol), 2.98 g of Pd(dppf)Cl$_2$·CH$_2$Cl$_2$ (3.65 mmol), 14.3 g of potassium acetate (145.92 mmol) and 730 ml of dioxane were put into a 1-neck round flask and reacted under reflux at 90° C. for 12 hours. After completion of the reaction, the resultant compound was purified by silica gel column chromatography to obtain 20.5 g of white solid compound (intermediate 13) (yield: 87.6%).

Intermediate Preparation Embodiment 6

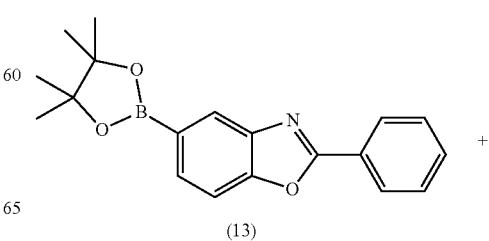

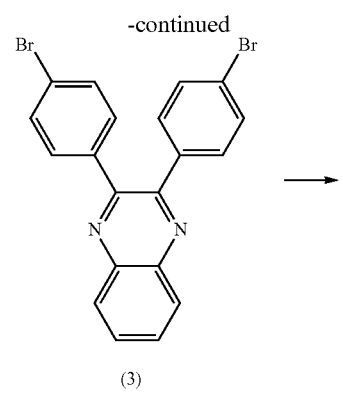

(3)

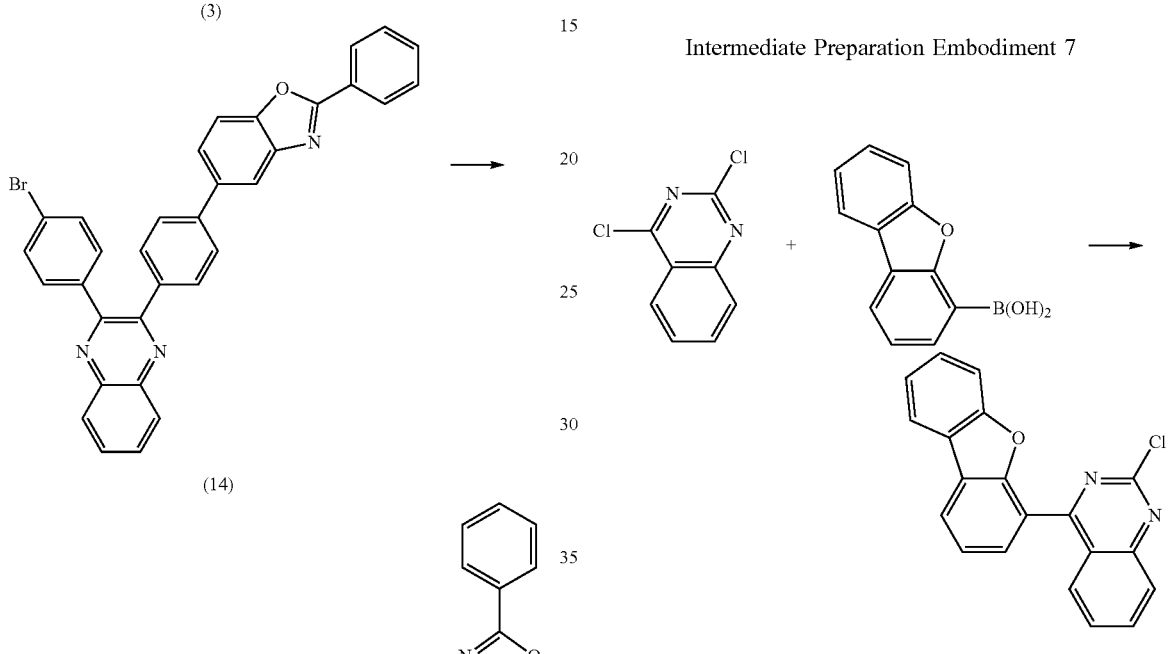

by silica gel column chromatography to obtain 3.9 g of white solid compound (intermediate 14) (yield: 17.3%).

2) Synthesis of Intermediate 15

2.5 g of the intermediate 14 (4.5 mmol), 1.7 g of bis(pinacolato)diboron (6.8 mmol), 0.2 g of Pd(dppf)Cl₂·CH₂Cl₂ (0.2 mmol), 1.3 g of potassium acetate (13.5 mmol) and 50 ml of dioxane were put into a 1-neck round flask and reacted under reflux for 2 hours. After completion of the reaction, the reaction product was cooled to room temperature and filtered through a Celite filter. A solid obtained by concentrating the filtered organic layer was purified by silica gel column chromatography to obtain 2.0 g of white solid compound (intermediate 15) (yield: 73.9%).

Intermediate Preparation Embodiment 7

Synthesis of Intermediate 16

30.0 g of dibenzo[b,d]furan-4-ylboronic acid (142 mmol), 42.2 g of 2,4-dichloroquinazoline (212 mmol), 8.2 g of Pd(PPh₃)₄ (7.1 mmol), 710 ml of toluene/ethanol (volume ratio of 2:1) and 213 ml of 2 M potassium carbonate (K₂CO₃) were put into a 1-neck round flask and reacted under reflux. After completion of the reaction, the reaction product was cooled to room temperature and stirred for 1 hour. The produced solid was filtered and sequentially washed with toluene, distilled water and methanol. Then, the resultant product was dried to obtain 33.8 g of white solid compound (intermediate 16) (yield: 73.4%).

Intermediate Preparation Embodiment 8

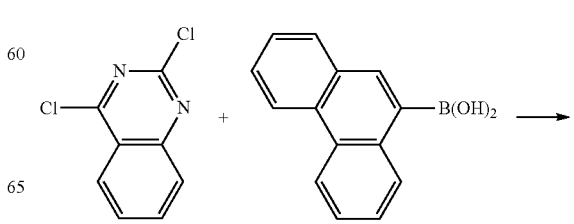

1) Synthesis of Intermediate 14

16.5 g of the intermediate 3 (40.7 mmol), 5.5 g of the intermediate 13 (17.1 mmol), 1.0 g of Pd(PPh₃)₄ (0.9 mmol), 5.9 g of potassium carbonate (K₂CO₃) (42.8 mmol), 200 ml of tetrahydrofuran and 70 ml of distilled water were put into a 1-neck round flask and reacted under reflux for 3 hours. After completion of the reaction, the reaction product was cooled to room temperature and 200 ml of ethyl acetate was added thereto to work up an organic layer. A solid obtained by concentrating the worked-up organic layer was purified

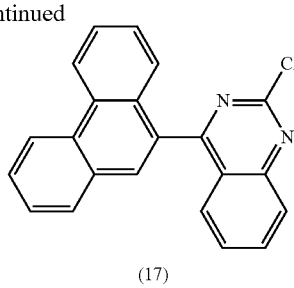

(17)

Synthesis of Intermediate 17

31.5 g of phenanthrene-9-ylboronic acid (142 mmol), 42.2 g of 2,4-dichloroquinazoline (212 mmol), 8.2 g of Pd(PPh$_3$)$_4$ (7.1 mmol), 710 ml of toluene/ethanol (volume ratio of 2:1) and 213 ml of 2 M potassium carbonate (K$_2$CO$_3$) were put into a 1-neck round flask and reacted under reflux. After completion of the reaction, the reaction product was cooled to room temperature and stirred for 1 hour. The produced solid was sequentially washed with toluene, distilled water and methanol. Then, the resultant product was dried to obtain 29.8 g of white solid compound (intermediate 17) (yield: 61.6%).

Intermediate Preparation Embodiment 9

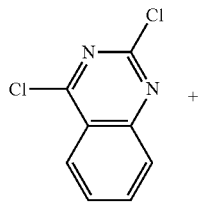

+

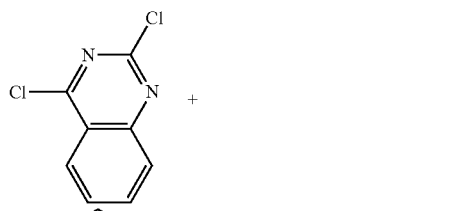

(13)

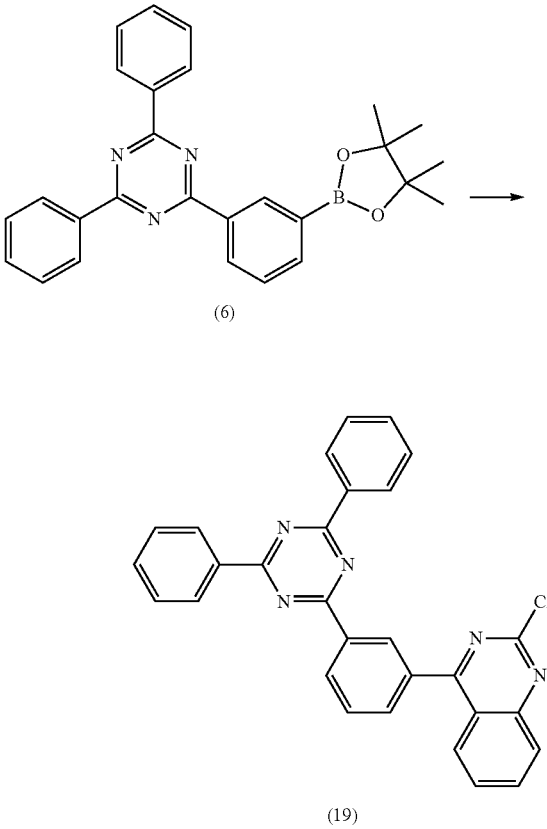

(18)

Synthesis of Intermediate 18

10.0 g of the intermediate 13 (31.1 mmol), 9.3 g of 2,4-dichloroquinazoline (46.6 mmol), 1.8 g of Pd(PPh$_3$)$_4$ (1.5 mmol), 156 ml of toluene/ethanol (volume ratio of 2:1) and 47 ml of 2 M potassium carbonate (K$_2$CO$_3$) were put into a 1-neck round flask and reacted under reflux. After completion of the reaction, the reaction product was cooled to room temperature and stirred for 1 hour. The produced solid was filtered and sequentially washed with toluene, distilled water and methanol. Then, the resultant product was dried to obtain 5.5 g of white solid compound (intermediate 18) (yield: 49.5%).

Intermediate Preparation Embodiment 10

(6)

(19)

Synthesis of Intermediate 19

13.5 g of the intermediate 6 (31.1 mmol), 9.3 g of 2,4-dichloroquinazoline (46.6 mmol), 1.8 g of Pd(PPh$_3$)$_4$ (1.5 mmol), 156 ml of toluene/ethanol (volume ratio of 2:1) and 47 ml of 2 M potassium carbonate (K$_2$CO$_3$) were put into a 1-neck round flask and reacted under reflux. After completion of the reaction, the reaction product was cooled to room temperature and stirred for 1 hour. The produced solid was filtered and sequentially washed with toluene, distilled water and methanol. Then, the resultant product was dried to obtain 5.0 g of white solid compound (intermediate 19) (yield: 34.1%).

Intermediate Preparation Embodiment 11

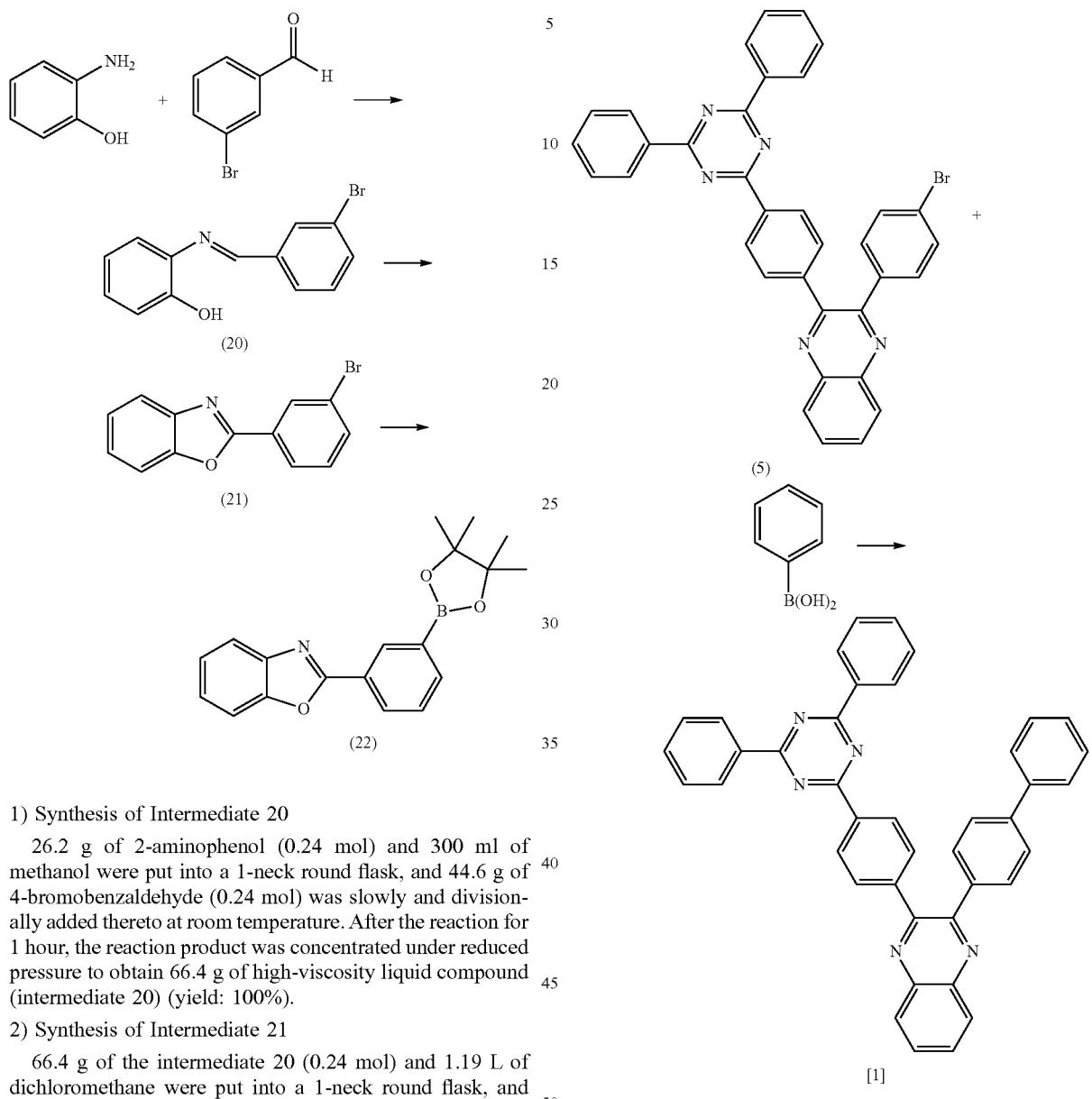

1) Synthesis of Intermediate 20

26.2 g of 2-aminophenol (0.24 mol) and 300 ml of methanol were put into a 1-neck round flask, and 44.6 g of 4-bromobenzaldehyde (0.24 mol) was slowly and divisionally added thereto at room temperature. After the reaction for 1 hour, the reaction product was concentrated under reduced pressure to obtain 66.4 g of high-viscosity liquid compound (intermediate 20) (yield: 100%).

2) Synthesis of Intermediate 21

66.4 g of the intermediate 20 (0.24 mol) and 1.19 L of dichloromethane were put into a 1-neck round flask, and 59.6 g of DDQ (0.26 mol) was slowly and divisionally added thereto at room temperature and reacted for 1 hour with stirring. After completion of the reaction, the reaction product was filtered through a silica plug and then, the filtrate was concentrated under reduced pressure. The concentrate was purified with ethyl acetate/methanol solvent to obtain 29.7 g of white solid compound (intermediate 21) (yield: 45.2%).

3) Synthesis of Intermediate 22

20.0 g of the intermediate 21 (72.96 mmol), 20.4 g of bis(pinacolato)diboron (80.26 mmol), 2.98 g of Pd(dppf)Cl$_2$·CH$_2$Cl$_2$ (3.65 mmol), 14.3 g of potassium acetate (145.92 mmol) and 730 ml of dioxane were put into a 1-neck round flask and reacted under reflux at 90° C. for 12 hours. The resultant compound was purified by silica gel column chromatography to obtain 20.5 g of white solid compound (intermediate 22) (yield: 87.6%).

Exemplary Embodiment 1

Synthesis of Organic Compound 1

6.0 g of the intermediate 5 (10.1 mmol), 1.60 g of phenylboronic acid (13.1 mmol), 0.58 g of tetrakis(triphenylphosphine) palladium [Pd(PPh$_3$)$_4$] (0.50 mmol), 3.48 g of potassium carbonate (K$_2$CO$_3$) (25.2 mmol), 100 ml of tetrahydrofuran and 50 ml of water were put into a 1-neck round flask and reacted at 80° C. for 6 hours. After completion of the reaction, the reaction product was cooled to room temperature, water was added thereto and 300 ml of chloroform (CHCl$_3$) was used to work up an organic layer twice. The worked-up organic layer was dried with magnesium sulfate anhydrous (MgSO$_4$). Then, the solvent was removed through filtration and the resultant product was purified by silica gel column chromatography. The purified compound was recrystallized with dichloromethane/hexane to obtain 2.0 g of beige solid compound 1 (yield: 45.2%).

LC-MS/FAB: m/z=589.23 (C$_{41}$H$_{27}$N$_5$=589.69)

Exemplary Embodiment 2

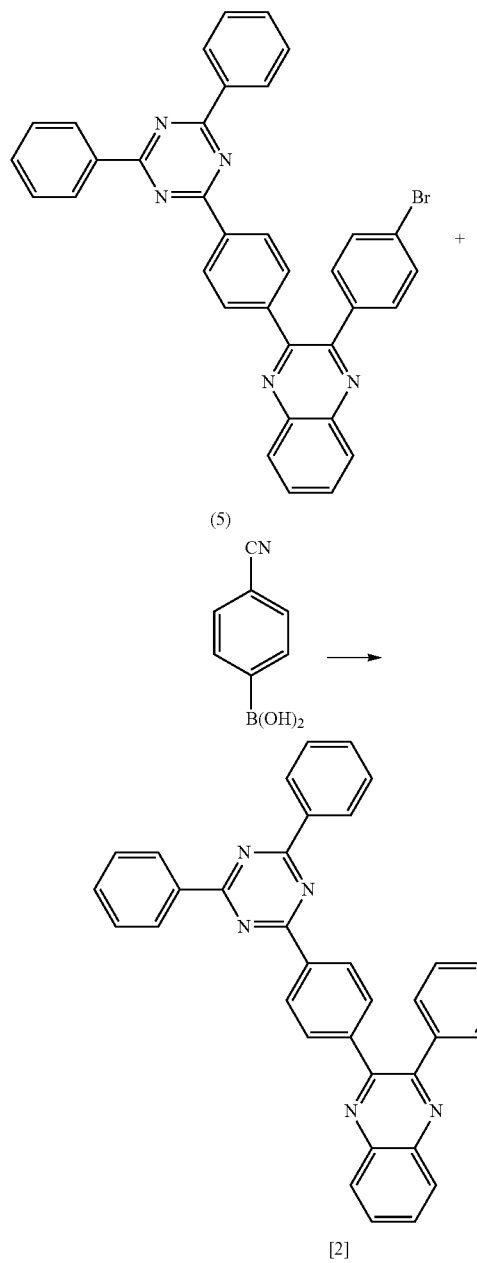

(5)

[2]

Synthesis of Organic Compound 2

The intermediate 5 was obtained by the same method as in Exemplary Embodiment 1. Then, 7 g of the intermediate 5 (11.8 mmol), 2.25 g of (4-cyanophenyl) boronic acid (15.3 mmol), 0.68 g of Pd(PPh$_3$)$_4$ (0.59 mmol), 4.07 g of potassium carbonate (K$_2$CO$_3$) (29.5 mmol), 100 ml of tetrahydrofuran and 50 ml of water were put into a 1-neck round flask and reacted at 80° C. for 6 hours. After completion of the reaction, the reaction product was cooled to room temperature, water was added thereto and 300 ml of chloroform (CHCl$_3$) was used to work up an organic layer twice. The worked-up organic layer was dried with magnesium sulfate anhydrous (MgSO$_4$). Then, a compound obtained by removing the solvent was purified by silica gel column chromatography (hexane:methylene chloride=2:1). The purified compound was recrystallized primarily with dichloromethane/hexane and then recrystallized secondarily with toluene to obtain 2.0 g of beige solid compound 2 (yield: 27.5%).

LC-MS/FAB: m/z=614.22 (C$_{42}$H$_{26}$N$_6$=614.70)

Exemplary Embodiment 3

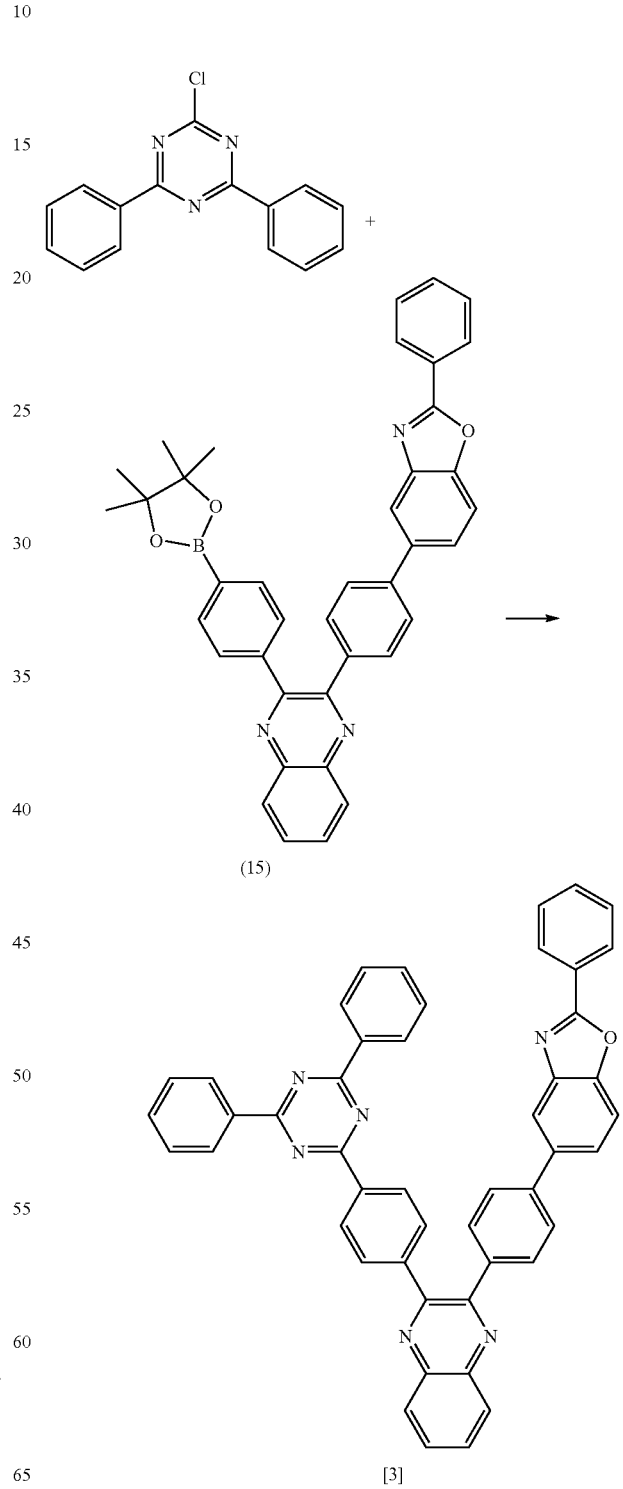

(15)

[3]

Synthesis of Organic Compound 3

2.0 g of the intermediate 15 (3.3 mmol), 1.1 g of 2-chloro-4,6-diphenyl-1,3,5-triazine (4.0 mmol), 0.2 g of Pd(PPh$_3$)$_4$ (0.2 mmol), 1.4 g of potassium carbonate (K$_2$CO$_3$) (9.9 mmol), 40 ml of toluene, 10 ml of ethanol and 10 ml of water were put into a 1-neck round flask and then reacted under reflux for 12 hours. After completion of the reaction, the reaction product was cooled to room temperature and filtered. The filtered solid was heated and dissolved in 50 ml of chlorobenzene and filtered through a silica pad. The filtrate was stirred and the produced solid was filtered to obtain 1.0 g of solid compound 3 (yield: 43.3%).

LC-MS/FAB: m/z=706.25 (C$_{48}$H$_{30}$N$_6$O=706.79)

Exemplary Embodiment 4

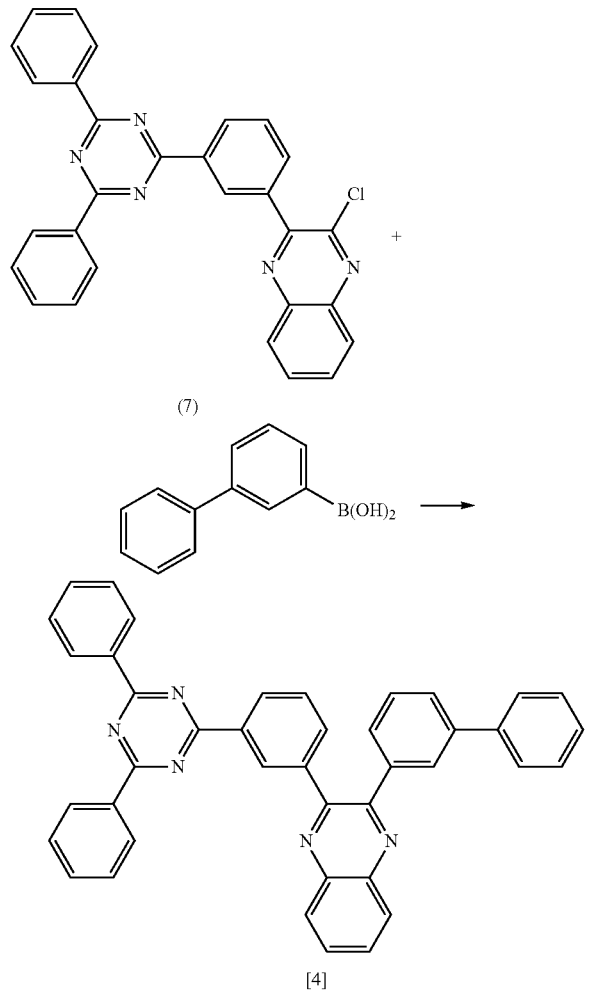

Synthesis of Organic Compound 4

5.0 g of the intermediate 7 (10.6 mmol), 4.2 g of (1,1'-biphenyl)-3-ylboronic acid (21.2 mmol), 0.6 g of Pd(PPh$_3$)$_4$ (0.5 mmol), 71 ml of toluene/ethanol (volume ratio of 2:1) and 11 ml of 2 M potassium carbonate (K$_2$CO$_3$) were put into a 1-neck round flask and reacted under reflux for 3 hours. After completion of the reaction, distilled water was added thereto at room temperature. Then, an organic layer was worked up with dichloromethane, and the worked-up organic layer was dried with sodium sulfate anhydrous (Na$_2$SO$_4$). Then, the solvent was removed through filtration under reduced pressure. The obtained solid was dissolved in chloroform and purified by silica gel column chromatography. 300 ml of methanol was added to the purified product and solidified for 12 hours with stirring to obtain 4.5 g of solid compound 4 (yield: 72.0%).

LC-MS/FAB: m/z=589.23 (C$_{41}$H$_{27}$N$_5$=589.69)

Exemplary Embodiment 5

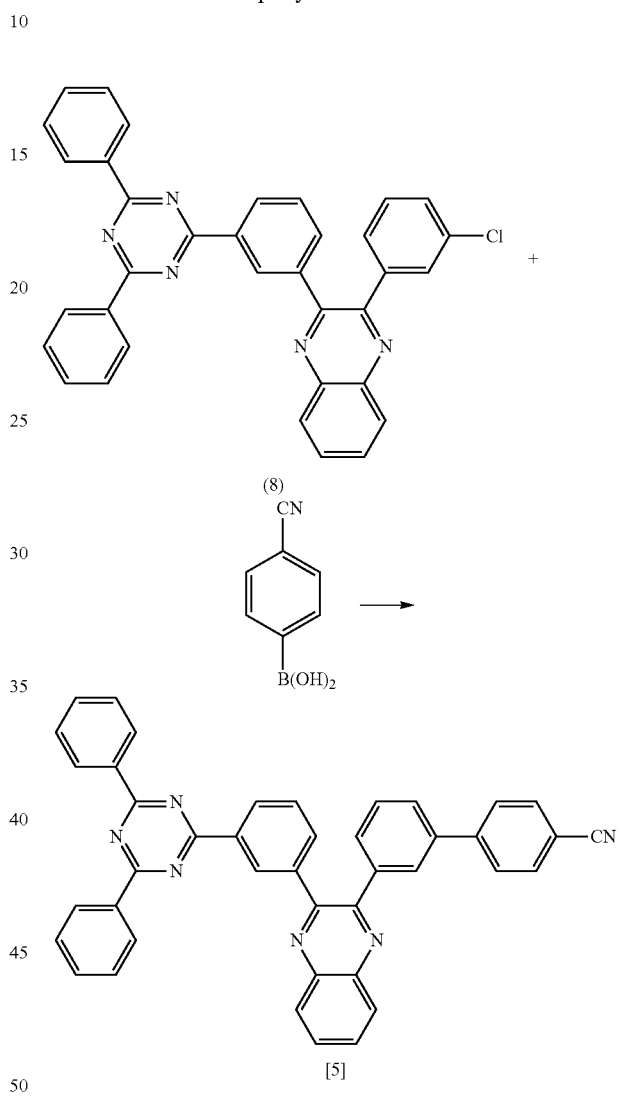

Synthesis of Organic Compound 5

5.5 g of the intermediate 8 (10.0 mmol), 1.6 g of (4-cyanophenyl)boronic acid (20.0 mmol), 0.3 g of bis(dibenzylideneacetone) palladium (Pd(dba)$_2$) (0.5 mmol), 0.4 g of 2-dicyclohexylphosphino-2',6'-dimethoxybiphenyl (S-Phos) (1.0 mmol), 6.3 g of potassium phosphate (K$_3$PO$_4$) (3.0 mmol) and 50 ml of toluene/distilled water (volume ratio of 1:1) were put into a 1-neck round flask and reacted under reflux for 7 hours. After completion of the reaction, the reaction product was cooled to room temperature and stirred for 12 hours. The produced solid was filtered and sequentially washed with toluene, distilled water and acetone and then dried. The dried solid was dissolved in 200 ml of chlorobenzene under reflux and then filtered through a Celite filter and washed with heated chlorobenzene. The filtrate was cooled to room temperature and then stirred for 12 hours. The produced solid was filtered and sequentially washed with acetone and methanol to obtain 2.0 g of white solid compound 5 (yield: 32.5%).

LC-MS/FAB: m/z=614.22 ($C_{42}H_{26}N_6$=614.70)

Exemplary Embodiment 6

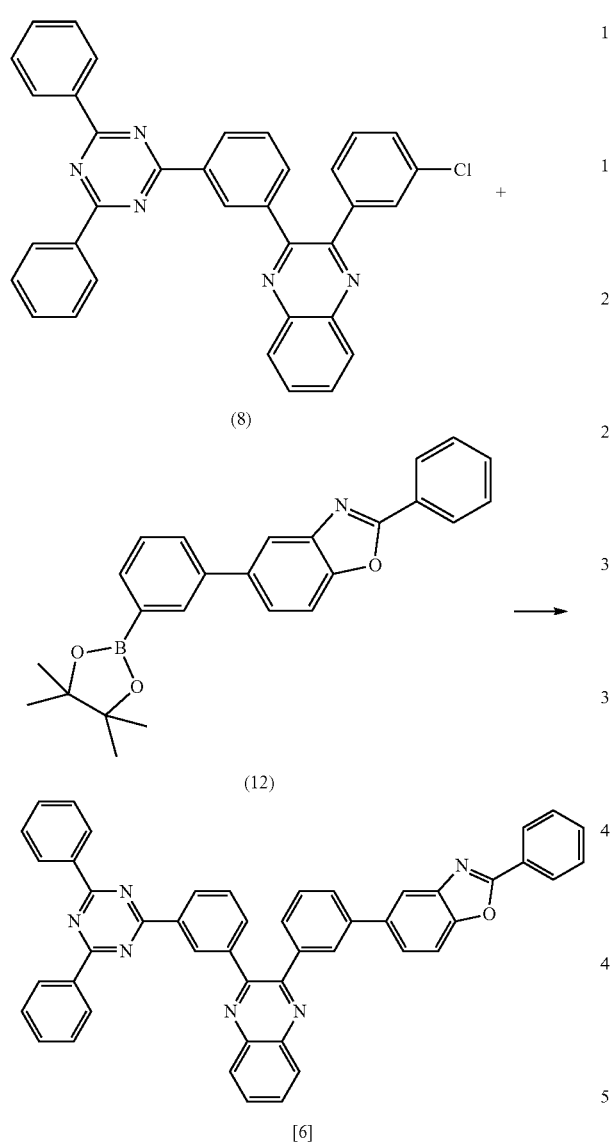

Synthesis of Organic Compound 6

10.1 g of the intermediate 8 (21.4 mmol), 11.9 g of the intermediate 12 (30.0 mmol), 0.61 g of Pd(dba)$_2$ (1.0 mmol), 0.51 g of S-Phos (2.1 mmol), 13.7 g of potassium phosphate ($K_3PO_4$) (64.2 mmol) and 107 ml of toluene/distilled water (volume ratio of 1:1) were put into a 1-neck round flask and reacted under reflux. After completion of the reaction, an organic layer was worked up with distilled water and dichloromethane at room temperature. The worked-up organic layer was dried with sodium sulfate anhydrous ($Na_2SO_4$) and then, the solvent was removed under reduced pressure. Then, a compound obtained through purification by silica gel column chromatography was dissolved with toluene under reflux and slowly cooled to room temperature. The produced solid was filtered and dried to obtain 2.56 g of white solid compound 6 (yield: 17.1%).

LC-MS/FAB: m/z=706.25 ($C_{48}H_{30}N_6O$=706.79)

Exemplary Embodiment 7

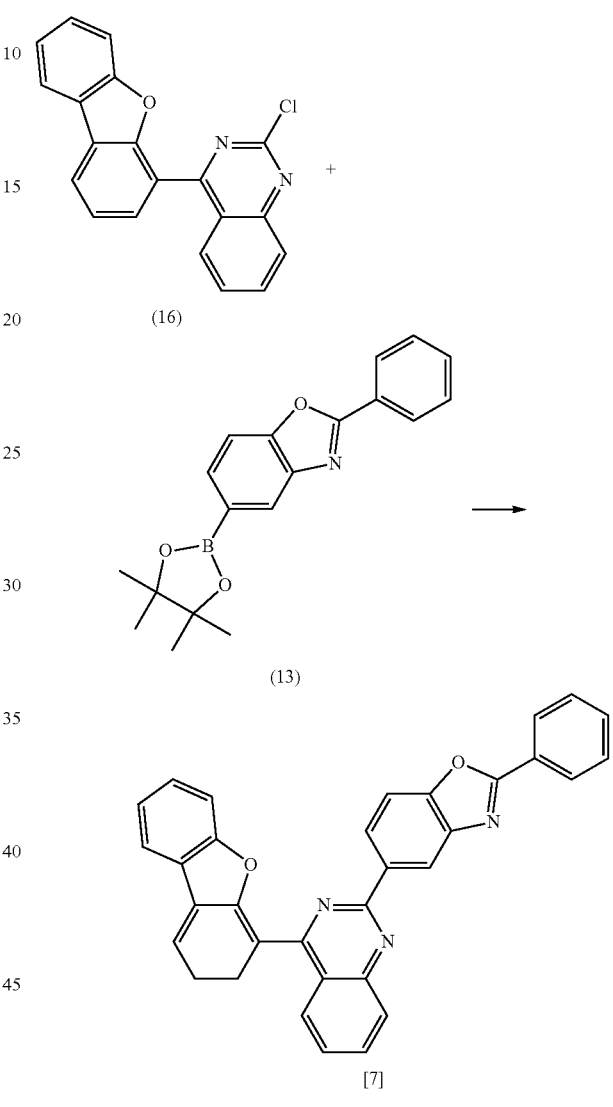

Synthesis of Organic Compound 7

7.0 g of the intermediate 16 (21.2 mmol), 10.2 g of the intermediate 13 (31.8 mmol), 1.2 g of Pd(PPh$_3$)$_4$ (1.1 mmol), 106 ml of toluene/ethanol (volume ratio of 2:1) and 32 ml of 2 M potassium carbonate ($K_2CO_3$) were put into a 1-neck round flask and reacted under reflux. After completion of the reaction, the reaction product was cooled to room temperature and stirred for 1 hour. The produced solid was filtered and sequentially washed with toluene, distilled water and acetone and then dried. The dried solid was dissolved in chlorobenzene under reflux and then filtered through a Celite filter and washed with chlorobenzene and stirred at room temperature. The produced solid was filtered and washed with acetone to obtain 4.2 g of white solid compound 7 (yield: 41.4%).

LC-MS/FAB: m/z=489.15 ($C_{33}H_{19}N_3O_2$=489.52)

Exemplary Embodiment 8

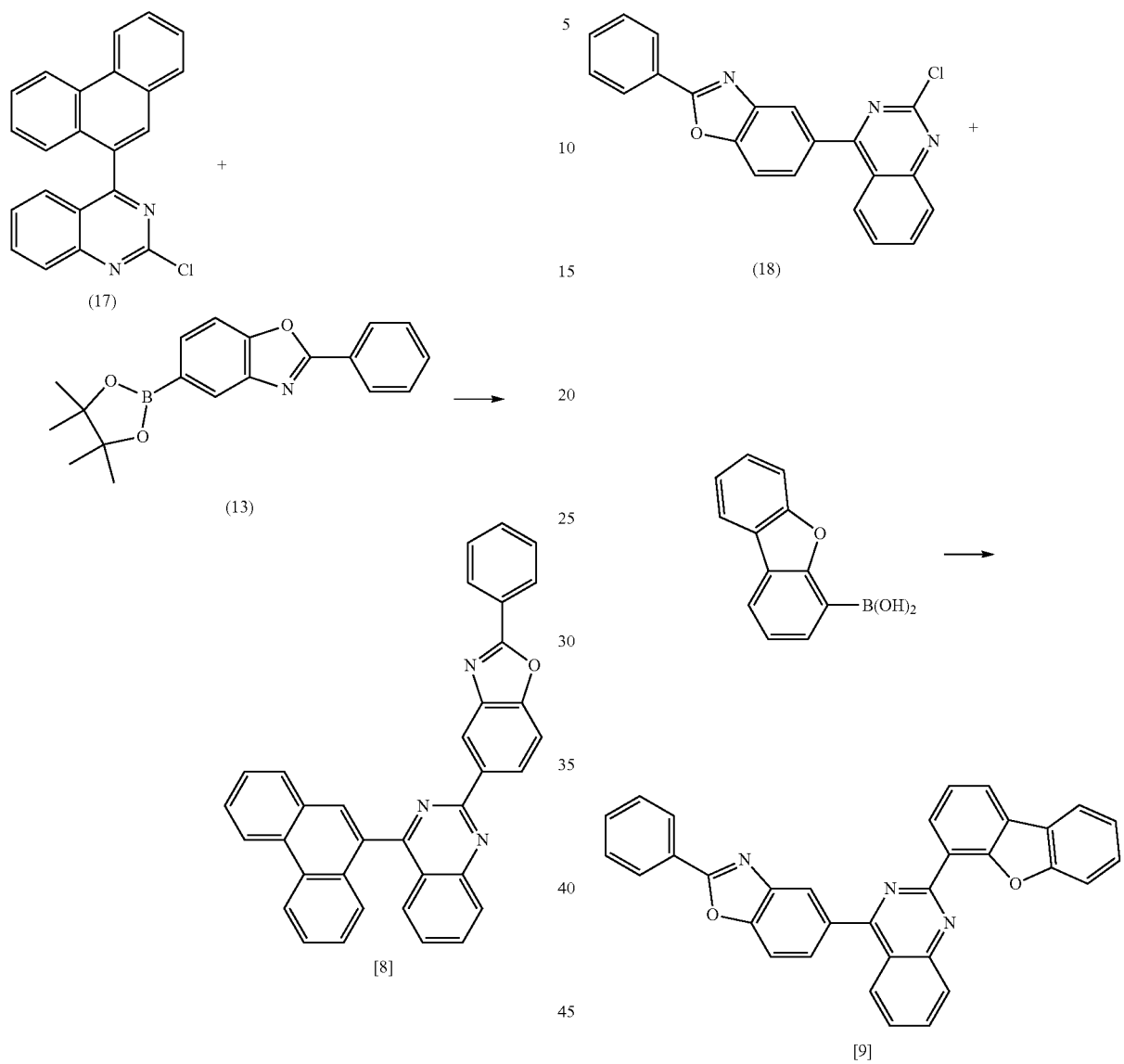

Exemplary Embodiment 9

Synthesis of Organic Compound 8

4.4 g of the intermediate 17 (12.7 mmol), 6.1 g of the intermediate 13 (19.1 mmol), 0.7 g of Pd(PPh$_3$)$_4$ (0.6 mmol), 64 ml of toluene/ethanol (volume ratio of 2:1) and 13 ml of 2 M potassium carbonate (K$_2$CO$_3$) were mixed in a 1-neck round flask and reacted under reflux for 1 hour. After completion of the reaction, the reaction product was cooled to room temperature and stirred for 1 hour. The produced solid was filtered and sequentially washed with toluene, distilled water and acetone and then dried. The dried solid was dissolved in 300 ml of chlorobenzene under reflux and then filtered through a Celite filter and washed with heated chlorobenzene. Then, the solvent was removed under reduced pressure. The produced solid was solidified with methanol/ethyl acetate and filtered and washed with methanol to obtain 3.6 g of white solid compound 8 (yield: 56.7%).

LC-MS/FAB: m/z=499.17 (C$_{35}$H$_{21}$N$_3$O=499.56)

Synthesis of Organic Compound 9

3.5 g of the intermediate 18 (9.8 mmol), 3.1 g of dibenzo[b,d]furan-4-ylboronic acid (14.7 mmol), 0.57 g of Pd(PPh$_3$)$_4$ (0.49 mmol), 49 ml of toluene/ethanol (volume ratio of 2:1) and 15 ml of 2 M potassium carbonate (K$_2$CO$_3$) (29.3 mmol) were put into a 1-neck round flask and reacted under reflux. After completion of the reaction, the reaction product was cooled to room temperature and stirred for 1 hour. The produced solid was filtered and sequentially washed with toluene, distilled water and methanol and then dried. The dried solid was dissolved in chlorobenzene under reflux and then filtered through a Celite filter and washed with chlorobenzene and then stirred again at room temperature. The produced solid was filtered and washed with acetone to obtain 2.5 g of white solid compound 9 (yield: 52.7%).

LC-MS/FAB: m/z=489.15 (C$_{33}$H$_{19}$N$_3$O$_2$=489.52)

Exemplary Embodiment 10

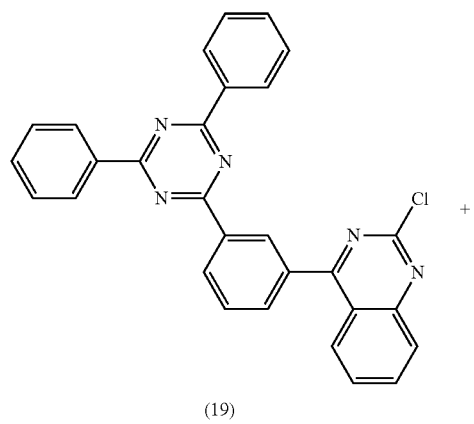

(19)

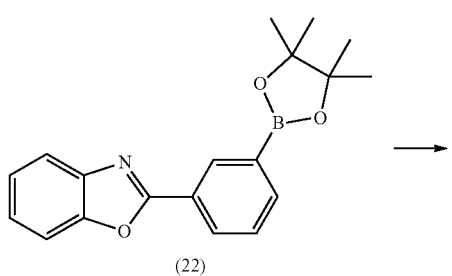

(22)

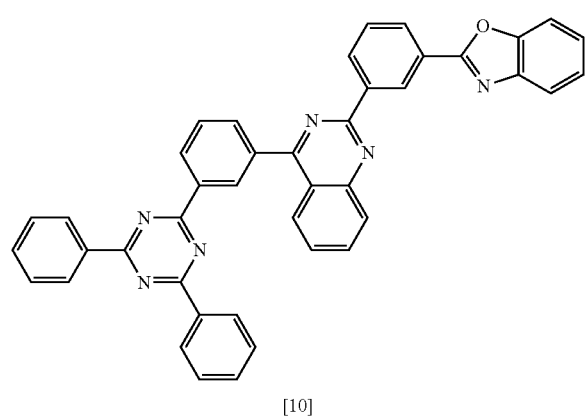

[10]

Synthesis of Organic Compound 10

5.0 g of the intermediate 19 (10.6 mmol), 5.1 g of the intermediate 22 (15.9 mmol), 0.6 g of Pd(PPh$_3$)$_4$ (0.5 mmol), 53 ml of toluene/ethanol (volume ratio of 2:1) and 11 ml of 2 M potassium carbonate (K$_2$CO$_3$) were put into a 1-neck round flask and reacted under reflux for 1 hour. After completion of the reaction, the reaction product was cooled to room temperature and stirred for 1 hour. The produced solid was filtered and sequentially washed with toluene, distilled water and acetone/dichloromethane (volume ratio of 9:1) and then dried. The dried solid was dissolved in 1000 ml of chlorobenzene under reflux and then filtered through a Celite filter and washed with heated chlorobenzene. The filtrate was cooled to room temperature and stirred for 1 hour. The produced solid was filtered and washed with 100 ml of methanol to obtain 3.8 g of white solid compound 10 (yield: 56.8%).

LC-MS/FAB: m/z=630.22 (C$_{42}$H$_{26}$N$_6$O=630.70)

[Fabrication of Organic Light Emitting Element]

An organic light emitting element was fabricated using the organic compounds 1 to 10 prepared according to Exemplary Embodiments 1 to 10. Specifically, an ITO substrate including a reflective layer on its lower part was prepared and then cleaned with UV/O$_3$. The washed substrate was installed in a vacuum deposition chamber. Then, a hole injection layer (100 Å), a hole transport layer (1200 Å), an organic light emitting layer (400 Å), an electron transport layer (300 Å), an electron injection layer (10 Å) and a cathode (500 Å) were sequentially deposited under a vacuum of about 10$^{-7}$ torr by evaporation from a heating boat.

As the hole injection layer, 97 wt % of a compound represented by the following Chemical Formula I and 3 wt % of a compound represented by the following Chemical Formula II were used. As the hole transport layer, the compound represented by the following Chemical Formula II was used. Also, compounds represented by the following Chemical Formulas III and IV were mixed at a ratio of 2:1 and used as a host material. Further, a compound represented by the following Chemical Formula V was used as a dopant to deposit the organic light emitting layer. (weight ratio of host:dopant=85:15) As the electron transport layer, the organic compounds 1 to 10 prepared according to Exemplary Embodiments 1 to 10 were used. As the electron injection layer, LiF was used and as the cathode, Al was used.

After completion of the deposition of the above-described materials, the substrate was moved from the deposition chamber to a drying box in order to form a film. Then, an encapsulation layer was formed using UV curable epoxy and a moisture getter.

[Chemical Formula I]

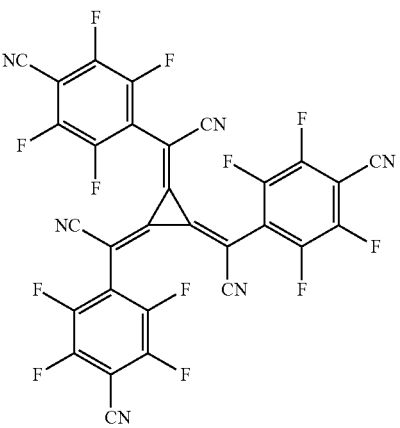

-continued

[Chemical Formula II]

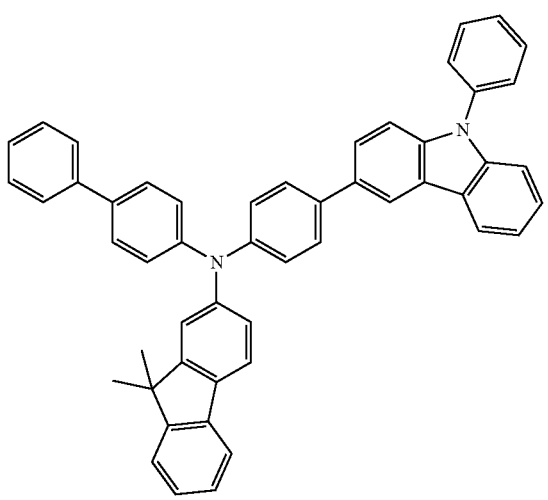

[Chemical Formula III]

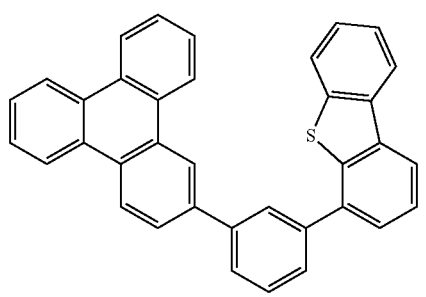

[Chemical Formula IV]

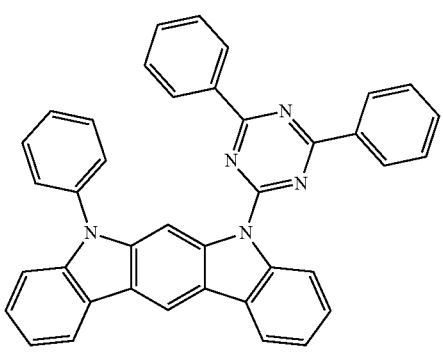

[Chemical Formula V]

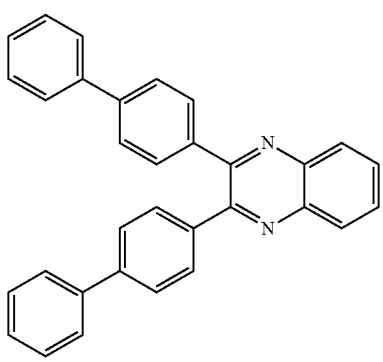

Comparative Embodiment 1

An organic light emitting element was fabricated by the same method as in the above-described Fabrication Embodiment except that an organic compound represented by the following Chemical Formula VI was used as an electron transport layer.

[Chemical Formula VI]

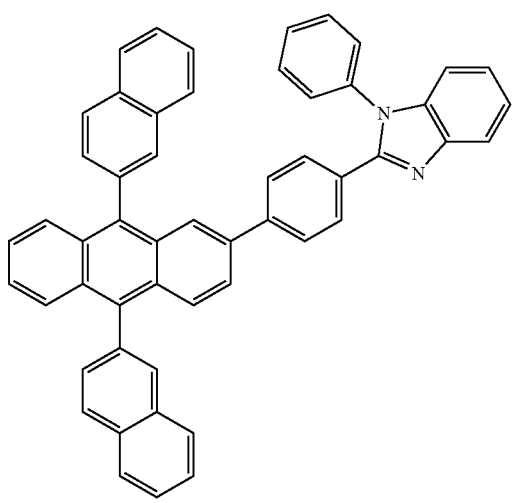

Comparative Embodiment 2

An organic light emitting element was fabricated by the same method as in the above-described Fabrication Embodiment except that an organic compound represented by the following Chemical Formula VII was used as an electron transport layer.

[Chemical Formula VII]

Comparative Embodiment 3

An organic light emitting element was fabricated by the same method as in the above-described Fabrication Embodiment except that an organic compound represented by the following Chemical Formula VIII was used as an electron transport layer.

[Chemical Formula VIII]

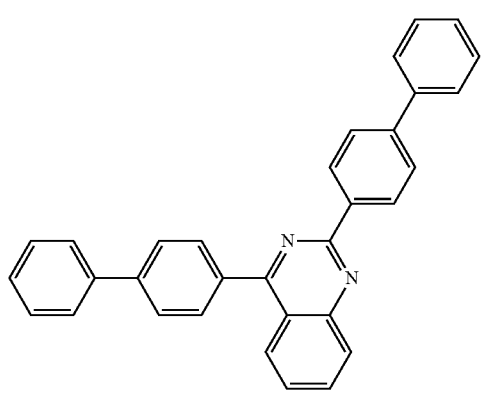

Experimental Embodiment

The organic light emitting elements fabricated based on the compounds according to Exemplary Embodiments 1 to 10 and Comparative Embodiments 1 to 3 were evaluated in terms of driving voltage, luminous efficiency and lifetime. The driving voltage and efficiency were measured using a current source (KEITHLEY) and a photometer (PR 650) at a current density of 10 mA/cm². The lifetime (T95) was evaluated by measuring time taken until the luminance of an organic light emitting element drops by 5% of the initial luminance when the organic light emitting element is driven at a current density of 10 mA/cm². The measurement results of the driving voltage, efficiency and lifetime are shown in the following Table 1.

TABLE 1

| Classification | ETL compound | Driving voltage (V) | Efficiency (cd/A) | Lifetime (hr) |
| --- | --- | --- | --- | --- |
| Exemplary Embodiment 1 | | 3.47 | 60.22 | 482 |
| Exemplary Embodiment 2 | | 3.52 | 61.14 | 498 |

TABLE 1-continued

| Classification | ETL compound | Driving voltage (V) | Efficiency (cd/A) | Lifetime (hr) |
|---|---|---|---|---|
| Exemplary Embodiment 3 | | 3.46 | 60.52 | 416 |
| Exemplary Embodiment 4 | | 3.61 | 62.71 | 426 |
| Exemplary Embodiment 5 | | 3.64 | 63.18 | 417 |

TABLE 1-continued
| Classification | ETL compound | Driving voltage (V) | Efficiency (cd/A) | Lifetime (hr) |
|---|---|---|---|---|
| Exemplary Embodiment 6 | 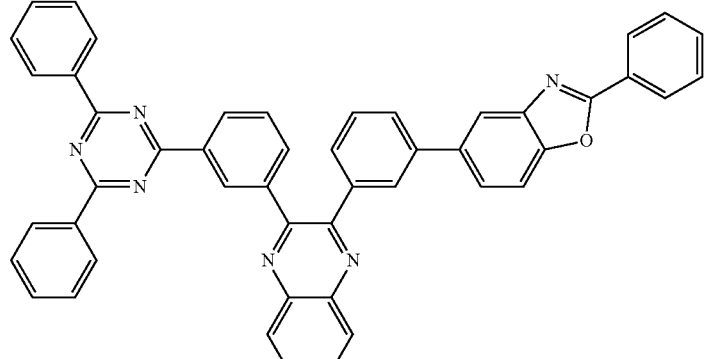 | 3.71 | 63.55 | 445 |
| Exemplary Embodiment 7 | 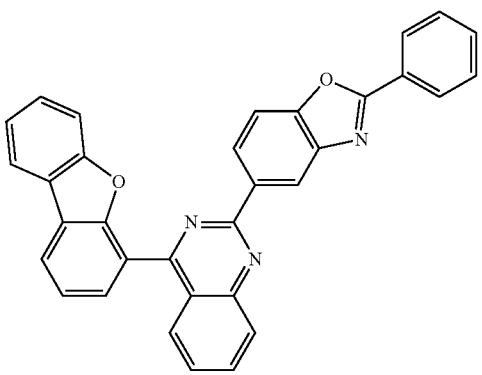 [SMILES: c1ccc(-c2nc3cc(-c4nc(-c5cccc6c5oc5ccccc56)c5ccccc5n4)ccc3o2)cc1] | 3.55 | 61.46 | 426 |
| Exemplary Embodiment 8 | 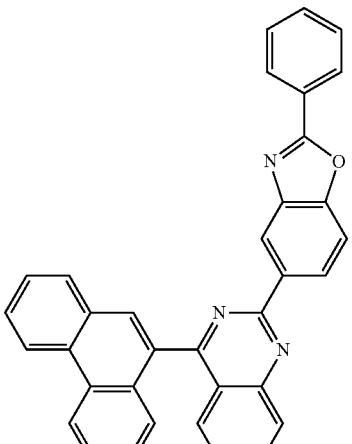 | 3.53 | 60.98 | 473 |
| Exemplary Embodiment 9 | 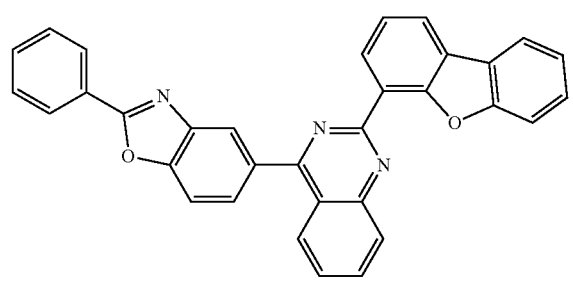 [SMILES: c1ccc(-c2nc3cc(-c4nc(-c5cccc6c5oc5ccccc56)nc5ccccc45)ccc3o2)cc1] | 3.60 | 62.54 | 430 |

TABLE 1-continued
| Classification | ETL compound | Driving voltage (V) | Efficiency (cd/A) | Lifetime (hr) |
|---|---|---|---|---|
| Exemplary Embodiment 10 | 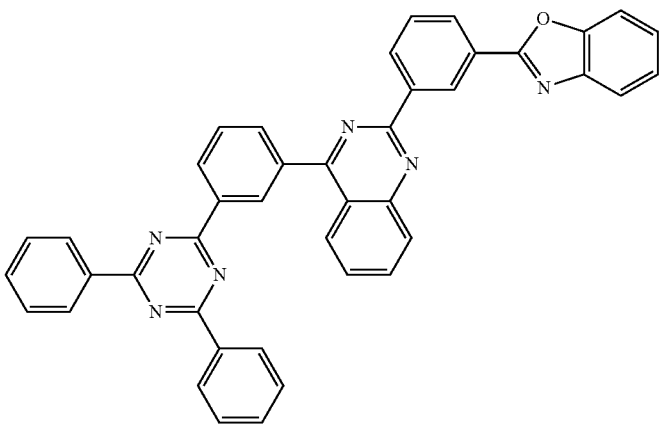 [SMILES: c1ccc(-c2nc(-c3ccccc3)nc(-c3cccc(-c4nc(-c5cccc(-c6nc7ccccc7o6)c5)nc5ccccc45)c3)n2)cc1] | 3.58 | 62.07 | 454 |
| Comparative Embodiment 1 | 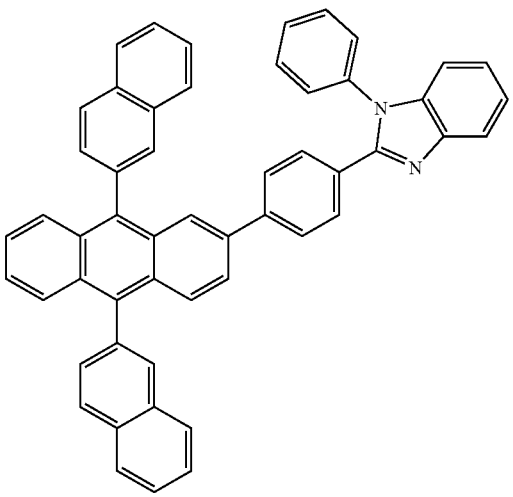 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] | 3.74 | 55.46 | 272 |
| Comparative Embodiment 2 | 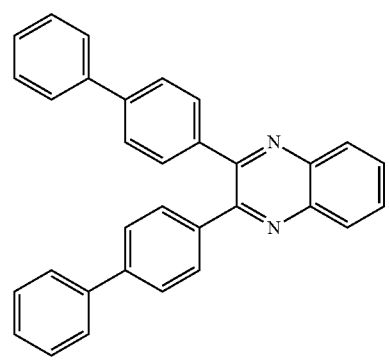 [SMILES: c1ccc(-c2ccc(-c3nc4ccccc4nc3-c3ccc(-c4ccccc4)cc3)cc2)cc1] | 3.65 | 58.27 | 357 |

TABLE 1-continued

| Classification | ETL compound | Driving voltage (V) | Efficiency (cd/A) | Lifetime (hr) |
|---|---|---|---|---|
| Comparative Embodiment 3 | 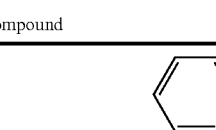 | 3.64 | 58.03 | 363 |

Referring to Table 1, it can be seen that the organic light emitting elements according to Exemplary Embodiments 1 to 10 are greatly improved in efficiency and lifetime compared with the organic light emitting elements according to Comparative Embodiments 1 to 3. Also, it can be seen that the driving voltages of the organic light emitting elements according to Exemplary Embodiments 1 to 10 are equal to or lower than those of the organic light emitting elements according to Comparative Embodiments 1 to 3. Thus, it can be seen that the organic light emitting elements according to Exemplary Embodiments 1 to 10 may be driven at a low voltage.

According to the above experimental results, the organic compound represented by Chemical Formula 1 according to an exemplary embodiment of the present disclosure has excellent electron transport properties and heat resistance. Also, it may be applied to an electron transport layer of an organic light emitting element, thereby contributing to improvement in luminous efficiency and lifetime of an organic light emitting display device. Further, it may lower a driving voltage and thus enables low-power driving.

The exemplary embodiments of the present disclosure can also be described as follows:

According to an aspect of the present disclosure, an organic compound is represented by the following Chemical Formula 1:

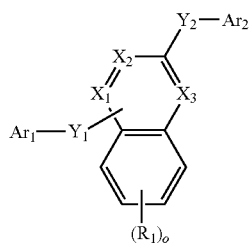

[Chemical Formula 1]

wherein in the above Chemical Formula 1, $R_1$ is selected from hydrogen, deuterium, substituted or unsubstituted $C_1$-$C_{10}$ alkyl groups, substituted or unsubstituted $C_6$-$C_{30}$ aryl groups and substituted or unsubstituted $C_3$-$C_{30}$ heteroaryl groups, o is an integer of 0 to 4, $X_1$, $X_2$ and $X_3$ are each independently N or C, and at least two of $X_1$, $X_2$ and $X_3$ are N, $Y_1$ and $Y_2$ are each independently a substituted or unsubstituted phenylene group or a single bond, $Ar_1$ and $Ar_2$ are each independently selected from substituted or unsubstituted $C_6$-$C_{30}$ aryl groups and substituted or unsubstituted $C_3$-$C_{30}$ heteroaryl groups, at least one of $Ar_1$ and $Ar_2$ is selected from a substituted or unsubstituted triazine group, a functional group represented by the following Chemical Formula 2 and a functional group represented by the following Chemical Formula 3,

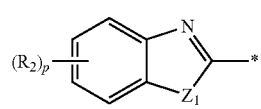

[Chemical Formula 2]

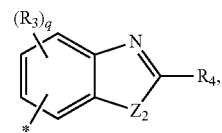

[Chemical Formula 3]

and in the above Chemical Formulas 2 and 3, $Z_1$ and $Z_2$ are each independently O or S, $R_2$, $R_3$ and $R_4$ are each independently selected from hydrogen, deuterium, substituted or unsubstituted $C_1$-$C_{10}$ alkyl groups, substituted or unsubstituted $C_6$-$C_{30}$ aryl groups and substituted or unsubstituted $C_3$-$C_{30}$ heteroaryl groups, p is an integer of 0 to 4, and q is an integer of 0 to 3.

In the above Chemical Formula 1, $Ar_1$ and $Ar_2$ may be each independently selected from a functional group represented by the following Chemical Formula A:

[Chemical Formula A]

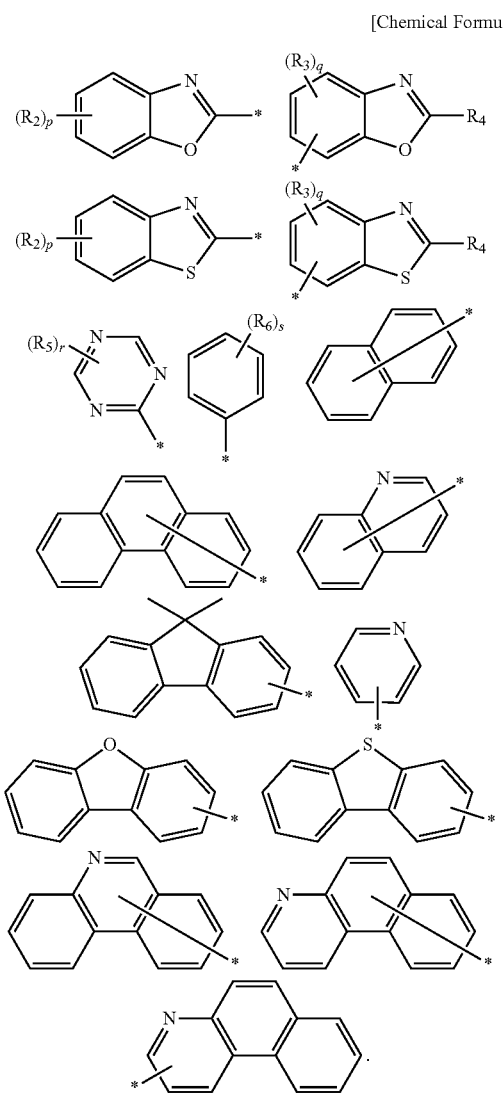

[Chemical Formula B]

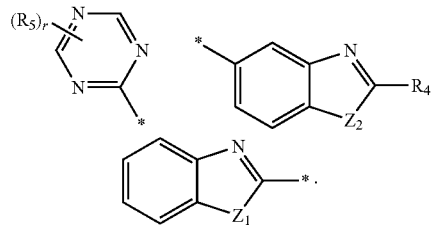

In the above Chemical Formula B, $R_5$ and r may be identical to those defined in the above Chemical Formula A, and $Z_1$, $Z_2$ and $R_4$ may be identical to those defined in the above Chemical Formulas 2 and 3.

In the above Chemical Formula 1, $Ar_1$ and $Ar_2$ may be different from each other.

The organic compound represented by the above Chemical Formula 1 may be selected from organic compounds represented by the following Chemical Formula 1-1 or 1-2:

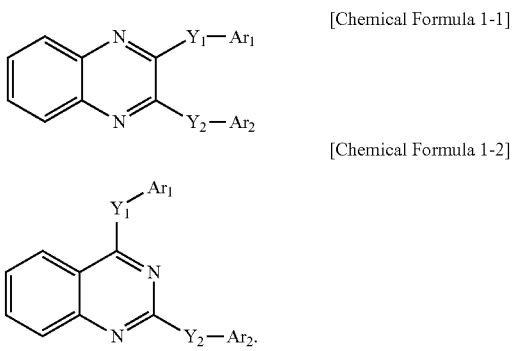

In the above Chemical Formulas 1-1 and 1-2, $Y_1$, $Y_2$, $Ar_1$ and $Ar_2$ may be identical to those defined in the above Chemical Formula 1, respectively.

In the above Chemical Formula 1-1, $Y_1$ and $Y_2$ may be phenylene groups, and at least one of $Ar_1$ and $Ar_2$ may be selected from a functional group represented by the following Chemical Formula:

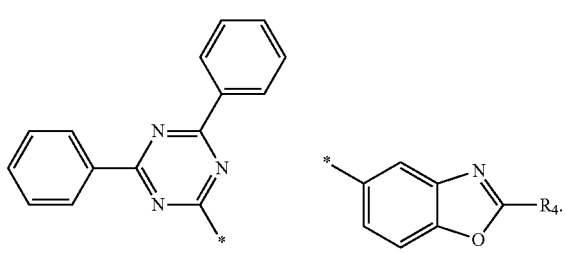

In the above Chemical Formula, $R_4$ may be identical to that defined in the above Chemical Formula 3.

In the above Chemical Formula 1-2, $Y_1$ and $Y_2$ may be phenylene groups, and at least one of $Ar_1$ and $Ar_2$ may be selected from a functional group represented by the following Chemical Formula:

In the above Chemical Formula A, $R_5$ may be selected from hydrogen, deuterium, substituted or unsubstituted $C_1$-$C_{10}$ alkyl groups, substituted or unsubstituted $C_6$-$C_{30}$ aryl groups and substituted or unsubstituted $C_3$-$C_{30}$ heteroaryl groups, r may be an integer of 0 to 2, $R_6$ may be selected from hydrogen, deuterium, substituted or unsubstituted $C_1$-$C_{10}$ alkyl groups, substituted or unsubstituted $C_6$-$C_{30}$ aryl groups and substituted or unsubstituted $C_3$-$C_{30}$ heteroaryl groups, s may be an integer of 0 to 5, and $R_2$, $R_3$, $R_4$, p and q may be identical to those defined in the above Chemical Formulas 2 and 3.

At least one of $Ar_1$ and $Ar_2$ may be selected from a functional group represented by the following Chemical Formula B:

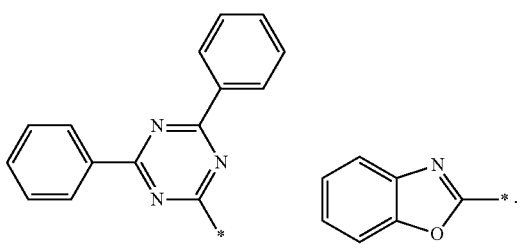 [SMILES: *c1nc(-c2ccccc2)nc(-c2ccccc2)n1 ; *c1nc2ccccc2o1]

In the above Chemical Formula 1-2, $Y_1$ and $Y_2$ may be single bonds, and at least one of $Ar_1$ and $Ar_2$ may be a functional group represented by the following Chemical Formula:

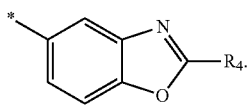

In the above Chemical Formula, $R_4$ may be identical to that defined in the above Chemical Formula 3.

The organic compound may have a band gap of 3.6 eV to 4.1 eV.

The organic compound may have an HOMO level of −6.4 eV to −5.7 eV and an LUMO level of −2.4 eV to −1.8 eV.

According to another aspect of the present disclosure, an organic light emitting display device includes a plurality of sub-pixels. At least one of the plurality of sub-pixels includes an organic light emitting element. The organic light emitting element includes an anode, an organic layer disposed on the anode and containing an organic compound represented by Chemical Formula 1, and a cathode disposed on the organic layer.

[Chemical Formula 1]

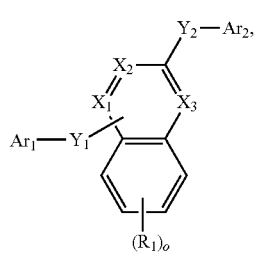

and
in the above Chemical Formula 1, $R_1$ is selected from hydrogen, deuterium, substituted or unsubstituted $C_1$-$C_{10}$ alkyl groups, substituted or unsubstituted $C_6$-$C_{30}$ aryl groups and substituted or unsubstituted $C_3$-$C_{30}$ heteroaryl groups,
o is an integer of 0 to 4,
$X_1$, $X_2$ and $X_3$ are each independently N or C, and at least two of $X_1$, $X_2$ and $X_3$ are N,
$Y_1$ and $Y_2$ are each independently a substituted or unsubstituted phenylene group or a single bond,
$Ar_1$ and $Ar_2$ are each independently selected from substituted or unsubstituted $C_6$-$C_{30}$ aryl groups and substituted or unsubstituted $C_3$-$C_{30}$ heteroaryl groups,
at least one of $Ar_1$ and $Ar_2$ is selected from a substituted or unsubstituted triazine group, a functional group represented by the following Chemical Formula 2 and a functional group represented by the following Chemical Formula 3,

[Chemical Formula 2]

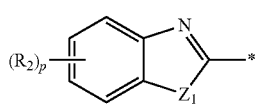

[Chemical Formula 3]

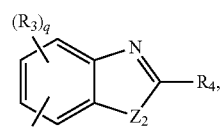

and
in the above Chemical Formulas 2 and 3,
$Z_1$ and $Z_2$ are each independently O or S,
$R_2$, $R_3$ and $R_4$ are each independently selected from hydrogen, deuterium, substituted or unsubstituted $C_1$-$C_{10}$ alkyl groups, substituted or unsubstituted $C_6$-$C_{30}$ aryl groups and substituted or unsubstituted $C_3$-$C_{30}$ heteroaryl groups,
p is an integer of 0 to 4, and q is an integer of 0 to 3.

The organic layer may include an organic light emitting layer disposed on the anode and an electron transport layer disposed on the organic light emitting layer and containing the organic compound represented by Chemical Formula 1.

It will be apparent to those skilled in the art that various modifications and variations can be made in the present disclosure without departing from the technical idea or scope of the disclosure. Thus, it is intended that the present disclosure cover the modifications and variations of this disclosure provided they come within the scope of the appended claims and their equivalents.

What is claimed is:
1. An organic compound represented by the following Chemical Formula 1-1 or 1-2:

[Chemical Formula 1-1]

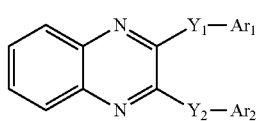

[Chemical Formula 1-2]

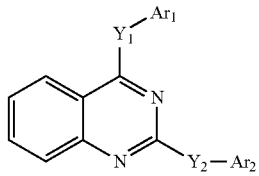

wherein in the above Chemical Formulae 1-1 and 1-2,
$Y_1$ and $Y_2$ are each independently a phenylene group or a single bond, and
$Ar_1$ and $Ar_2$ are different from each other and are each selected from a functional group represented in the following Chemical Formula:

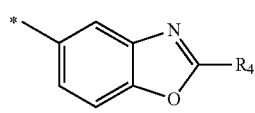 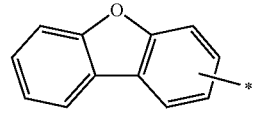

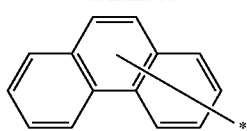

one of the Ar$_1$ and Ar$_2$ is the functional group represented by the following Chemical Formula:

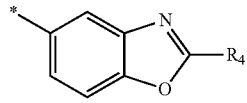

R$_4$ is a phenyl group, and
the asterisk represents a bonding site.

2. The organic compound according to claim 1, wherein the organic compound has a band gap of 3.6 eV to 4.1 eV.

3. The organic compound according to claim 1, wherein the organic compound has a HOMO level of −6.4 eV to −5.7 eV and a LUMO level of −2.4 eV to −1.8 eV.

4. The organic compound according to claim 1, wherein the organic compound is one of the following compounds:

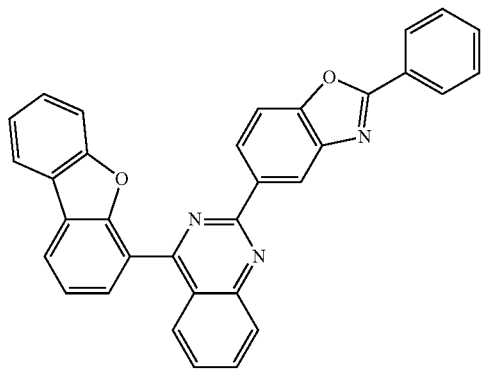

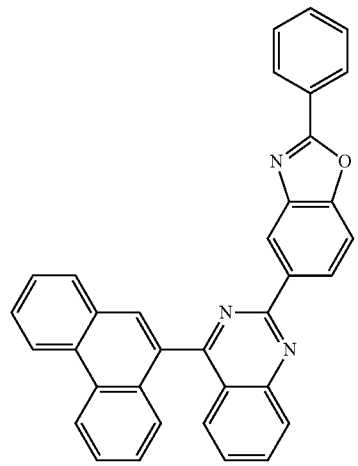

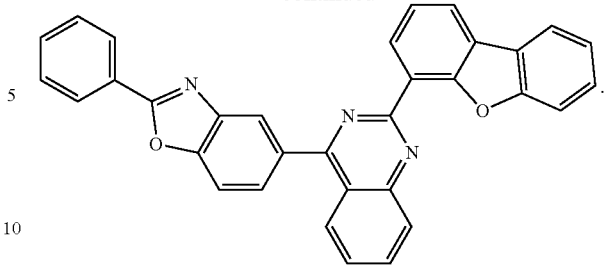

5. An organic light emitting display device, comprising:
a plurality of sub-pixels,
wherein at least one of the plurality of sub-pixels includes an organic light emitting element including:
an anode;
an organic layer disposed on the anode and containing an organic compound represented by Chemical Formula 1-1 or 1-2; and
a cathode disposed on the organic layer, and

[Chemical Formula 1-1]

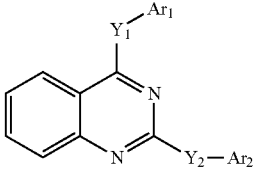

[Chemical Formula 1-2]

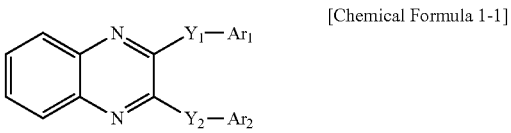

in the above Chemical Formulae 1-1 and 1-2,
Y$_1$ and Y$_2$ are each independently a phenylene group or a single bond,
Ar$_1$ and Ar$_2$ are different from each other and are each selected from a functional group represented in the following Chemical Formula:

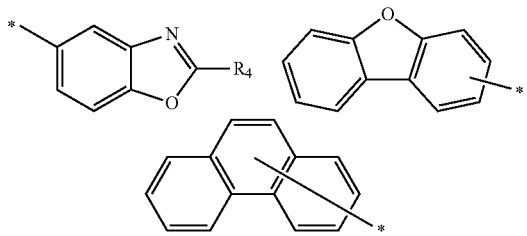

one of the Ar$_1$ and Ar$_2$ is the functional group represented by the following Chemical Formula:

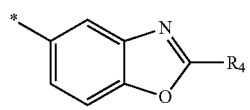

R$_4$ is a phenyl group, and
the asterisk represents a bonding site.

6. The organic light emitting display device according to claim 5, wherein the organic layer includes an organic light emitting layer disposed on the anode and an electron transport layer disposed on the organic light emitting layer and containing the organic compound represented by Chemical Formula 1-1 or 1-2.

* * * * *